United States Patent
Yagi et al.

(10) Patent No.: US 12,001,140 B2
(45) Date of Patent: Jun. 4, 2024

(54) ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

(71) Applicant: FUJIFILM Corporation, Tokyo (JP)

(72) Inventors: Kazunari Yagi, Haibara-gun (JP);
Akihiro Kaneko, Haibara-gun (JP);
Takashi Kawashima, Haibara-gun (JP);
Akiyoshi Goto, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 705 days.

(21) Appl. No.: 17/169,757

(22) Filed: Feb. 8, 2021

(65) Prior Publication Data
US 2021/0165323 A1    Jun. 3, 2021

Related U.S. Application Data

(63) Continuation of application No. PCT/JP2019/031790, filed on Aug. 13, 2019.

(30) Foreign Application Priority Data

Sep. 7, 2018 (JP) .................. 2018-168170
Feb. 22, 2019 (JP) .................. 2019-030587

(51) Int. Cl.
| G03F 7/039 | (2006.01) |
| C08F 212/14 | (2006.01) |
| C08F 220/18 | (2006.01) |
| C08F 220/58 | (2006.01) |
| G03F 7/038 | (2006.01) |

(52) U.S. Cl.
CPC ............ *G03F 7/039* (2013.01); *C08F 212/24* (2020.02); *C08F 220/1806* (2020.02); *C08F 220/585* (2020.02); *G03F 7/038* (2013.01)

(58) Field of Classification Search
CPC ........ G03F 7/039; G03F 7/038; G03F 7/0392; G03F 7/0397; C08F 220/585
See application file for complete search history.

(56) References Cited

U.S. PATENT DOCUMENTS 6,476,092 B1 * 11/2002 Kunita ............... G03F 7/0388
522/182
2002/0042016 A1    4/2002 Yoon et al.
2004/0248031 A1    12/2004 Ansai et al.
2018/0107118 A1    4/2018 Goto et al.

FOREIGN PATENT DOCUMENTS

| EP | 2 623 558 A1 | 8/2013 | |
| JP | 63176346 A * | 7/1988 | |
| JP | 7-234511 A | 9/1995 | |
| JP | 2002-082441 A | 3/2002 | |
| JP | 2011-039315 A | 2/2011 | |
| WO | 03/035637 A1 | 5/2003 | |
| WO | 2013047536 A1 | 4/2013 | |
| WO | WO-2013047536 A1 * | 4/2013 | ........... G03F 7/0045 |
| WO | 2014/017144 A1 | 1/2014 | |
| WO | WO-2014017144 A1 * | 1/2014 | ........... G03F 7/0397 |
| WO | WO-2019187803 A1 * | 10/2019 | |

OTHER PUBLICATIONS

PE2E Search translation of WO2019187803A1 (Year: 2019).*
PE2E Search translation of WO2014017144A1 (Year: 2014).*
PE2E Search translation of WO2013047536A1 (Year: 2013).*
Extended European Patent Office dated Oct. 7, 2021, issued by the European Patent Office in application No. 19858360.1.
International Search Report dated Nov. 5, 2019 from the International Searching Authority in International Application No. PCT/JP2019/031790.
Written Opinion dated Nov. 5, 2018 from the International Bureau in International Application No. PCT/JP2019/031790.
International Preliminary Report on Patentability dated Mar. 9, 2021 from the International Bureau in International Application No. PCT/JP2019/031790.
Office Action dated Feb. 16, 2023 from the Israeli Patent Office in Application No. 280627.

* cited by examiner

*Primary Examiner* — Sean M DeGuire
*Assistant Examiner* — Alexander Nicholas Lee
(74) *Attorney, Agent, or Firm* — Sughrue Mion, PLLC

(57) ABSTRACT

The present invention provides an actinic ray-sensitive or radiation-sensitive resin composition which is excellent in LER performance and a collapse suppressing ability. Furthermore, the present invention provides a resist film, a pattern forming method, and a method for manufacturing an electronic device. The actinic ray-sensitive or radiation-sensitive resin composition of an embodiment of the present invention includes a resin having a polarity that increases by the action of an acid; and a compound that generates an acid upon irradiation with actinic rays or radiation, in which the resin has a repeating unit represented by General Formula (B-1).

(B-1)

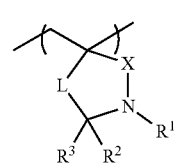

20 Claims, No Drawings

ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2019/031790 filed on Aug. 13, 2019, which claims priority under 35 U.S.C. § 119(a) to Japanese Patent Application No. 2018-168170 filed on Sep. 7, 2018 and Japanese Patent Application No. 2019-030587 filed on Feb. 22, 2019. Each of the above applications is hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, and a method for manufacturing an electronic device.

2. Description of the Related Art

In the related art, microfabrication by lithography using a photoresist composition (hereinafter also referred to as an "actinic ray-sensitive or radiation-sensitive resin composition") has been performed in processes for manufacturing semiconductor devices such as an integrated circuit (IC) and a large scale integrated circuit (LSI). In recent years, formation of an ultrafine pattern in a submicron region or a quarter-micron region has been demanded in accordance with realization of a high degree of integration for integrated circuits. With such a demand, a tendency that an exposure wavelength has been shifted from g-rays to i-rays, and further, as with KrF excimer laser light, the exposure wavelength is shortened is observed. Moreover, development of lithography with electron beams (EB), X-rays, or extreme ultraviolet (EUV) rays, in addition to the excimer laser light, has also been currently in progress.

For example, JP1995-234511A (JP-H05-234511A) discloses a radiation-sensitive material consisting of a copolymer including an itaconic anhydride represented by the following general formula and a polymer including a unit structure that generates an alkali-soluble group by an acid in a unit structure thereof, and a substance that generates an acid upon irradiation with radiation (claim 26).

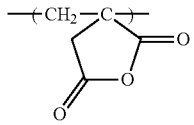

SUMMARY OF THE INVENTION

The present inventors have prepared an actinic ray-sensitive or radiation-sensitive resin composition with reference to the related art documents, have examined the composition, and have thus found that a pattern formed from the obtained actinic ray-sensitive or radiation-sensitive resin composition is deteriorated in a line edge roughness (LER) and a pattern collapse easily occurs in some cases at the time of forming a pattern. That is, the present inventors have clarified that it is necessary to further improve the LER of a pattern formed from an actinic ray-sensitive or radiation-sensitive resin composition and a pattern collapse suppressing ability at the time of forming a pattern using the actinic ray-sensitive or radiation-sensitive resin composition.

Hereinafter, the excellent LER of a pattern formed from an actinic ray-sensitive or radiation-sensitive resin composition is also simply referred to as excellent LER performance. In addition, an excellent pattern collapse suppressing ability at the time of forming a pattern using an actinic ray-sensitive or radiation-sensitive resin composition is also simply referred to as an excellent collapse suppressing ability.

Therefore, an object of the present invention is to provide an actinic ray-sensitive or radiation-sensitive resin composition having excellent LER performance and an excellent collapse suppressing ability.

Furthermore, another object of the present invention is to provide a resist film, a pattern forming method, and a method for manufacturing an electronic device.

As a result of intensive studies to solve the problems, the present inventors have found that the object can be achieved by the following configurations.

[1] An actinic ray-sensitive or radiation-sensitive resin composition comprising:
  a resin having a polarity that increases by the action of an acid; and
  a compound that generates an acid upon irradiation with actinic rays or radiation,
  in which the resin has a repeating unit represented by General Formula (B-1) which will be described later.

[2] The actinic ray-sensitive or radiation-sensitive resin composition as described in [1],
  in which the repeating unit represented by General Formula (B-1) which will be described later is a repeating unit represented by General Formula (B-2) which will be described later.

[3] The actinic ray-sensitive or radiation-sensitive resin composition according to [1] or [2],
  in which in General Formula (B-1) which will be described later, at least one of $R^2$ or $R^3$ is an electron-withdrawing group.

[4] The actinic ray-sensitive or radiation-sensitive resin composition as described in any one of [1] to [3],
  in which in General Formula (B-1) which will be described later, both of $R^2$ and $R^3$ are electron-withdrawing groups.

[5] The actinic ray-sensitive or radiation-sensitive resin composition as described in any one of [1] to [4],
  in which in General Formula (B-1) which will be described later, at least one of $R^2$ or $R^3$ is an electron-withdrawing group having a fluorine atom.

[6] The actinic ray-sensitive or radiation-sensitive resin composition as described in any one of [1] to [5],
  in which the repeating unit represented by General Formula (B-1) which will be described later has three or more fluorine atoms.

[7] The actinic ray-sensitive or radiation-sensitive resin composition as described in any one of [1] to [6],
  in which the repeating unit represented by General Formula (B-1) which will be described later has one or more groups selected from the group consisting of a carboxylic acid group protected by an acid-eliminable group, a phenolic hydroxyl group protected by an acid-eliminable group, and a hexafluoroisopropanol group protected by an acid-eliminable group.

[8] The actinic ray-sensitive or radiation-sensitive resin composition as described in any one of [1] to [7],
in which in General Formula (B-1) which will be described later, $R^1$ has one or more groups selected from the group consisting of a carboxylic acid group protected by an acid-eliminable group, a phenolic hydroxyl group protected by an acid-eliminable group, and a hexafluoroisopropanol group protected by an acid-eliminable group.

[9] The actinic ray-sensitive or radiation-sensitive resin composition as described in any one of [1] to [8],
in which a content of the repeating unit represented by General Formula (B-1) which will be described later in the resin is 10% to 80% by mass with respect to all the repeating units.

[10] The actinic ray-sensitive or radiation-sensitive resin composition as described in any one of [1] to [9],
in which a content of fluorine atoms in the resin is 16% to 40% by mass with respect to all the repeating units.

[11] The actinic ray-sensitive or radiation-sensitive resin composition as described in any one of [1] to [10],
in which a weight-average molecular weight of the resin is 3,500 to 25,000.

[12] A resist film formed from the actinic ray-sensitive or radiation-sensitive resin composition as described in any one of [1] to [11].

[13] A pattern forming method comprising:
a step of forming a resist film using the actinic ray-sensitive or radiation-sensitive resin composition as described in any one of [1] to [11];
a step of exposing the resist film; and
a step of developing the exposed resist film using a developer.

[14] A method for manufacturing an electronic device, comprising the pattern forming method as described in [13].

According to the present invention, it is possible to provide an actinic ray-sensitive or radiation-sensitive resin composition having excellent LER performance and an excellent collapse suppressing ability.

Furthermore, according to the present invention, it is possible to provide a resist film, a pattern forming method, and a method for manufacturing an electronic device.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

"Actinic rays" or "radiation" in the present specification means, for example, a bright line spectrum of a mercury lamp, far ultraviolet rays typified by an excimer laser, extreme ultraviolet rays (EUV), X-rays, electron beams (EB), or the like. "Light" in the present specification means actinic rays or radiation.

Unless otherwise specified, "exposure" in the present specification encompasses not only exposure by a bright line spectrum of a mercury lamp, far ultraviolet rays typified by an excimer laser, extreme ultraviolet radiation (EUV rays), and X-rays, or the like, but also lithography by particle rays such as electron beams and ion beams.

In the present specification, a numerical range expressed using "to" is used in a meaning of a range that includes the preceding and succeeding numerical values of "to" as the lower limit value and the upper limit value, respectively.

In the present specification, (meth)acrylate represents acrylate and methacrylate.

With regard to citations for a group (atomic group) in the present specification, in a case where the group is cited without specifying whether it is substituted or unsubstituted, the group includes both a group having no substituent and a group having a substituent as long as the gist of the present invention is not impaired. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

Furthermore, in the present specification, in a case of referring to an expression "a substituent may be contained", the types of substituents, the positions of the substituents, and the number of the substituents are not particularly limited. The number of the substituents may be, for example, one, two, three, or more. Examples of the substituent include a monovalent non-metal atomic group from which a hydrogen atom has been excluded, and the substituent can be selected from the following substituent group T, for example.

(Substituent T)

Examples of the substituent T include halogen atoms such as a fluorine atom, a chlorine atom, a bromine atom, and an iodine atom; an alkoxy group such as a methoxy group, an ethoxy group, and a tert-butoxy group; an aryloxy group such as a phenoxy group and a p-tolyloxy group; an alkoxycarbonyl group such as a methoxycarbonyl group, a butoxycarbonyl group, and a phenoxycarbonyl group; an acyloxy group such as an acetoxy group, a propionyloxy group, and a benzoyloxy group; an acyl group such as an acetyl group, a benzoyl group, an isobutyryl group, an acryloyl group, a methacryloyl group, and a methoxalyl group; an alkylsulfanyl group such as a methylsulfanyl group and a tert-butylsulfanyl group; an arylsulfanyl group such as a phenylsulfanyl group and a p-tolylsulfanyl group; an alkyl group; a cycloalkyl group; an aryl group; a heteroaryl group; a hydroxyl group; a carboxyl group; a formyl group; a sulfo group; a cyano group; an alkylaminocarbonyl group; an arylaminocarbonyl group; a sulfonamido group; a silyl group; an amino group; a monoalkylamino group; a dialkylamino group; an arylamino group; and a combination thereof.

Furthermore, in the present specification, the weight-average molecular weight (Mw), the number-average molecular weight (Mn), and the dispersity (also referred to as a molecular weight distribution) (Mw/Mn) of a resin are each defined as a value converted in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

[Actinic Ray-Sensitive or Radiation-Sensitive Resin Composition]

The actinic ray-sensitive or radiation-sensitive resin composition of an embodiment of the present invention (hereinafter also simply referred to as a "composition") includes a resin having a polarity that increases by the action of an acid and a compound that generates an acid upon irradiation with actinic rays or radiation.

The resin has a repeating unit represented by General Formula (B-1) which will be described later.

The mechanism by which the objects of the present invention are accomplished through such a configuration is not always clear, but is presumed to be as follows by the present inventors.

That is, since the resin has the repeating unit represented by General Formula (B-1), the resin has an excellent glass transition temperature (Tg) due to the immobilization of a molecular motion of the main chain, whereby the pattern collapse suppressing performance is excellent. In addition, since the resin has a repeating unit represented by General Formula (B-1), it is possible to control the movement of an acid generated from the compound that generates an acid upon irradiation with actinic rays or radiation within the resist film, and thus, the LER performance is improved.

Hereinafter, the components included in the composition of the embodiment of the present invention will be described in detail. Furthermore, the composition of the embodiment of the present invention is a so-called resist composition, and may be either a positive tone resist composition or a negative tone resist composition. In addition, the composition of the embodiment of the present invention may be either a resist composition for alkali development or a resist composition for organic solvent development.

The composition of the embodiment of the present invention is typically a chemically amplified resist composition.

<Resin (X)>

The composition of the embodiment of the present invention includes a resin having a polarity that increases by the action of an acid, in which the resin has a repeating unit represented by General Formula (B-1) which will be described later (hereinafter also referred to as a "resin (X)").

Incidentally, the resin (X) is a resin having a polarity that increases by the action of an acid as described above. Therefore, in the pattern forming method of an embodiment of the present invention which will be described later, typically, in a case where an alkali developer is adopted as the developer, a positive tone pattern is suitably formed, and in a case where an organic developer is adopted as the developer, a negative tone pattern is suitably formed.

In addition, the resin (X) preferably has a group having a polarity that increases through decomposition by the action of an acid (hereinafter also referred to as an "acid-decomposable group"), as described later.

Hereinafter, the repeating unit represented by General Formula (B-1) included in the resin (X) and other repeating units which may be optionally included will be described in detail.

(Repeating Unit Represented by General Formula (B-1))
General Formula (B-1)

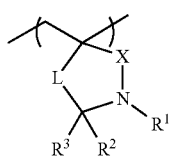

(B-1)

In General Formula (B-1), X represents —CO—, —SO—, or —SO$_2$—. X is preferably —CO—.

The repeating unit represented by General Formula (B-1) may or may not have an acid-decomposable group.

The acid-decomposable group is preferably a group having a structure in which a polar group is protected by an acid-eliminable group that is eliminated through decomposition by the action of an acid.

Examples of the polar group include an acidic group (a group which dissociates in a 2.38%-by-mass aqueous tetramethylammonium hydroxide solution), such as a carboxyl group, a phenolic hydroxyl group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and an alcoholic hydroxyl group.

Moreover, the alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol group (for example, a hexafluoroisopropanol group) having the α-position substituted with an electron-withdrawing group such as a fluorine atom is excluded as a hydroxyl group. The alcoholic hydroxyl group is preferably a hydroxyl group having an acid dissociation constant (pKa) from 12 to 20.

Among the polar groups, the carboxyl group, the phenolic hydroxyl group, or the hexafluoroisopropanol group is preferable.

That is, in a case where the repeating unit represented by General Formula (B-1) has an acid-decomposable group, it is preferable that the repeating unit represented by General Formula (B-1) has one or more groups selected from the group consisting of a carboxylic acid group protected by an acid-eliminable group, a phenolic hydroxyl group protected by an acid-eliminable group, and a hexafluoroisopropanol group protected by an acid-eliminable group.

Examples of the acid-eliminable group include groups represented by Formulae (Y1) to (Y4).

—C(Rx$_1$)(Rx$_2$)(Rx$_3$)                    Formula (Y1):

—C(=O)OC(Rx$_1$)(Rx$_2$)(Rx$_3$)              Formula (Y2):

—C(R$_{36}$)(R$_{37}$)(OR$_{38}$)              Formula (Y3):

—C(Rn)(H)(Ar)                                  Formula (Y4):

In Formula (Y1) and Formula (Y2), Rx$_1$ to Rx$_3$ each independently represent an (linear or branched) alkyl group, a (monocyclic or polycyclic) cycloalkyl group, an (monocyclic or polycyclic) aryl group, an aralkyl group, or an alkenyl group.

Furthermore, in a case where all of Rx$_1$ to Rx$_3$ are the (linear or branched) alkyl groups, it is preferable that at least two of Rx$_1$, Rx$_2$, or Rx$_3$ are methyl groups.

Among those, it is preferable that Rx$_1$ to Rx$_3$ each independently represent the linear or branched alkyl group, and it is more preferable that Rx$_1$ to Rx$_3$ each independently represent the linear alkyl group.

Two of Rx$_1$ to Rx$_3$ may be bonded to each other to form a monocycle or a polycycle. The group formed by the bonding of two of Rx$_1$ to Rx$_3$ is preferably a monocyclic or polycyclic cycloalkyl group.

As the alkyl group of each of Rx$_1$ to Rx$_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable.

As the aryl group as each of $Rx_1$ to $Rx_3$, an aryl group having 6 to 10 carbon atoms is preferable, and examples thereof include a phenyl group, a naphthyl group, and an anthryl group.

The aralkyl group as each of $Rx_1$ to $Rx_3$ is preferably an aralkyl group having 7 to 12 carbon atoms, and examples thereof include a benzyl group, a phenethyl group, and a naphthylmethyl group.

The alkenyl group as each of $Rx_1$ to $Rx_3$ is preferably an alkenyl group having 2 to 8 carbon atoms, and examples thereof include a vinyl group, an allyl group, a butenyl group, and a cyclohexenyl group.

As the cycloalkyl group formed by the bonding of two of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable, and a monocyclic cycloalkyl group having 5 or 6 carbon atoms is more preferable.

In the cycloalkyl group of each of $Rx_1$ to $Rx_3$, and the cycloalkyl group formed by the bonding of two of $Rx_1$ to $Rx_3$, for example, one or more of the methylene groups constituting the ring may be substituted with heteroatoms such as an oxygen atom, or groups having a heteroatom, such as a carbonyl group.

In the cycloalkyl group of each of $Rx_1$ to $Rx_3$ and the cycloalkyl group formed by the bonding of two of $Rx_1$ to $Rx_3$, for example, one or more of the ethylene groups constituting the ring may be substituted with vinylene groups.

In Formula (Y3), $R_{36}$ to $R_{38}$ each independently represent a hydrogen atom or a monovalent organic group. $R_{37}$ and $R_{38}$ may be bonded to each other to form a ring. Examples of the monovalent organic group include the group represented by Formula (Y1), an alkyl group other than the group represented by Formula (Y1) (which may linear or branched, or may have a cyclic structure, with examples thereof including a methyl group, an ethyl group, an n-propyl group, an isopropyl group, an n-butyl group, an isobutyl group, and a 1-adamantyl group), an aryl group, an aralkyl group, and an alkenyl group. $R_{36}$ is also preferably the hydrogen atom.

As the substituent contained in the aryl group, a fluoroalkyl group is preferable, and a perfluoroalkyl group having 1 or 2 carbon atoms is more preferable.

The aryl group preferably has 6 to 15 carbon atoms, and is more preferably a phenyl group.

As Formula (Y3), a group represented by Formula (Y3-1) is also preferable.

(Y3-1)

Here, $L_1$ and $L_2$ each independently represent a hydrogen atom, an alkyl group, a cycloalkyl group, an aryl group, or a group formed by combination thereof (for example, a group formed by combination of an alkyl group and an aryl group).

M represents a single bond or a divalent linking group.

Q represents an alkyl group which may include a heteroatom, a cycloalkyl group which may include a heteroatom, an aryl group which may include a heteroatom, an amino group, an ammonium group, a mercapto group, a cyano group, an aldehyde group, or a group formed by combination thereof (for example, a group formed by combination of an alkyl group and a cycloalkyl group).

In the alkyl group and the cycloalkyl group, for example, one of the methylene groups may be substituted with a heteroatom such as an oxygen atom, or a group having a heteroatom, such as a carbonyl group.

Furthermore, it is preferable that one of $L_1$ and $L_2$ is a hydrogen atom, and the other is an alkyl group, a cycloalkyl group, an aryl group, or a group formed by combination of an alkylene group and an aryl group.

At least two of Q, M, and $L_1$ may be bonded to each other to form a ring (preferably a 5- or 6-membered ring).

From the viewpoint of making patterns finer, it is preferable that $L_2$ is a secondary or tertiary alkyl group, it is more preferable that $L_2$ is the tertiary alkyl group. Examples of the secondary alkyl group include an isopropyl group, a cyclohexyl group, and a norbornyl group, and examples of the tertiary alkyl group include a tert-butyl group and an adamantyl group. In these aspects, since Tg and activation energy are increased, suppression of fogging can be achieved, in addition to a film strength that is secured.

In Formula (Y4), Ar represents an aromatic ring group. Rn represents an alkyl group, a cycloalkyl group, or an aryl group. Rn and Ar may be bonded to each other to form a non-aromatic ring. Ar is preferably an aryl group.

As the acid-decomposable group, a cumyl ester group, an enol ester group, an acetal ester group, a tertiary alkyl ester group, or the like is preferable, and the acetal ester group or the tertiary alkyl ester group is more preferable.

In General Formula (B-1), $R^1$ represents a hydrogen atom or an organic group.

As the organic group of $R^1$, a group having a polar group or a group having an acid-decomposable group is preferable.

The group having a polar group in $R^1$ may be a group partially including a polar group, and may be the polar group itself where possible. It should be noted that the polar group in the group having a polar group is preferably not protected by an acid-eliminable group that is eliminated by the action of an acid.

Examples of the polar group are as described above.

As the group having a polar group, for example, a group represented by -$L^{R1}$-$P^S$ is preferable.

$L^{R1}$ represents a single bond, an alkylene group (preferably having 1 to 5 carbon atoms), or an arylene group (preferably having 6 to 18 carbon atoms).

$P^S$ represents a monovalent polar group.

$P^S$ is preferably a carboxyl group, a phenolic hydroxyl group, or a fluorinated alcohol group (preferably a hexafluoroisopropanol group).

In addition, in a case where $P^S$ is the phenolic hydroxyl group, $L^{R1}$ is the arylene group.

The group having an acid-decomposable group in $R^1$ may be a group partially including an acid-decomposable group or may be the acid-decomposable group itself.

The acid-decomposable group is preferably a group having a structure in which a polar group is protected by an acid-eliminable group that is eliminated through decomposition by the action of an acid.

Examples of the polar group in the acid-decomposable group are as described above, and examples of the acid-eliminable group in the acid-decomposable group are also as described above.

In a case where $R^1$ is a group having an acid-decomposable group, it is preferable that $R^1$ has one or more groups selected from the group consisting of a carboxylic acid group protected by an acid-eliminable group, a phenolic hydroxyl group protected by an acid-eliminable group, and a hexafluoroisopropanol group protected by an acid-eliminable group.

Moreover, it is also preferable that the group having an acid-decomposable group is a group in which a polar group in the above-mentioned group represented by -$L^{R1}$-$P^S$ is protected by an acid-eliminable group.

In addition, the polar group in the group represented by -$L^{R1}$-$P^S$ being protected by an acid-eliminable group is intended to mean, for example, a state where the hydrogen atom in $P^S$ is substituted with an acid-eliminable group.

In General Formula (B-1), $R^2$ and $R^3$ each independently represent a hydrogen atom or an organic group.

At least one (preferably both) of $R^2$ or $R^3$ preferably represents an organic group, and more preferably an electron-withdrawing group.

Examples of the electron-withdrawing group include an alkoxycarbonyl group, an aryloxycarbonyl group, a halogenated alkyl group such as a fluorinated alkyl group, an alkylsulfanyl group, an arylsulfanyl group, a carboxyl group, a sulfo group, a nitro group, a cyano group, an alkylaminocarbonyl group, an arylaminocarbonyl group, a sulfonamido group, a heteroaryl group, and an acyl group. In addition, the examples also include an aryl group in which one or more of the electron-withdrawing groups are substituted on the aryl group.

In a case where the group mentioned as an example of the electron-withdrawing group has an alkyl group moiety, the alkyl group moiety may be linear or branched, or may have a cyclic structure. The alkyl group moiety preferably has 1 to 10 carbon atoms.

The halogenated alkyl group (preferably a fluorinated alkyl group) may be a perhalogenated alkyl group such as a trihalogenated methyl group. The halogenated alkyl group may be linear or branched, or may have a cyclic structure, and may have a substituent such as a hydroxyl group, in addition to the halogen atom, and one or more carbon atoms may be substituted with carbonyl carbon. The halogenated alkyl group preferably has 1 to 10 carbon atoms, and more preferably has 1 to 4 carbon atoms. The number of halogen atoms contained in the halogenated alkyl group is preferably 3 to 15, and more preferably 3 to 8.

The electron-withdrawing group (for example, an alkoxycarbonyl group) may form an acid-decomposable group.

Among those, the electron-withdrawing group is preferably an electron-withdrawing group having a fluorine atom (for example, the fluorinated alkyl group) from the viewpoint that the LER performance is more excellent.

Furthermore, from the viewpoint that the LER performance is more excellent, it is preferable that at least one of $R^2$ or $R^3$ is an electron-withdrawing group having a fluorine atom, and it is more preferable that the both are electron-withdrawing groups having a fluorine atom.

In General Formula (B-1), L represents a divalent linking group having a heteroatom as a ring member atom.

Furthermore, the ring member atom is intended to mean an atom forming a ring (which is a ring having —X—N($R^1$)—C($R^2$)($R^3$)-L- in General Formula (B-1) in this case).

An atom (for example, an atom constituting $R^1$ to $R^3$) in the substituent contained in the ring is not intended to mean the ring member atom.

Examples of the divalent linking group include an ether group (—O—), a carbonyl group (—CO—), an ester group (—COO—), a thioether group (—S—), —SO—, —SO$_2$—, —NR$^6$— (R$^6$ represents a hydrogen atom or an organic group, and the organic group is preferably an electron-withdrawing group; and examples of the electron-withdrawing group include electron-withdrawing groups which can be taken by $R^2$ and $R^3$), a divalent hydrocarbon group (for example, an alkylene group, an alkenylene group (example: —CH═CH—), an alkynylene group (example: —C≡C—), and an arylene group), and a combination thereof.

L may have at least one heteroatom or and may have two or more heteroatoms as the ring member atom. In a case where two or more heteroatoms are present, the two or more heteroatoms may be the same as or different from each other.

Examples of the heteroatom include an oxygen atom, a nitrogen atom, and a sulfur atom.

In a case where the heteroatom is an oxygen atom, the oxygen atom preferably forms a group represented by *—O—*.

In a case where the heteroatom is a nitrogen atom, it is preferable that the nitrogen atom forms a group represented by *—NR$^6$—* (R$^6$ represents a hydrogen atom or an organic group, and the organic group is preferably an electron-withdrawing group. Examples of the electron-withdrawing group include the electron-withdrawing groups which can be taken by $R^2$ and $R^3$).

In a case where the heteroatom is a sulfur atom, it is preferable that the sulfur atom forms a group represented by *—S—*, *—SO—*, or *—SO$_2$—*.

In the above, * is a bonding position with an adjacent ring member atom.

L is preferably a group which makes the ring (ring having —X—N(R$^1$)—C(R$^2$)(R$^3$)-L-) in General Formula (B-1) a 5- to 10-membered ring, more preferably a group which makes the ring a 6- to 8-membered ring, and still more preferably a group which makes the ring a 6-membered ring.

L is preferably a group consisting of a divalent hydrocarbon group (preferably an alkylene group, in which the alkylene group may have one or more methylene groups substituted with carbonyl carbon) and one or more heteroatoms, and more preferably a group represented by *$^A$-alkylene group-Y—*$^B$.

*$^B$ represents a bonding position with —C(R$^2$)(R$^3$)—.

*$^A$ represents a bonding position on the opposite side of —C(R$^2$)(R$^3$)—.

Y represents —O—, —S—, —SO—, —SO$_2$—, or —NR$^6$—. R$^6$ in —NR$^6$— of Y is the same as R$^6$ in *—NR$^6$—*.

The alkylene group preferably has 1 to 3 carbon atoms, and more preferably has one carbon atom. The alkylene group may or may not have a substituent (preferably an organic group). The methylene group in the alkylene group may or may not be substituted with one or more atoms selected from the group consisting of carbonyl carbon and heteroatoms.

In General Formula (B-1), $R^1$ and $R^2$ or $R^3$ may be bonded to each other to form a ring.

$R^2$ and $R^3$ may be bonded to each other to form a ring.

The substituent which may be contained in L, and $R^2$ or $R^3$ may be bonded to each other to form a ring.

Examples of the substituent which may be contained in L include R$^6$ in a case where L has *—NR$^6$—*, and the substituent which may be contained in an alkylene group in a case where L includes the alkylene group.

The group formed by the mutual bonding of a plurality of groups as described above is preferably an alkylene group having 2 to 7 carbon atoms. The substituent which may be contained in the alkylene group having 2 to 7 carbon atoms is preferably a hydroxyl group, a fluorine atom, or a group having a fluorine atom (preferably a fluoroalkyl group such as a trifluoromethyl group, or the fluorine atom itself).

One or more of the methylene groups constituting the alkylene group having 2 to 7 carbon atoms may be substituted with heteroatoms such as an oxygen atom, or groups having a heteroatom, such as a carbonyl group.

General Formula (B-2)

The repeating unit represented by General Formula (B-1) is preferably a repeating unit represented by General Formula (B-2).

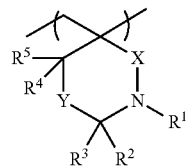

(B-2)

In General Formula (B-2), X represents —CO—, —SO—, or —SO$_2$—.

In a case where Y is —NR$^6$—, R$^6$, and R$^2$ or R$^3$ may be bonded to each other to form a ring.

The group formed by the mutual bonding of a plurality of groups as described above is preferably an alkylene group having 2 to 7 carbon atoms. As the substituent which may be contained in the alkylene group having 2 to 7 carbon atoms, a hydroxyl group or a group having a fluorine atom (preferably a fluoroalkyl group such as trifluoromethyl group, or the fluorine atom itself) is preferable.

One or more of the methylene groups constituting the alkylene group having 2 to 7 carbon atoms may be substituted with heteroatoms such as an oxygen atom, or groups having a heteroatom, such as a carbonyl group.

The repeating unit represented by General Formula (B-1) preferably has 3 or more fluorine atoms, more preferably has 3 to 20 fluorine atoms, and still more preferably has 3 to 12 fluorine atoms.

In a case where it has the number of fluorine atoms within the range, the sensitivity upon exposure (particularly EUV exposure) of a resist film formed from the composition of the embodiment of the present invention is improved.

Monomers from which Repeating Unit Represented by General Formula (B-1) is Derived Examples of the monomer from which the repeating unit represented by General Formula (B-1) is derived include the following monomer (CM). The monomer (CM) can be synthesized, for example, by a scheme shown below.

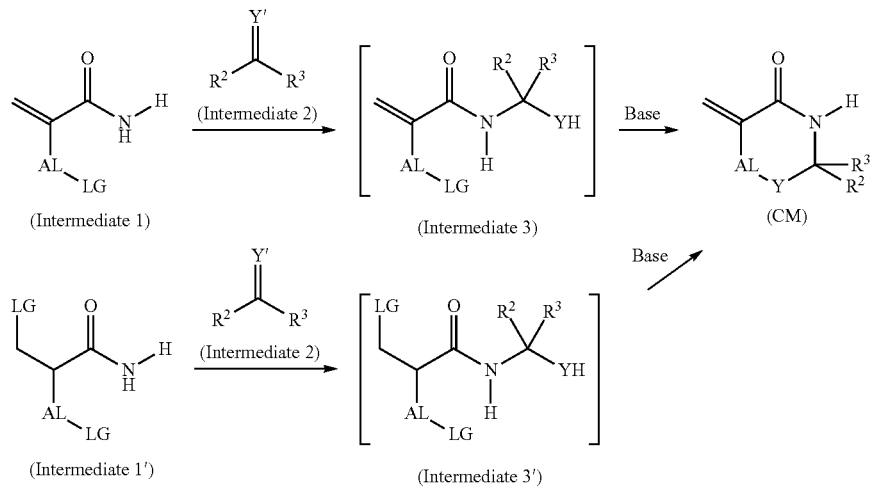

X in General Formula (B-2) is the same as X in the General Formula (B-1).

In General Formula (B-2), Y represents —O—, —S—, —SO—, —SO$_2$—, or —NR$^6$—. In General Formula (B-2), R$^1$ to R$^6$ each independently represent a hydrogen atom or an organic group.

R$^1$ to R$^3$ and R$^6$ in General Formula (B-2) are the same as R$^1$ to R$^3$ and R$^6$ in General Formula (B-1), respectively.

R$^4$ and R$^5$ are each independently preferably the hydrogen atom.

In General Formula (B-2), R$^1$, and R$^2$ or R$^3$ may be bonded to each other to form a ring.

R$^2$ and R$^3$ may be bonded to each other to form a ring.

R$^4$ or R$^5$, and R$^2$ or R$^3$ may be bonded to each other to form a ring.

In the scheme, the groups represented by X, Y, R$^2$, and R$^3$ are each the same as the groups represented by the corresponding symbols in General Formula (B-1).

AL represents an alkylene group (preferably having 1 to 3 carbon atoms) which may have a substituent. The methylene group in the alkylene group may be substituted with one or more atoms selected from the group consisting of carbonyl carbon and heteroatoms.

Y' represents, =O, =S, =SO, =SO$_2$, or NR$^6$ (R$^6$ is the same as R$^6$ in *—NR$^6$—*).

LG represents an eliminable group. Examples of the eliminable group include a halogen atom and a sulfonate (tosylate, mesylate, triflate, and the like).

An intermediate 2 is allowed to act on an intermediate 1 or an intermediate 1' to obtain an intermediate 3 or an intermediate 3'. A base is allowed to act on the intermediate 3 or the intermediate 3' to obtain a monomer (CM).

Furthermore, H bonded to the nitrogen atom in —CO—NH—C(R$^2$)(R$^3$)— in the monomer represented by General Formula (CM) can be converted into various substituents (a group having a polar group, a group having an acid-decomposable group, and the like), using a nucleophilic substitution reaction, a nucleophilic addition reaction, or the like.

The repeating unit represented by General Formula (B-1) may be used singly or in combination of two or more kinds thereof.

The repeating unit represented by General Formula (B-1) contained in the resin (X) may be only the repeating unit represented by General Formula (B-1) having an acid-decomposable group, may be the repeating unit represented by General Formula (B-1) having no acid-decomposable group, and may be both the repeating unit represented by General Formula (B-1) having an acid-decomposable group and the repeating unit represented by General Formula (B-1) having no acid-decomposable group.

The content of the repeating unit represented by General Formula (B-1) is preferably 10% to 100% by mass, more preferably 10% to 80% by mass, and still more preferably 20% to 70% by mass, with respect to all the repeating units of the resin (X).

The monomer from which the repeating unit represented by General Formula (B-1) is derived is exemplified below.

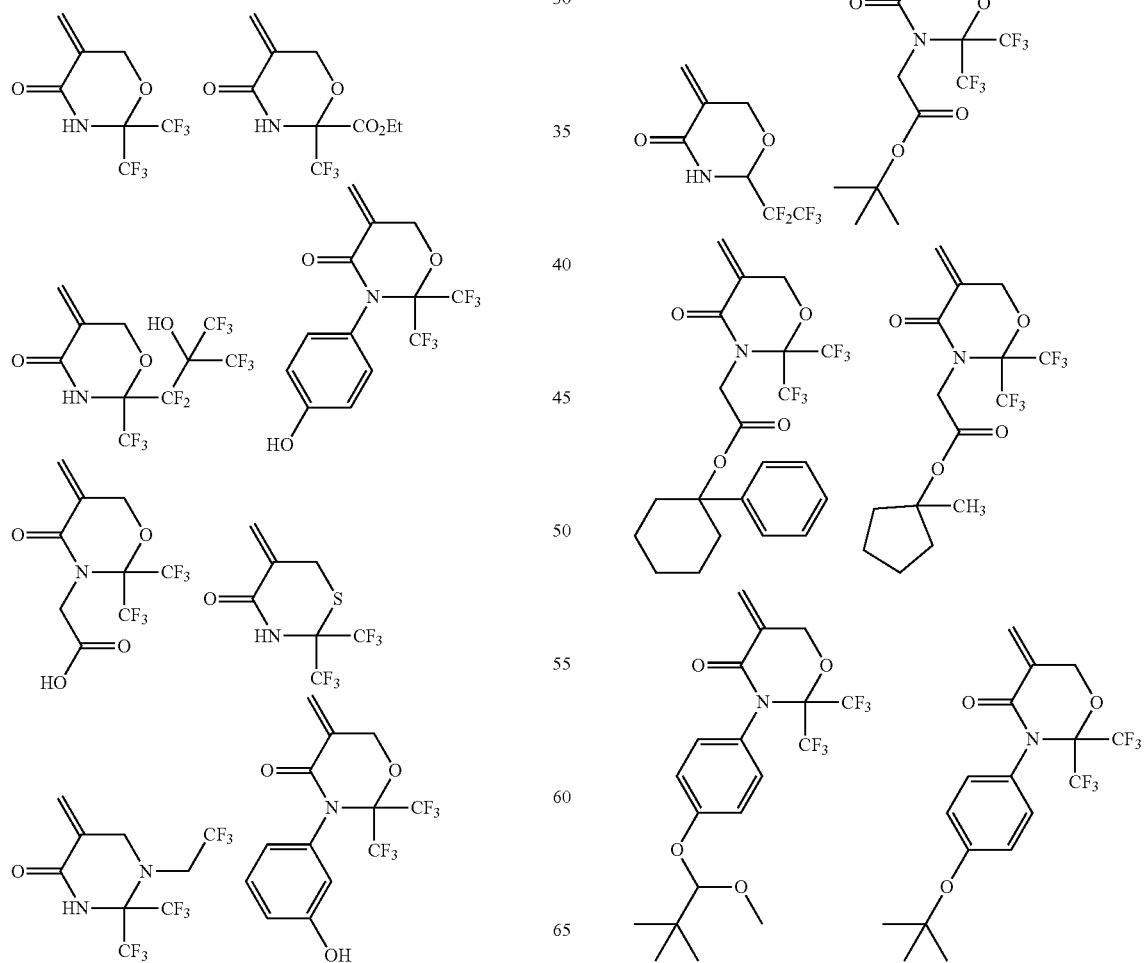

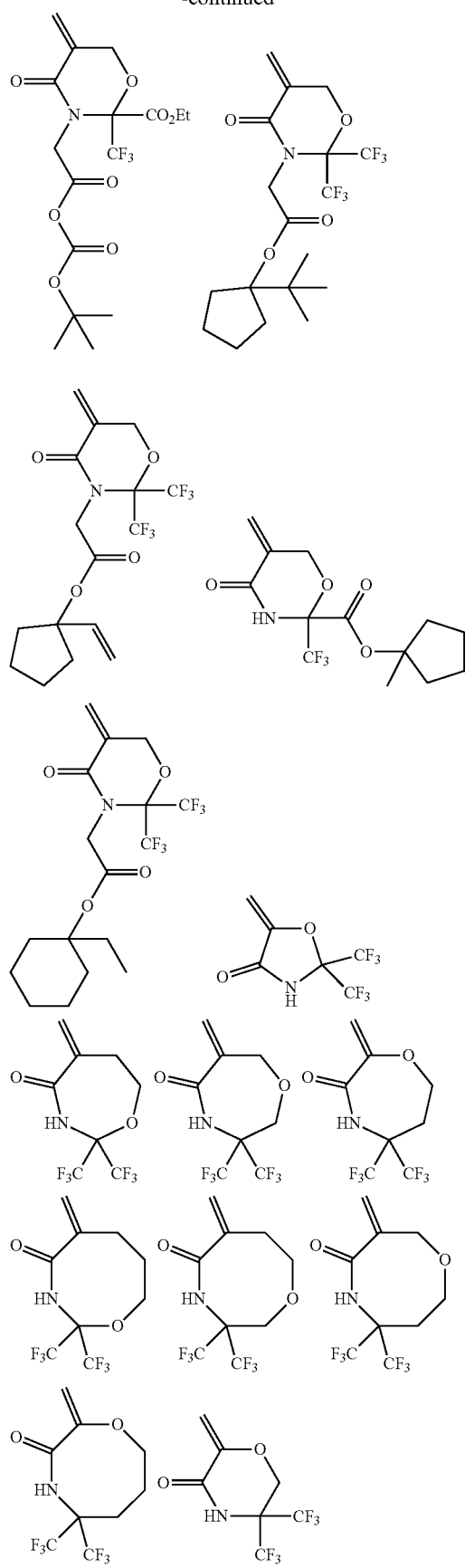
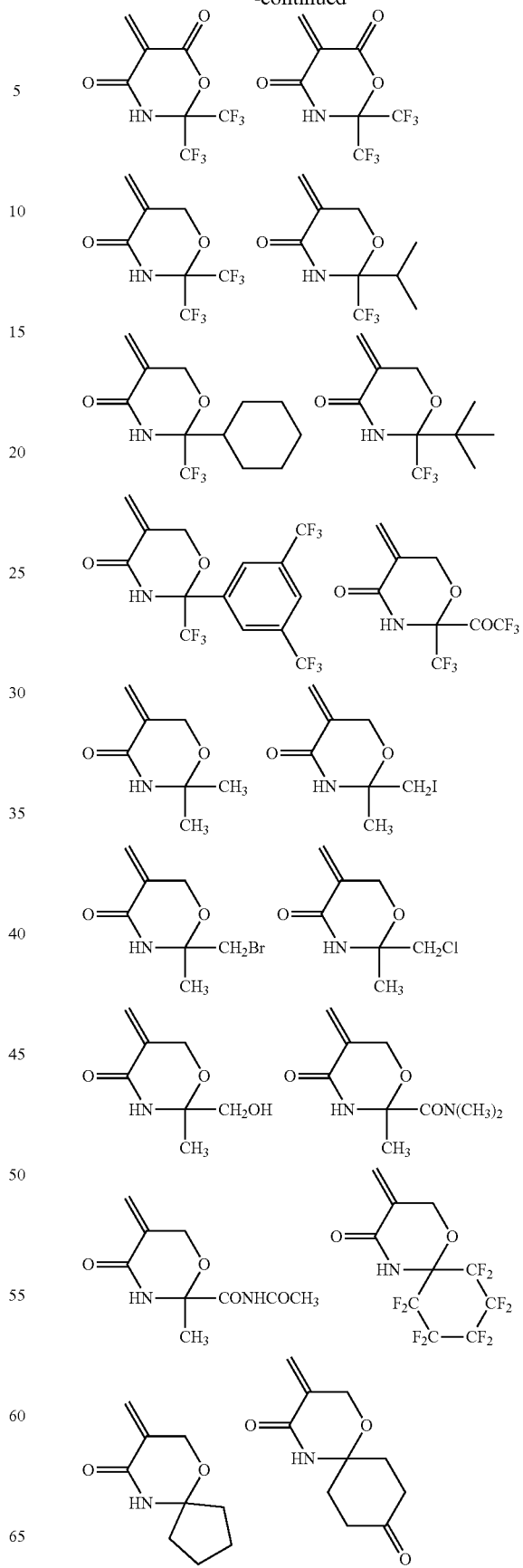

-continued

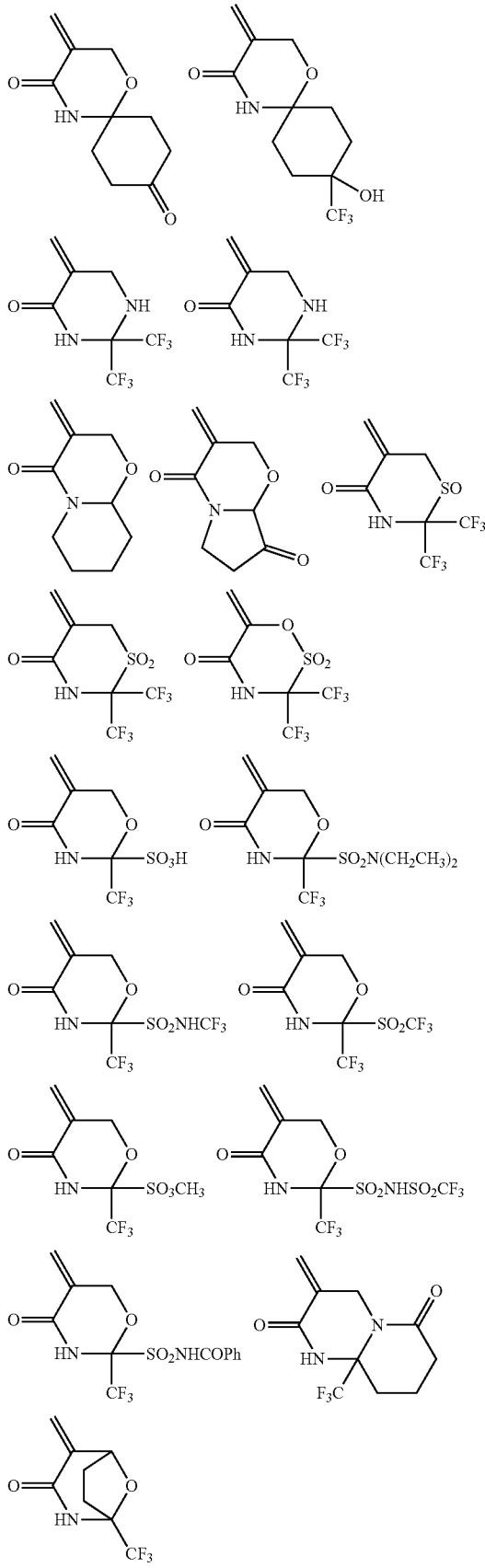

The resin (X) may further have another repeating unit, in addition to the repeating unit represented by General Formula (B-1).

Hereinafter, such another repeating unit which may be contained in the resin (X) will be described in detail.

(Repeating Unit Having Acid-Decomposable Group)

The resin (X) may have a repeating unit having an acid-decomposable group. The repeating unit having an acid-decomposable group as mentioned herein means a repeating unit which is different from the repeating unit represented by General Formula (B-1).

The acid-decomposable group is as described in the description of the repeating unit represented by General Formula (B-1).

General Formula (AI)

The repeating unit having an acid-decomposable group is preferably a repeating unit represented by General Formula (AI).

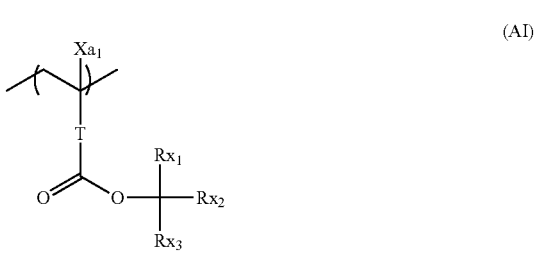

(AI)

In General Formula (AI), $Xa_1$ represents a hydrogen atom, a halogen atom, or an alkyl group which may have a substituent.

T represents a single bond or a divalent linking group.

$Rx_1$ to $Rx_3$ each independently represent an (linear or branched) alkyl group, a (monocyclic or polycyclic) cycloalkyl group, or an aryl group. It should be noted that in a case where all of $Rx_1$ to $Rx_3$ are (linear or branched) alkyl groups, it is preferable that at least two of $Rx_1$, $Rx_2$, or $Rx_3$ are methyl groups.

Two of $Rx_1$ to $Rx_3$ may be bonded to each other to form a (monocyclic or polycyclic) cycloalkyl group.

Examples of the alkyl group which may have a substituent, represented by $Xa_1$, include a methyl group and a group represented by —$CH_2$—$R_{11}$. $R_{11}$ represents a halogen atom (a fluorine atom and the like), a hydroxyl group, or a monovalent organic group, examples thereof include an alkyl group having 5 or less carbon atoms and an acyl group having 5 or less carbon atoms, the alkyl group having 3 or less carbon atoms is preferable, and the methyl group is more preferable.

Examples of the halogen atom represented by $Xa_1$ include a fluorine atom, a chlorine atom, a bromine atom, and an iodine atom, and the fluorine atom or the iodine atom is preferable.

As $Xa_1$, the hydrogen atom, the fluorine atom, the iodine atom, the methyl group, a trifluoromethyl group, or a hydroxymethyl group is preferable.

Examples of the divalent linking group represented by T include an alkylene group, an arylene group, a —COO-Rt- group, and an —O-Rt- group. In the formulae, Rt represents an alkylene group or a cycloalkylene group.

T is preferably the single bond or the —COO-Rt- group. In a case where T represents the —COO-Rt- group, Rt is preferably an alkylene group having 1 to 5 carbon atoms, and more preferably a —$CH_2$— group, a —$(CH_2)_2$— group, or a —$(CH_2)_3$— group.

As the alkyl group represented by each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group represented by each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

The aryl group represented by each of $Rx_1$ to $Rx_3$ is preferably an aryl group having 6 to 12 carbon atoms, and particularly preferably a phenyl group.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group formed by the bonding of two of $Rx_1$ to $Rx_3$, for example, one or more of the methylene groups constituting the ring may be substituted with heteroatoms such as an oxygen atom, or groups having a heteroatom, such as a carbonyl group. Further, one or more of ethylene groups constituting the ring may be substituted with vinylene groups.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms.

General Formula (AII)

The repeating unit having an acid-decomposable group is also preferably a repeating unit represented by General Formula (AII).

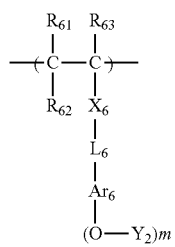

(AII)

In Formula (AII), $R_{61}$, $R_{62}$, and $R_{63}$ each independently represent a hydrogen atom, an alkyl group, a cycloalkyl group, a halogen atom, a cyano group, or an alkoxycarbonyl group.

Among those, $R_{61}$, $R_{62}$, and $R_{63}$ are each preferably the hydrogen atom.

As the alkyl group represented by each of $R_{61}$, $R_{62}$, and $R_{63}$ in General Formula (AII), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent, is preferable, an alkyl group having 8 or less carbon atoms is more preferable, and an alkyl group having 3 or less carbon atoms is still more preferable.

The cycloalkyl group represented by each of $R_{61}$, $R_{62}$, and $R_{63}$ in General Formula (AII) may be either a monocycle or a polycycle. A monocyclic cycloalkyl group having 3 to 8 carbon atoms, such as a cyclopropyl group, a cyclopentyl group, and a cyclohexyl group, which may have a substituent, is preferable.

Examples of the halogen atom represented by each of $R_{61}$, $R_{62}$, and $R_{63}$ in General Formula (AII) include a fluorine atom, a chlorine atom, a bromine atom, and an iodine atom, and the fluorine atom is preferable.

As the alkyl group included in the alkoxycarbonyl group represented by each of $R_{61}$, $R_{62}$, and $R_{63}$ in General Formula (AII), the same ones as the alkyl group in each of $R_{61}$, $R_{62}$, and $R_{63}$ are preferable.

$R_{62}$ may be bonded to the substituent contained in $Ar_6$, or $L_6$ to form a ring.

$X_6$ represents a single bond, —COO—, or —CONR$_{64}$—.

$R_{64}$ represents a hydrogen atom or an alkyl group.

As the alkyl group, the same alkyl group as the alkyl group for each of $R_{61}$ to $R_{63}$ is preferable.

As $X_6$, the single bond, —COO—, or —CONH— is preferable, the single bond or —COO— is more preferable, and the single bond is still more preferable.

$L_6$ represents a single bond or a divalent linking group.

Examples of the divalent linking group include an ether group, a carbonyl group, an ester group, a thioether group, —SO$_2$—, —NR— (R represents a hydrogen atom or an alkyl group), a divalent hydrocarbon group (for example, an alkylene group, an alkenylene group (example: —CH=CH—), an alkynylene group (example: —C≡C—), and an arylene group), and a group formed by combination of these groups.

Among those, as the divalent linking group, the alkylene group is preferable, and as the alkylene group, an alkylene group having 1 to 8 carbon atoms, such as a methylene group, an ethylene group, a propylene group, a butylene group, a hexylene group, and an octylene group, is more preferable.

Moreover, in a case where $L_6$ and $R_{62}$ are bonded to each other to form a ring, $L_6$ represents a trivalent linking group. In this case, among the groups described above as the divalent linking group for $L_6$, which can further have a substituent, it is preferable that the substituent and $R_{62}$ are bonded to each other to form a single bond or an alkylene group (preferably having 1 to 8 carbon atoms).

The ring formed in a case where $R_{62}$ and the substituent contained in $L_6$ are bonded is preferably a 5- or 6-membered ring.

$Ar_6$ represents an (m+1)-valent aromatic ring group, and represents an (m+2)-valent aromatic ring group in a case where a substituent contained in $Ar_6$ has and $R_{62}$ are bonded to each other to form a ring.

As the aromatic ring group, for example, an aromatic hydrocarbon ring group having 6 to 18 carbon atoms, such as a benzene ring group, a tolylene ring group, a naphthalene ring group, and an anthracene ring group, or an aromatic heterocyclic group including a heterocycle, such as a thiophene ring group, a furan ring group, a pyrrole ring group, a benzothiophene ring group, a benzofuran ring group, a benzopyrrole ring group, a triazine ring group, an imidazole ring group, a benzimidazole ring group, a triazole ring group, a thiadiazole ring group, and a thiazole ring group is preferable.

In a case where the aromatic ring group is an aromatic heterocyclic group having a benzene ring moiety, the group represented by —(O—Y$_2$)m is preferably bonded to a benzene ring moiety included in the aromatic heterocyclic group.

Among those, Ar$_6$ is preferably an aromatic hydrocarbon ring group having 6 to 18 carbon atoms, and more preferably a benzene ring group having no substituent other than the group represented by —(O—Y$_2$)m.

It is preferable that the substituent contained in Ar$_6$ and R$_{62}$ are bonded to each other to form a single bond or an alkylene group (preferably having 1 to 8 carbon atoms).

Y$_2$ represents a hydrogen atom or an acid-eliminable group. In a case where m is 2 or more, Y$_2$'s which are present in a plural number may be the same as or different from each other.

Examples of the acid-eliminable group include groups represented by Formulae (Y1) to (Y4).

It should be noted that at least one of Y$_2$'s represents an acid-eliminable group.

m represents an integer of 1 to 4.

m is preferably 1 or 2, and more preferably 1.

Examples of the substituent which can may be contained in the above-mentioned alkyl group, cycloalkyl group, alkoxycarbonyl group, alkylene group, aromatic ring group, and aromatic hydrocarbon group include the above-mentioned substituents T. Further, the number of carbon atoms described in the above-mentioned alkyl group, cycloalkyl group, alkoxycarbonyl group, alkylene group, aromatic ring group, and aromatic hydrocarbon group does not include the number of carbon atoms contained in the substituent.

General Formula (AIII)

The repeating unit represented by General Formula (AII) is preferably a repeating unit represented by General Formula (AIII).

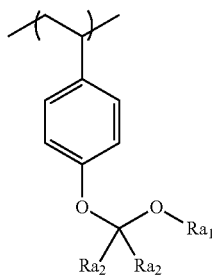

(AIII)

In General Formula (AIII), Ra$_1$ represents an alkyl group or a cycloalkyl group.

Ra$_2$'s each independently represent a hydrogen atom, an alkyl group, or a cycloalkyl group.

The alkyl group represented by each of Ra$_1$ and Ra$_2$ may be linear or branched, and may also have a cyclic structure. The cyclic structure may be a monocycle or a polycycle.

As the alkyl group represented by each of Ra$_1$ and Ra$_2$, an alkyl group having 1 to 4 carbon atoms, such as a methyl group, an ethyl group, an n-propyl group, an isopropyl group, an n-butyl group, an isobutyl group, or a t-butyl group, is preferable.

As the cycloalkyl group represented by each of Ra$_1$ and Ra$_1$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable. The number of carbon atoms is preferably 5 to 15.

The alkyl group of Ra$_1$ preferably has 1 to 15 carbon atoms, and more preferably 1 to 10 carbon atoms.

One of the two Ra$_2$'s present is preferably a hydrogen atom. The alkyl group of Ra$_2$ preferably has 1 to 10 carbon atoms, more preferably has 1 to 6 carbon atoms, and still more preferably has 1 to 4 carbon atoms.

Specific examples of the repeating unit having an acid-decomposable group are shown below, but the present invention is not limited to these specific examples.

In the specific examples, Rx represents a hydrogen atom, a fluorine atom, an iodine atom, CH$_3$, CF$_3$, or CH$_2$OH. Rxa and Rxb each independently represent an alkyl group having 1 to 4 carbon atoms or a phenyl group. Z represents a substituent having a polar group, and in a case where Z's are present in a plural number, Z's may be the same as or different from each other. p represents 0 or a positive integer. Examples of the substituent having a polar group represented by Z include a linear or branched alkyl group or alicyclic group, which has a hydroxyl group, a cyano group, an amino group, an alkylamido group, or a sulfonamido group, and an alkyl group having a hydroxyl group is preferable. As the branched alkyl group, an isopropyl group is preferable.

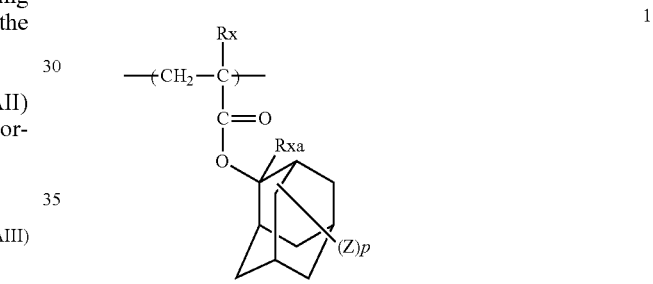

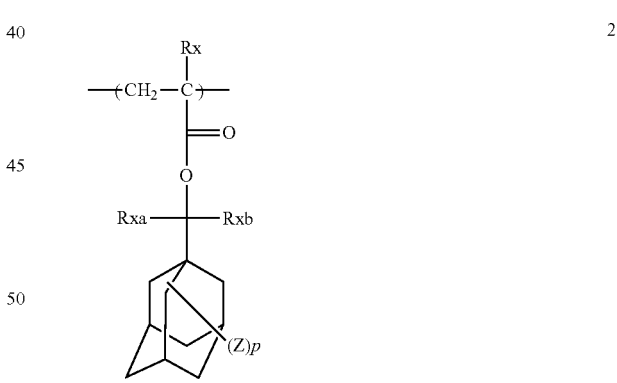

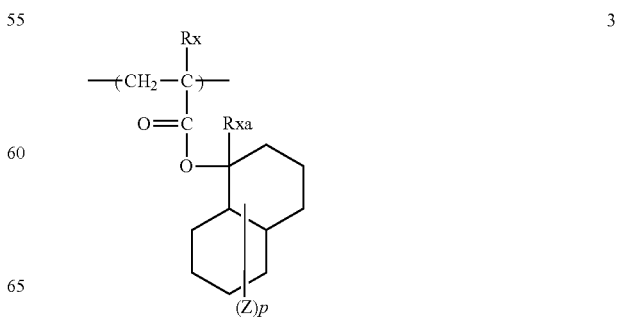

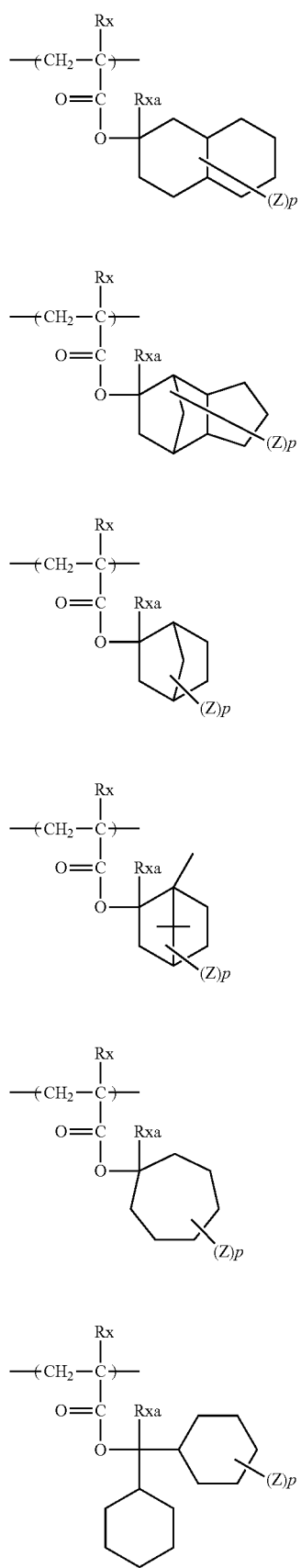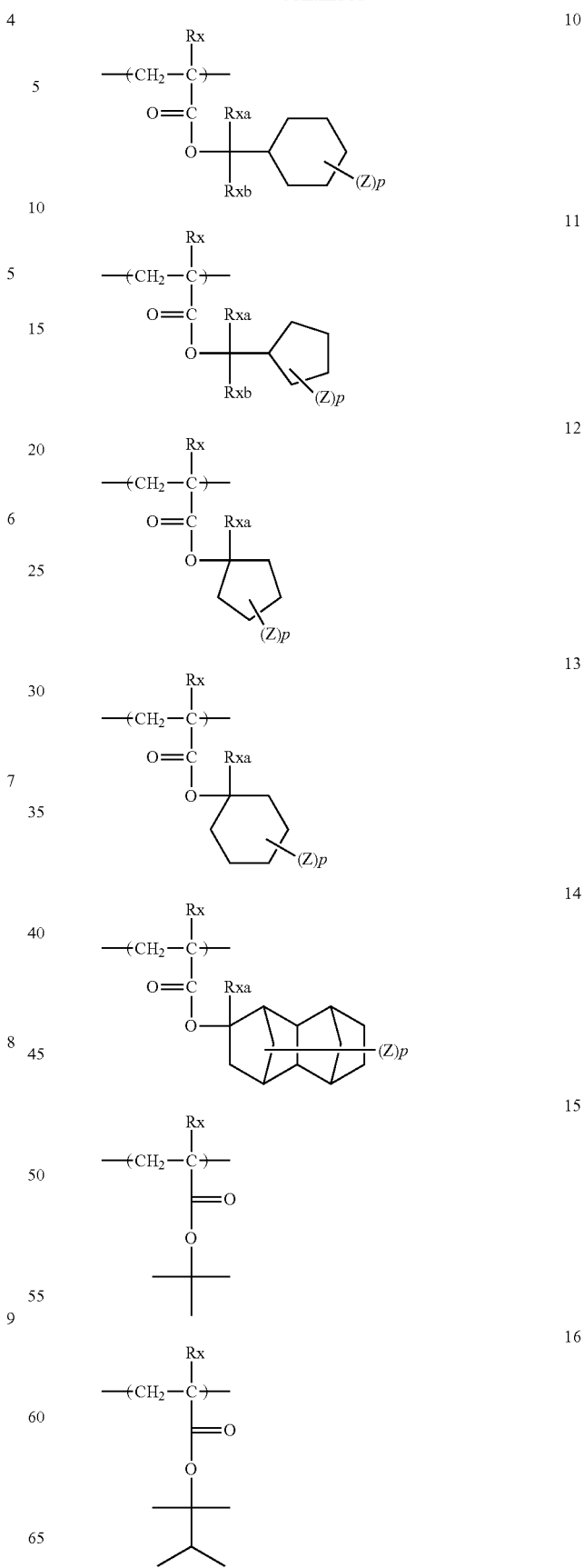

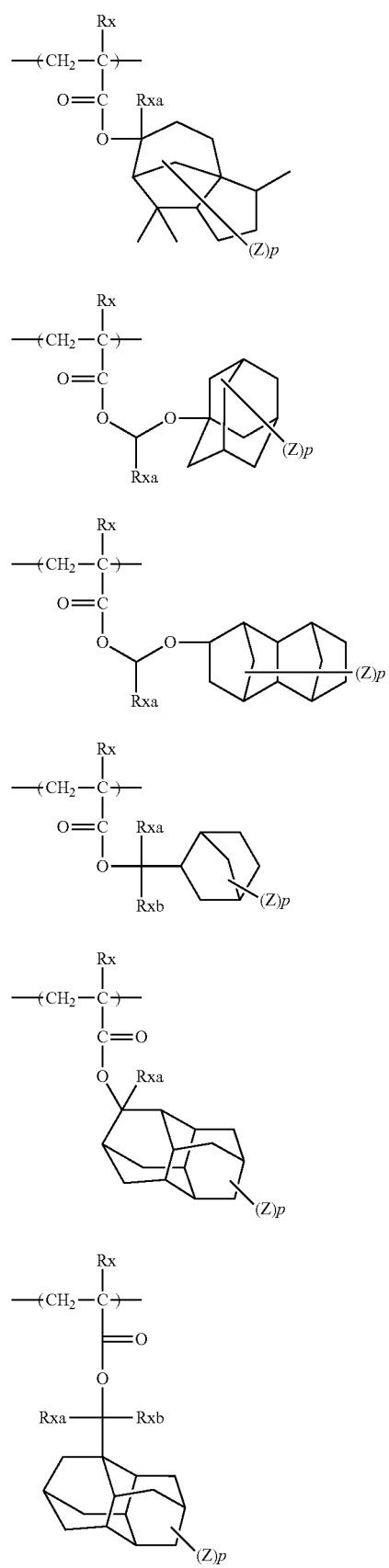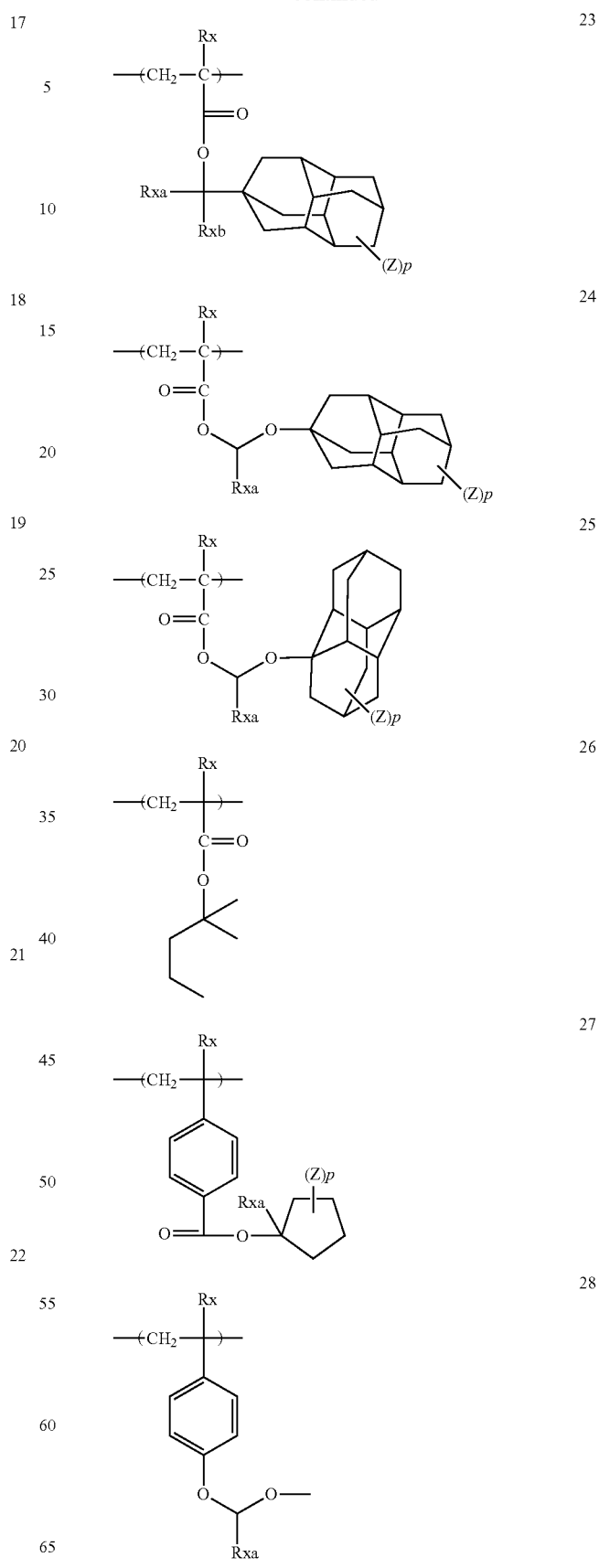

The repeating unit having an acid-decomposable group may be used singly or in combination of two or more kinds thereof.

In a case where the resin (X) has a repeating unit having an acid-decomposable group, the content of the repeating unit having an acid-decomposable group is preferably 5% to 80% by mass, more preferably 5% to 70% by mass, and still more preferably 10% to 60% by mass, with respect to all the repeating units in the resin (X).

(Repeating Unit Having Lactone Structure)

The resin (X) may have a repeating unit having a lactone structure as a repeating unit which is different from the above-mentioned repeating unit.

Examples of the repeating unit having a lactone structure include a repeating unit represented by General Formula (AII).

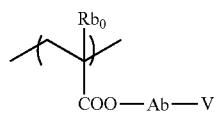

(AII)

In General Formula (AII), $Rb_0$ represents a hydrogen atom, a halogen atom, or an alkyl group having 1 to 4 carbon atoms.

The alkyl group of $Rb_0$ may have a substituent, and examples of the substituent include a hydroxyl group and a halogen atom (a fluorine atom, a chlorine atom, a bromine atom, and an iodine atom). Among these, $Rb_0$ is preferably a hydrogen atom or a methyl group.

In General Formula (AII), Ab represents a single bond, an alkylene group, a divalent linking group having a monocyclic or polycyclic alicyclic hydrocarbon structure, an ether group, an ester group, a carbonyl group, a carboxyl group, or a divalent group formed by combination thereof. Among these, the single bond or a linking group represented by $-Ab_1-COO-$ is preferable. $Ab_1$ is a linear or branched alkylene group, or a monocyclic or polycyclic cycloalkylene group, and is preferably a methylene group, an ethylene group, a cyclohexylene group, an adamantylene group, or a norbornylene group.

In General Formula (AII), V represents a group having a lactone structure.

The group having a lactone structure is not particularly limited as long as it has a lactone structure.

As the lactone structure, a 5- to 7-membered ring lactone structure is preferable, and a 5- to 7-membered ring lactone structure to which another ring structure is fused so as to form a bicyclo structure or Spiro ring structure is more preferable.

As the lactone structure, lactone structures represented by General Formulae (LC1-1) to (LC1-17) are preferable, and among these, the group represented by General Formula (LC1-1), General Formula (LC1-4), General Formula (LC1-5), General Formula (LC1-6), General Formula (LC1-13), or General Formula (LC1-14) is more preferable. A lactone structure is derived into a group having the lactone structure obtained by any one of hydrogen atoms therefrom.

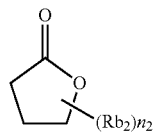

LC1-1

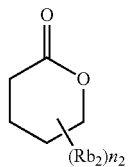

LC1-2

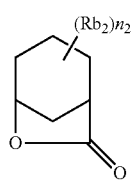

LC1-3

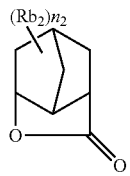

LC1-4

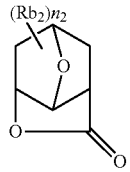

LC1-5

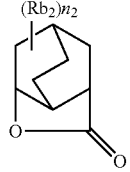

LC1-6

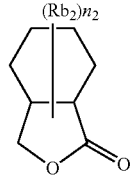

LC1-7

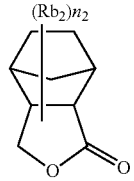

LC1-8

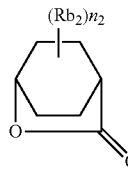

LC1-9

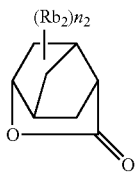

LC1-10

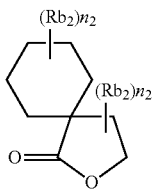

LC1-11

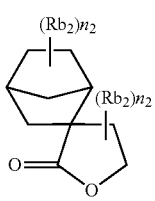

LC1-12

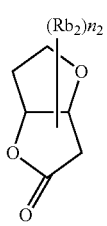

LC1-13

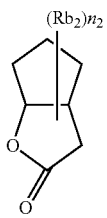

LC1-14

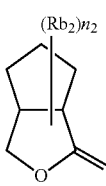

LC1-15

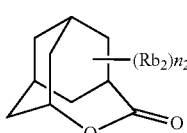

LC1-16

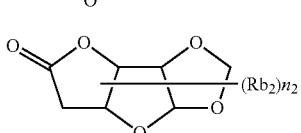
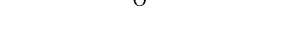

LC1-17

The lactone structure moiety may have a substituent ($Rb_2$). Examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, and a cyano group, an alkyl group having 1 to 4 carbon atoms or the cyano group is preferable, and the cyano group is more preferable. $n_2$ represents an integer of 0 to 4. In a case where $n_2$ is 2 or more, the substituents ($Rb_2$) which are present in a plural number may be the same as or different from each other. Further, the substituents ($Rb_2$) which are present in a plural number may be bonded to each other to form a ring.

Optical isomers of the repeating unit having a lactone structure are typically present, but any of the optical isomers may be used. In addition, one kind of optical isomers may be used singly or a mixture of a plurality of the optical isomers may be used. In a case where one kind of optical isomers is mainly used, an optical purity (ee) thereof is preferably 90 or more, and more preferably 95 or more.

Specific examples of the repeating unit having a lactone structure are shown below, but the present invention is not limited to these specific examples. Further, the following specific examples may further have a substituent (examples thereof include the above-mentioned substituent ($Rb_2$)).

(In the Formulae, Rx Represents H, $CH_3$, $CH_2OH$, or $CF_3$)

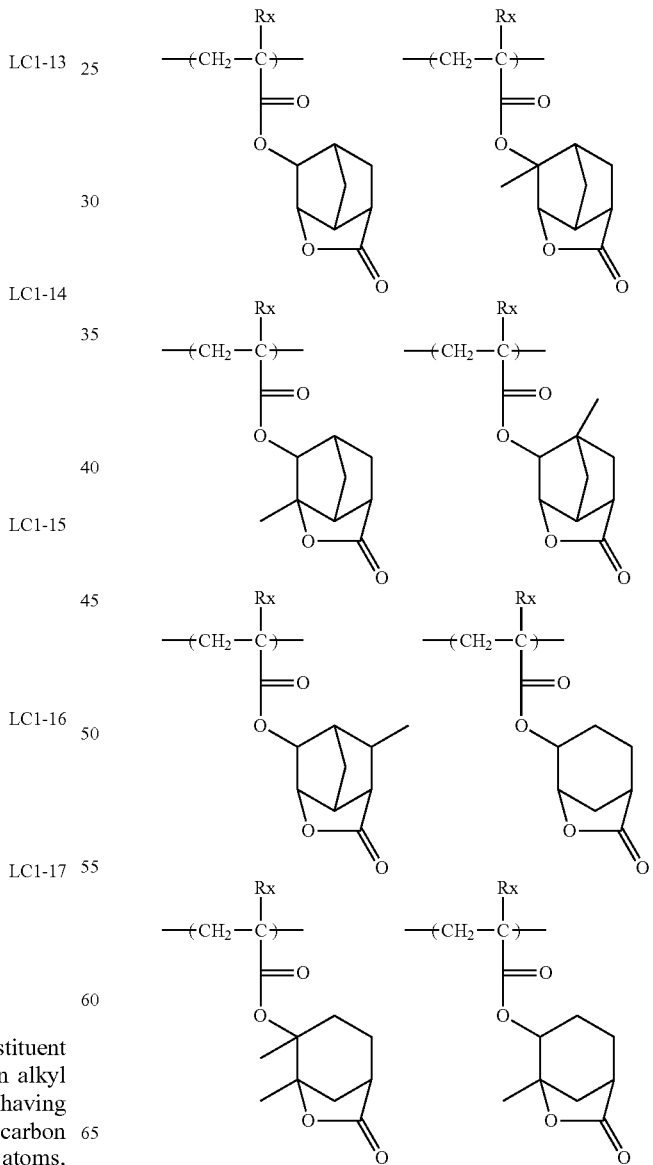

31
-continued
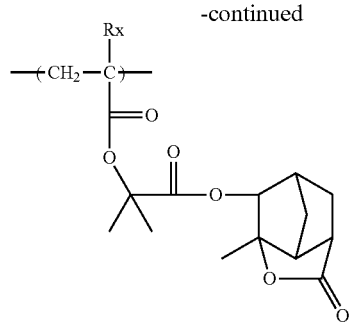
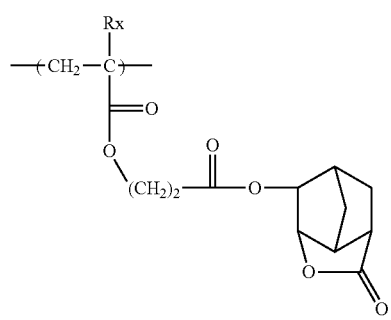
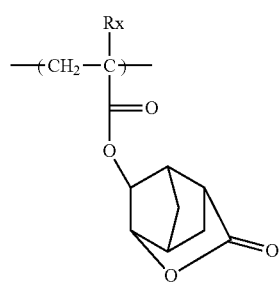
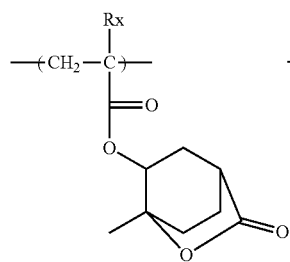
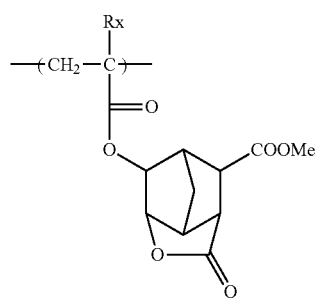
32
-continued
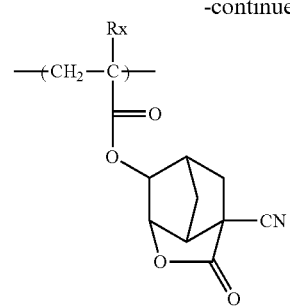
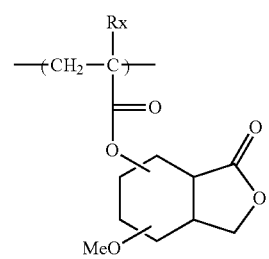
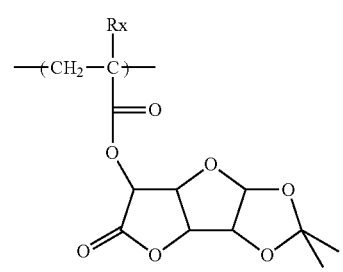
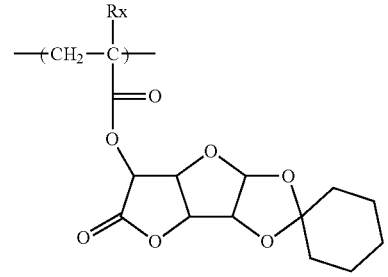
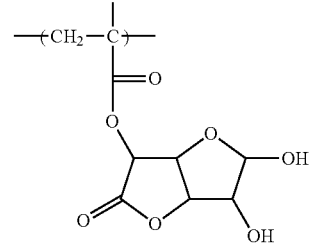
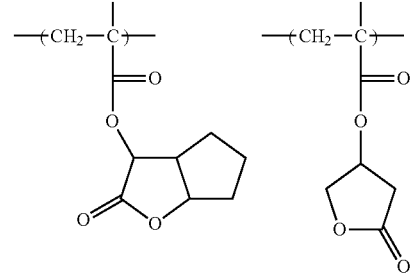

-continued

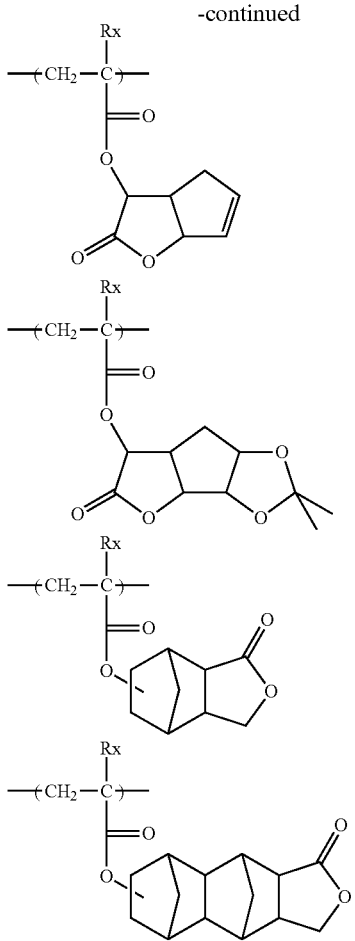

The repeating unit having a lactone structure may be used singly or in combination of two or more kinds thereof.

In a case where the resin (X) has a repeating unit having a lactone structure, the content of the repeating unit having a lactone structure is preferably 5% to 60% by mass, more preferably 10% to 60% by mass, and still more preferably 10% to 40% by mass, with respect to all the repeating units in the resin (X).

(Repeating Unit Having Aromatic Hydroxyl Group)

The resin (X) may have a repeating unit having an aromatic hydroxyl group as a repeating unit which is different from the above-mentioned repeating unit.

Examples of the repeating unit having an aromatic hydroxyl group include a repeating unit represented by General Formula (I).

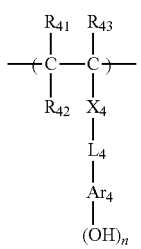

(I)

In Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, and in this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or a divalent linking group.

$Ar_4$ represents an (n+1)-valent aromatic group, and in a case where $Ar_4$ is bonded to Ru to form a ring, it represents an (n+2)-valent aromatic group.

n represents an integer of 1 to 5.

For the purpose of increasing the polarity of the repeating unit represented by General Formula (I), it is preferable that n is an integer of 2 or more, or $X_4$ is —COO— or —CONR$_{64}$—.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent, is preferable, an alkyl group having 8 or less carbon atoms is more preferable, and an alkyl group having 3 or less carbon atoms is still more preferable.

The cycloalkyl group represented by each of $R_{41}$, $R_{42}$, and $R_{43}$ in General Formula (I) may be either a monocycle or a polycycle. A monocyclic cycloalkyl group having 3 to 8 carbon atoms, such as a cyclopropyl group, a cyclopentyl group, and a cyclohexyl group, which may have a substituent, is preferable.

Examples of the halogen atom represented by each of $R_{41}$, $Ra_2$, and $R_{43}$ in General Formula (I) include a fluorine atom, a chlorine atom, a bromine atom, and an iodine atom, and the fluorine atom is preferable.

As the alkyl group included in the alkoxycarbonyl group represented by each of $R_{41}$, $R_{42}$, and $R_{43}$ in General Formula (I), the same group as the alkyl group in each of $R_{41}$, $R_{42}$, and $R_{43}$ are preferable.

Preferred examples of the substituent in each of the groups include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and the substituent preferably has 8 or less carbon atoms.

$Ar_4$ represents an (n+1)-valent aromatic ring group. The divalent aromatic hydrocarbon group in a case where n is 1 may have a substituent, and for example, an aromatic hydrocarbon ring group having 6 to 18 carbon atoms, such as a benzene ring group, a tolylene ring group, a naphthalene ring group, and an anthracene ring group, or an aromatic heterocyclic group including a heterocycle, such as a thiophene ring group, a furan ring group, a pyrrole ring group, a benzothiophene ring group, a benzofuran ring group, a benzopyrrole ring group, a triazine ring group, an imidazole ring group, a benzimidazole ring group, a triazole ring group, a thiadiazole ring group, and a thiazole ring group is preferable.

Specific suitable examples of the (n+1)-valent aromatic ring group in a case where n is an integer of 2 or more include groups formed by excluding any (n−1) hydrogen atoms from the above-described specific examples of the divalent aromatic ring group.

The (n+1)-valent aromatic ring group may further have a substituent.

Examples of the preferred substituent in the (n+1)-valent aromatic ring group include a halogen atom, and a fluorine atom or an iodine atom is preferable.

Preferred examples of the alkyl group of $R_{64}$ in —$CONR_{64}$— ($R_{64}$ represents a hydrogen atom or an alkyl group) represented by $X_4$ include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent, and the alkyl group is more preferably an alkyl group having 8 or less carbon atoms.

As $X_4$, a single bond, —COO—, or —CONH— is preferable, the single bond or —COO— is more preferable, and the single bond is still more preferable.

As the divalent linking group as $L_4$, an alkylene group is preferable, and as the alkylene group, an alkylene group having 1 to 8 carbon atoms, such as a methylene group, an ethylene group, a propylene group, a butylene group, a hexylene group, and an octylene group, each of which may have a substituent, is preferable.

Among those, $L_4$ is preferably a single bond.

As $Ar_4$, an aromatic hydrocarbon group having 6 to 18 carbon atoms, which may have a substituent, is preferable, a benzene ring group, a naphthalene ring group, or a biphenylene ring group is more preferable, and the benzene ring group is still more preferable.

n is preferably 1 or 2.

Among those, the repeating unit represented by General Formula (I) is preferably a repeating unit derived from hydroxystyrene or a hydroxystyrene derivative. That is, $Ar_4$ represents a benzene ring group, and $X_4$ and $L_4$ each preferably represent a single bond.

Specific examples of the repeating unit $Y_3$ are shown below, but the present invention is not limited to these specific examples. In the formulae, a represents 1 or 2.

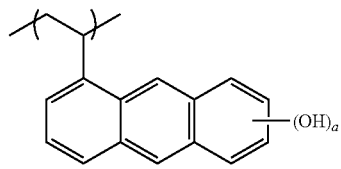
(B-1)

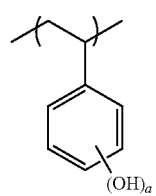
(B-2)

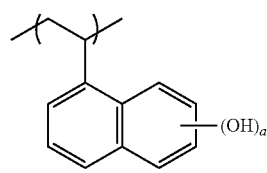
(B-3)

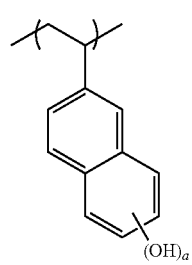

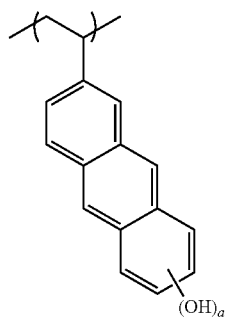
(B-4)

(B-5)

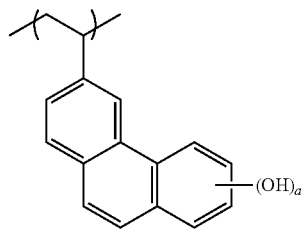
(B-6)

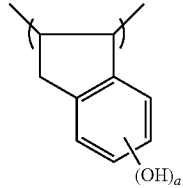
(B-7)

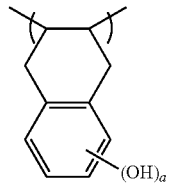
(B-8)

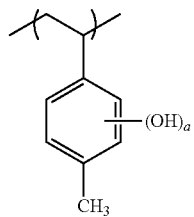
(B-9)

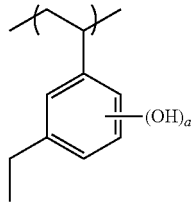
(B-10)

(B-11) 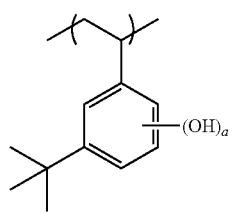
(B-12) 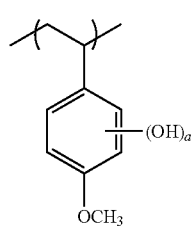
(B-13) 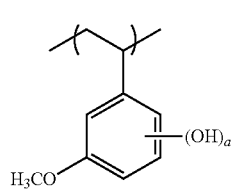
(B-14) 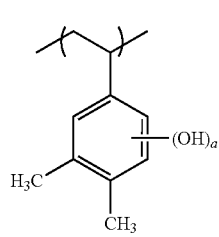
(B-15) 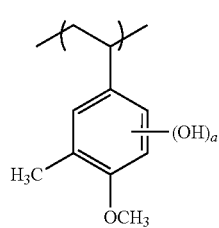
(B-16) 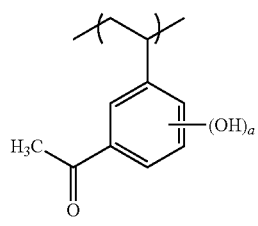
(B-17) 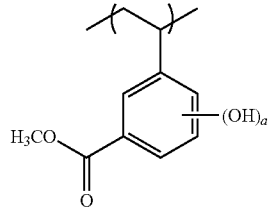
(B-18) 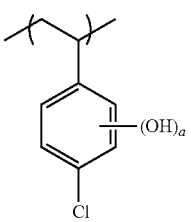
(B-19) 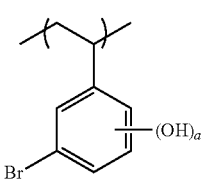
(B-20) 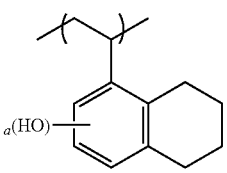
(B-21) 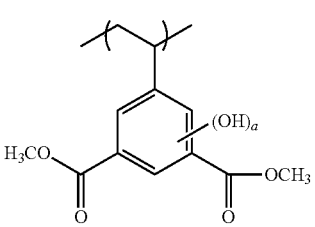
(B-22) 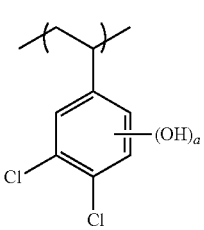
(B-23) 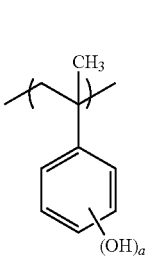
(B-24) 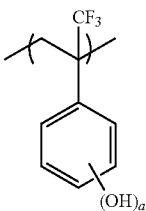

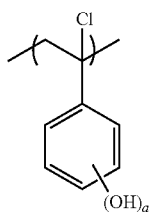
(B-25)

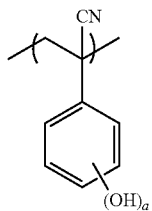
(B-26)

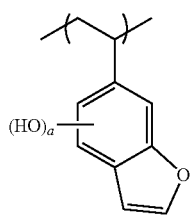
(B-27)

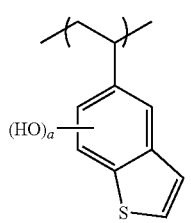
(B-28)

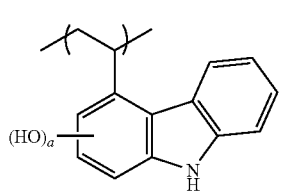
(B-29)

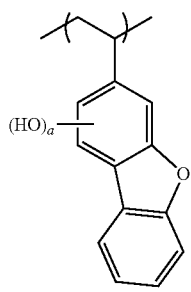
(B-30)

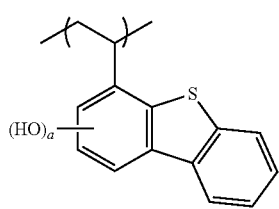
(B-31)

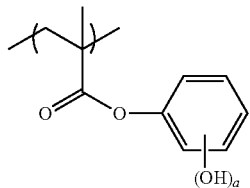
(B-32)

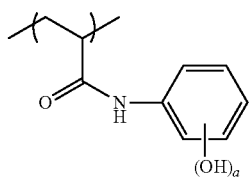
(B-33)

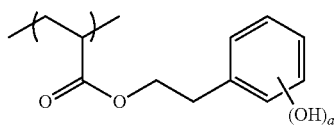
(B-34)

The repeating unit having an aromatic hydroxyl group may be used singly or in combination of two or more kinds thereof.

In a case where the resin (X) has the repeating unit having an aromatic hydroxyl group, the content of the repeating unit having an aromatic hydroxyl group is preferably 5% to 70% by mass, and more preferably 10% to 65% by mass, with respect to all the repeating units in the resin (X).

(Repeating Unit Having Acid Group)

The resin (X) may have a repeating unit having an acid group as a repeating unit which is different from the above-mentioned repeating unit. In addition, the acid group as mentioned herein is intended to be an acid group other than the aromatic hydroxyl group.

Examples of the acid group in the repeating unit having an acid group include a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

As the acid group, the fluorinated alcohol group (preferably hexafluoroisopropanol group), the sulfonimido group, or the bis(alkylcarbonyl)methylene group is preferable.

The skeleton of the repeating unit having an acid group is not particularly limited, but is preferably a (meth)acrylate-based repeating unit or a styrene-based repeating unit.

Specific examples of the repeating unit having an acid group are shown below, but the present invention is not limited to these specific examples. In the formulae, Rx represents a hydrogen atom, $CH_3$, $CF_3$, or $CH_2OH$.

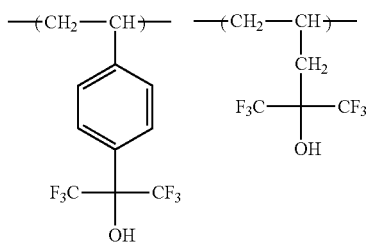

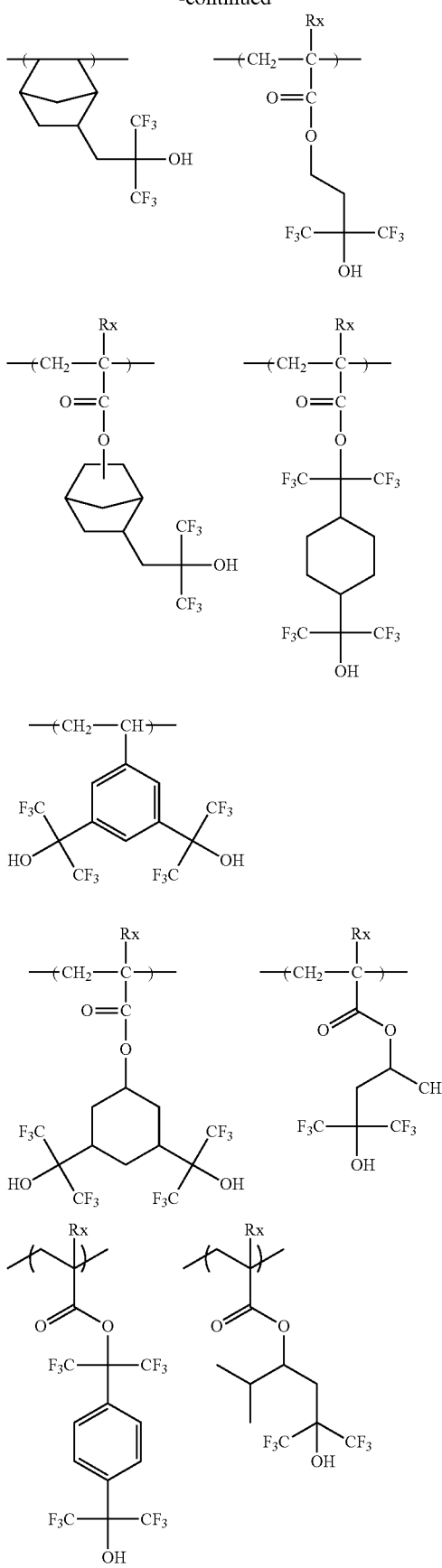
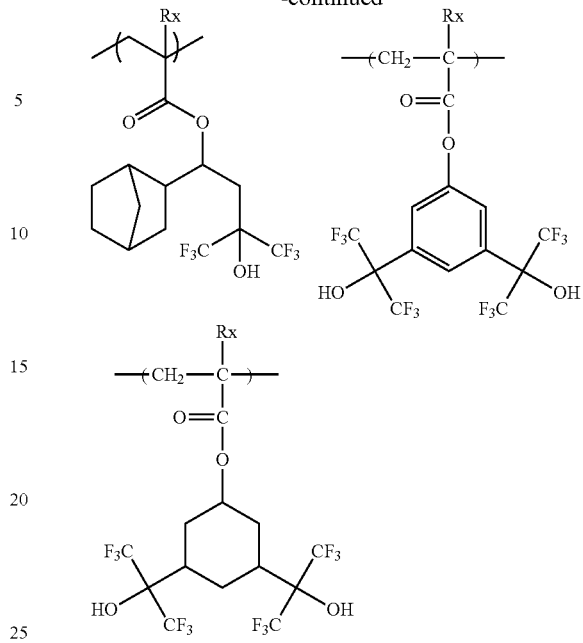
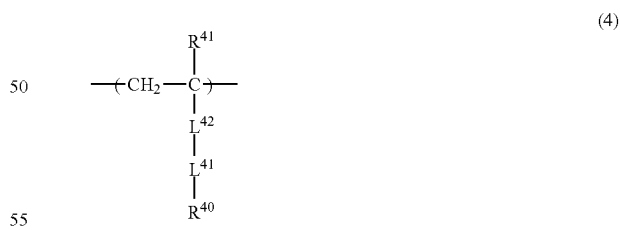

In a case where the resin (X) has the repeating unit having an acid group, the content of the repeating unit having an acid group is preferably 5% to 60% by mass, and more preferably 10% to 60% by mass, with respect to all the repeating units in the resin (A).

(Repeating Unit Having Photoacid Generating Group)

The resin (X) may have, as a repeating unit other than the above, a repeating unit having a group that generates an acid upon irradiation with actinic rays or radiation (hereinafter also referred to as a "photoacid generating group").

In this case, it can be considered that the repeating unit having a photoacid generating group corresponds to a compound that generates an acid upon irradiation with actinic rays or radiation which will be described later (also referred to as a "photoacid generator").

Examples of such the repeating unit include a repeating unit represented by General Formula (4).

$$\begin{array}{c} R^{41} \\ -\!\!(CH_2-\!\!\overset{|}{C})\!\!- \\ | \\ L^{42} \\ | \\ L^{41} \\ | \\ R^{40} \end{array} \qquad (4)$$

$R^{41}$ represents a hydrogen atom or a methyl group. $L^{41}$ represents a single bond or a divalent linking group. $L^{42}$ represents a divalent linking group. $R^{40}$ represents a structure moiety that decomposes upon irradiation with actinic rays or radiation to generate an acid in a side chain.

The repeating unit having a photoacid generating group is exemplified below.

In the repeating unit below, the combination of the cationic moiety and the anionic moiety may be appropriately changed and used.

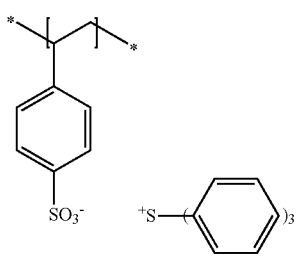
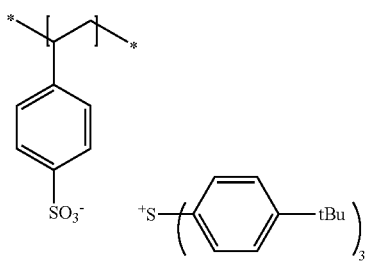
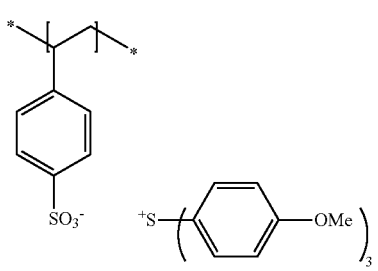
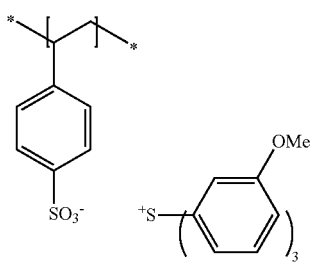
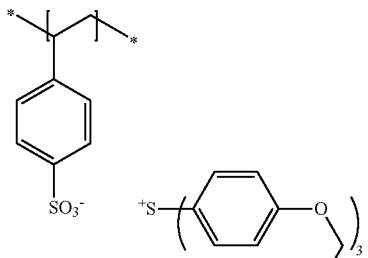
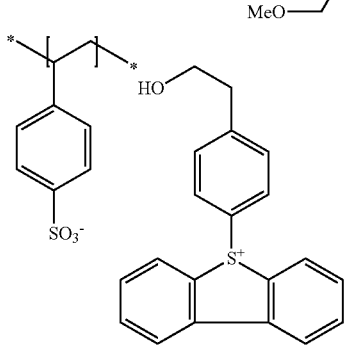
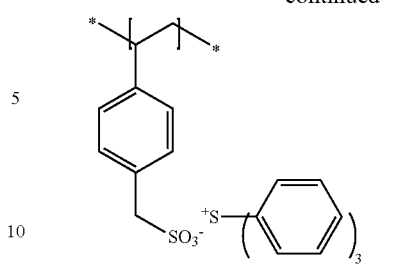
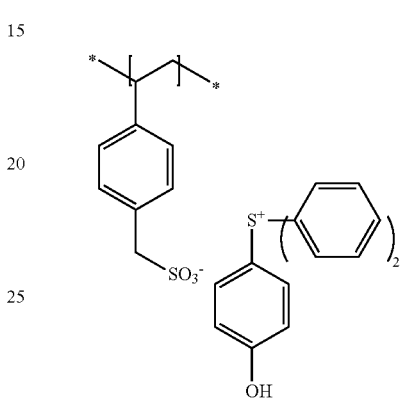
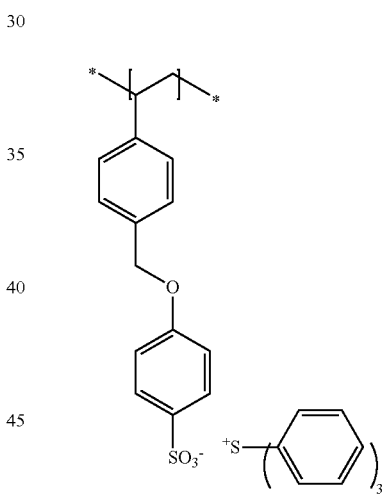
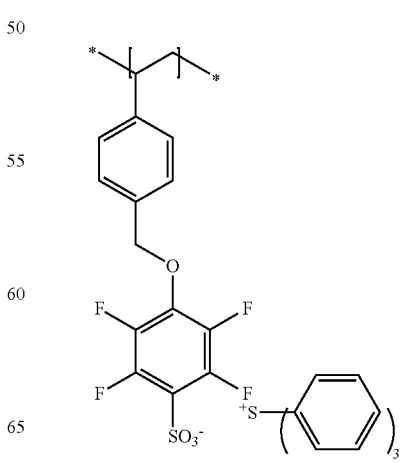

45
-continued
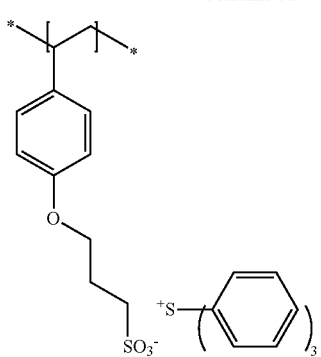
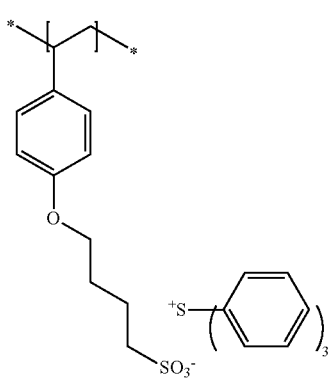
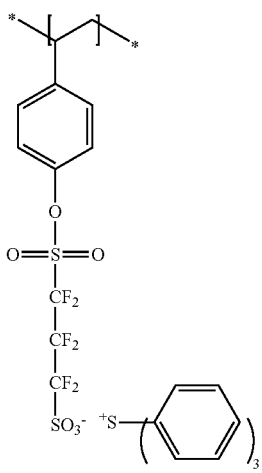
46
-continued
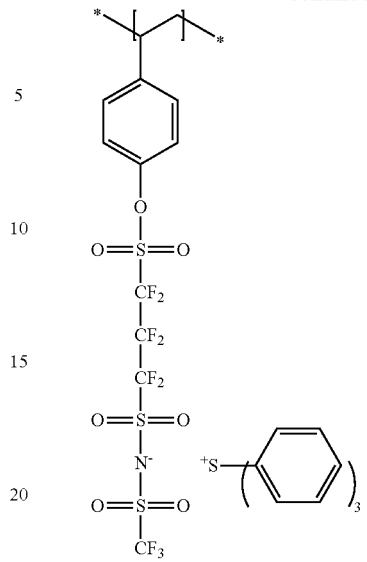
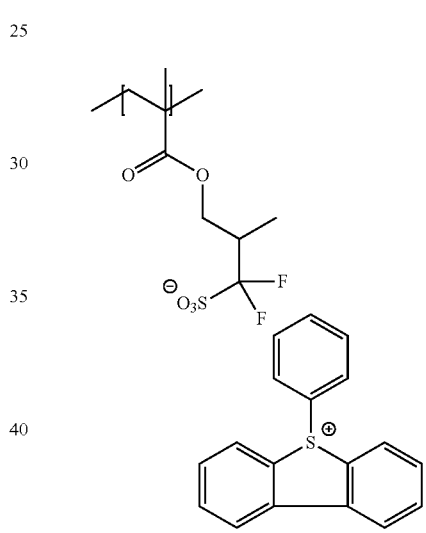
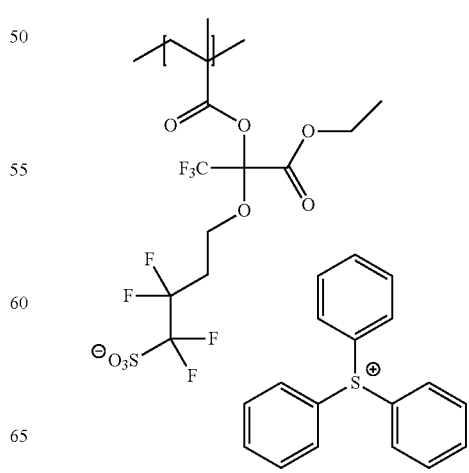

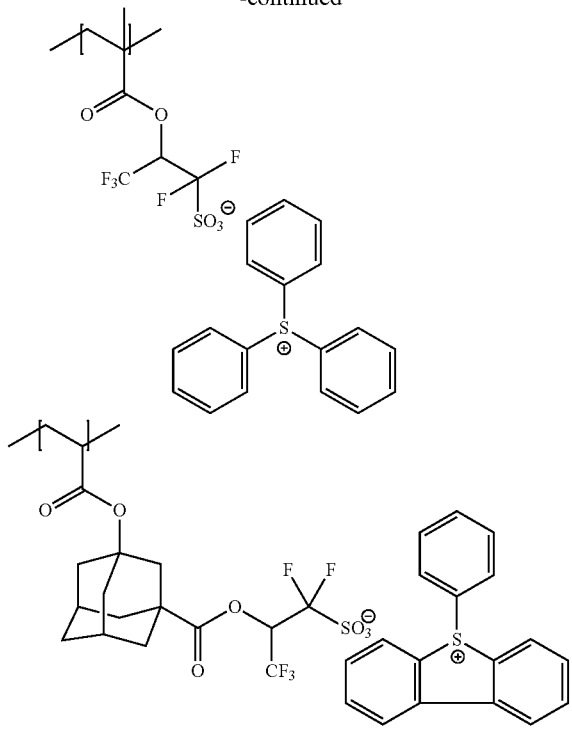

In addition, examples of the repeating unit represented by General Formula (4) include the repeating units described in paragraphs [0094] to [0105] of JP2014-041327A.

The content of the repeating unit having a photoacid generating group is preferably 1% by mass or more, and more preferably 3% by mass or more, with respect to all the repeating units in the resin (X). Further, an upper limit value thereof is preferably 40% by mass or less, more preferably 20% by mass or less, and still more preferably 10% by mass or less.

The resin (X) may have another repeating unit, in addition to the above-mentioned repeating units.

In a case where the composition of the embodiment of the present invention is for ArF exposure, it is preferable that the resin (X) does not substantially have an aromatic group from the viewpoint of transparency of ArF light. More specifically, the repeating unit having an aromatic group is preferably 5% by mole or less, more preferably 3% by mole or less, and ideally 0% by mole, with respect to all the repeating units in the resin (X), that is, it is still more preferable that the repeating unit having an aromatic group is not included. In addition, the resin (X) preferably has a monocyclic or polycyclic alicyclic hydrocarbon structure.

The resin (X) can be synthesized in accordance with an ordinary method (for example, radical polymerization).

The resin (X) preferably has a fluorine atom. In a case where the resin (X) has a fluorine atom, the content of the fluorine atom is preferably 10% to 50% by mass, more preferably 15% to 40% by mass, and still more preferably 20% to 35% by mass, with respect to the total mass of the resin (X).

The weight-average molecular weight of the resin (X) is preferably 3,500 to 30,000, more preferably 3,500 to 25,000, and still more preferably 4,000 to 10,000. The dispersity (Mw/Mn) is usually 1.0 to 3.0, preferably 1.0 to 2.6, more preferably 1.0 to 2.0, and still more preferably 1.1 to 2.0.

The Tg of the resin (X) is preferably 90° C. or higher, more preferably 120° C. or higher, and still more preferably 130° C. or higher. The upper limit is preferably 200° C. or lower, more preferably 190° C. or lower, and still more preferably 180° C. or lower.

Moreover, in the present specification, the glass transition temperature (Tg) of a polymer such as the resin (A) is usually measured using a differential scanning calorimeter (DSC).

It should be noted that for a polymer whose Tg cannot be measured using a differential scanning calorimeter (DSC), the calculation is performed by the following method. First, the Tg of a homopolymer consisting only of each repeating unit included in the polymer is calculated by a Bicerano method. Hereinafter, the calculated Tg is referred to as "the Tg of a repeating unit". Next, the mass ratio (%) of each repeating unit to all the repeating units in the polymer is calculated. Next, the product of the Tg of each repeating unit and the mass ratio of the repeating unit is calculated, and the products are summed to obtain the Tg (° C.) of the polymer.

The Bicerano method is described in Prediction of polymer properties, Marcel Dekker Inc., New York (1993) and the like. The calculation of a Tg by the Bicerano method can be carried out using MDL Polymer (MDL Information Systems, Inc.), which is software for estimating physical properties of a polymer.

The resin (X) may be used singly or in combination of two or more kinds thereof.

The content of the resin (X) in the composition of the embodiment of the present invention (in a case where the resins (X) are present in a plural number, a total content thereof) is generally 20.0% by mass or more in many cases, and is preferably 40.0% by mass or more, more preferably 50.0% by mass or more, and still more preferably 60.0% by mass or more, with respect to the total solid content of the composition. An upper limit thereof is not particularly limited, but is preferably 99.9% by mass or less, more preferably 99.5% by mass or less, and still more preferably 99.0% by mass or less.

<Compound that Generates Acid Upon Irradiation with Actinic Rays or Radiation>

The composition of the embodiment of the present invention includes a compound that generates an acid upon irradiation with actinic rays or radiation (hereinafter also referred to as a "photoacid generator").

In a case where the resin (X) includes a repeating unit having a photoacid generating group, the photoacid generator is preferably present separately from the resin (X).

The photoacid generator may be in a form of a low-molecular-weight compound or a form incorporated into a part of a polymer. Further, a combination of the form of a low-molecular-weight compound and the form incorporated into a part of a polymer may also be used.

In a case where the photoacid generator is in the form of a low-molecular-weight compound, the molecular weight is preferably 3,000 or less, more preferably 2,000 or less, and still more preferably 1,000 or less.

In a case where the photoacid generator is incorporated into a part of a polymer, it may be incorporated into a part of the resin (X) or in a resin different from the resin (X).

Among those, the photoacid generator is preferably in the form of a low-molecular-weight compound.

The photoacid generator is not particularly limited, but is preferably a compound that generates an organic acid upon irradiation with actinic rays or radiation (preferably electron beams or extreme ultraviolet rays).

As the organic acid, for example, at least any one of sulfonic acid, bis(alkylsulfonyl)imide, or tris(alkylsulfonyl)methide is preferable.

The pKa generated from the photoacid generator is preferably −16.0 to 2.0, more preferably −15.0 to 1.0, and still more preferably −14.0 to 0.5 from the viewpoint of more excellent LER performance.

The pKa refers to an acid dissociation constant pKa in an aqueous solution, and is defined, for example, in Chemical Handbook (II) (Revised 4th Edition, 1993, compiled by the Chemical Society of Japan, Maruzen Company, Ltd.). A lower value of the acid dissociation constant pka indicates higher acid strength. Specifically, the acid dissociation constant pKa in an aqueous solution can be actually measured by using an infinite-dilution aqueous solution and measuring the acid dissociation constant at 25° C. Alternatively, the acid dissociation constant pKa can also be determined using the following software package 1 by computation from a value based on a Hammett substituent constant and the database of publicly known literature values. All of the values of pKa described in the present specification indicate values determined by computation using the software package.

Software package 1: ACD/pka DB version 8.0

The photoacid generator is preferably a compound represented by General Formula (ZI), General Formula (ZII), or General Formula (ZIII).

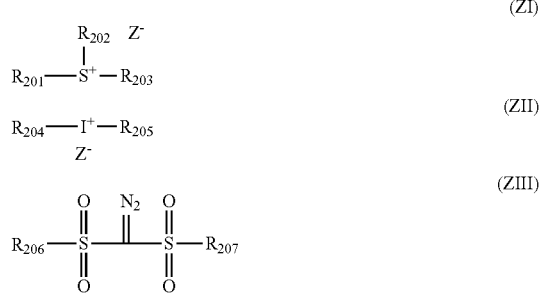

In General Formula (ZI), $R_{201}$, $R_{202}$, and $R_{203}$ each independently represent an organic group.

The organic group as each of $R_{201}$, $R_{202}$, and $R_{203}$ generally has 1 to 30 carbon atoms, and preferably has 1 to 20 carbon atoms.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group).

$Z^-$ represents a non-nucleophilic anion (anion having an extremely low ability to cause a nucleophilic reaction).

Examples of the organic group of each of $R_{201}$, $R_{202}$, and $R_{203}$ include an aryl group, an alkyl group, and a cycloalkyl group.

It is preferable that at least one of $R_{201}$, $R_{202}$, or $R_{203}$ is an aryl group, and it is more preferable that all of $R_{201}$, $R_{202}$, and $R_{203}$ represent an aryl group. As the aryl group, not only a phenyl group, a naphthyl group, or the like but also a heteroaryl group such as an indole residue and a pyrrole residue is also available.

As the alkyl group of each of $R_{201}$ to $R_{203}$, a linear or branched alkyl group having 1 to 10 carbon atoms is preferable, and a methyl group, an ethyl group, an n-propyl group, an i-propyl group, or an n-butyl group is more preferable.

As the cycloalkyl group of each of $R_{201}$ to $R_{203}$, a cycloalkyl group having 3 to 10 carbon atoms is preferable, and a cyclopropyl group, a cyclobutyl group, a cyclopentyl group, a cyclohexyl group, or a cycloheptyl group is more preferable.

Examples of the substituent which may be contained in these groups include a nitro group, a halogen atom such as a fluorine atom or a chlorine atom, a carboxyl group, a hydroxyl group, an amino group, a cyano group, an alkoxy group (preferably having 1 to 15 carbon atoms), an alkyl group (preferably having 1 to 15 carbon atoms), a fluoroalkyl group substituted with a fluorine atom (preferably having 1 to 15 carbon atoms, with a perfluoroalkyl group being preferable), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms)).

Examples of the non-nucleophilic anion include a sulfonate anion (an aliphatic sulfonate anion, an aromatic sulfonate anion, a camphor sulfonate anion, and the like), a carboxylate anion (an aliphatic carboxylate anion, an aromatic carboxylate anion, an aralkyl carboxylate anion, and the like), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be an alkyl group or a cycloalkyl group, and has a linear or branched alkyl group having 1 to 30 carbon atoms, or is preferably a cycloalkyl group having 3 to 30 carbon atoms.

The aryl group in the aromatic sulfonate anion and the aromatic carboxylate anion is preferably an aryl group having 6 to 14 carbon atoms, and examples thereof include a phenyl group, a tolyl group, and a naphthyl group.

The alkyl group, the cycloalkyl group, and the aryl group exemplified above may have a substituent. The substituent is not particularly limited, but specific examples of the substituent include a nitro group, a halogen atom such as fluorine atom or a chlorine atom, a carboxyl group, a hydroxyl group, an amino group, a cyano group, an alkoxy group (preferably having 1 to 15 carbon atoms), an alkyl group (preferably having 1 to 10 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), and an aryloxysulfonyl group (preferably having 6 to 20 carbon atoms).

The aralkyl group in the aralkylcarboxylate anion is preferably an aralkyl group having 7 to 14 carbon atoms, and examples thereof include a benzyl group, a phenethyl group, a naphthylmethyl group, a naphthylethyl group, and a naphthylbutyl group.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms. Examples of the substituent of such an alkyl group include a halogen atom, an alkyl group substituted with the halogen atom, an alkoxy group, an alkylthio group, an alkyloxysulfonyl group, an aryloxysulfonyl group, and a cycloalkylaryloxysulfonyl group, and a fluorine atom or an alkyl group substituted with the fluorine atom is preferable.

Furthermore, the alkyl group in the bis(alkylsulfonyl) imide anion may be bonded to each other to form a ring structure. As a result, the acid strength increases.

Examples of the other non-nucleophilic anions include fluorinated phosphorus (for example, $PF_6^-$), fluorinated boron (for example, $BF_4^-$), and fluorinated antimony (for example, $SbF_6^-$).

As the non-nucleophilic anion, an aliphatic sulfonate anion in which at least α-position of sulfonic acid is substituted with a fluorine atom, an aromatic sulfonate anion substituted with a fluorine atom or a group having a fluorine atom, a bis(alkylsulfonyl)imide anion in which an alkyl group is substituted with a fluorine atom, or a tris(alkylsulfonyl)methide anion in which an alkyl group is substituted with a fluorine atom is preferable. Among those, a perfluoroaliphatic sulfonate anion (preferably having 4 to 8 carbon atoms) or a benzene sulfonate anion having a fluorine atom is more preferable, and a nonafluorobutane sulfonate anion, a perfluorooctane sulfonate anion, a pentafluorobenzene sulfonate anion, or a 3,5-bis(trifluoromethyl) benzenesulfonate anion is more preferable.

Furthermore, as the non-nucleophilic anion, an anion represented by General Formula (AN1) is also preferable.

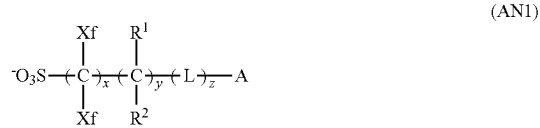

(AN1)

In the formula,

Xf's each independently represent a fluorine atom or an alkyl group substituted with at least one fluorine atom.

$R^1$ and $R^2$ each independently represent a hydrogen atom, a fluorine atom, or an alkyl group, and in a case where les and $R^2$'s are each present in a plural number, $R^1$'s and $R^2$'s may each be the same as or different from each other.

L represents a divalent linking group, and in a case where L's are present in a plural number, L's may be the same as or different from each other.

A represents a cyclic organic group.

x represents an integer of 1 to 20, y represents an integer of 0 to 10, and z represents an integer of 0 to 10.

General Formula (AN1) will be described in more detail.

The alkyl group in the alkyl group substituted with a fluorine atom for Xf preferably has 1 to 10 carbon atoms, and more preferably has 1 to 4 carbon atoms. In addition, a perfluoroalkyl group is preferable as the alkyl group substituted with at least one fluorine atom.

As Xf, a fluorine atom or a perfluoroalkyl group having 1 to 4 carbon atoms is preferable. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, the fluorine atom or $CF_3$ is preferable. In particular, it is preferable that both Xf's are fluorine atoms.

The alkyl group of each of $R^1$ and $R^2$ may have a substituent (preferably a fluorine atom), and the substituent preferably has 1 to 4 carbon atoms. As the substituent, a perfluoroalkyl group having 1 to 4 carbon atoms is preferable. Specific examples of the alkyl group having a substituent of each of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

As each of IV and $R^2$, the fluorine atom or $CF_3$ is preferable.

x is preferably 1 to 10, and more preferably 1 to 5.
y is preferably 0 to 4, and more preferably 0.
z is preferably 0 to 5, and more preferably 0 to 3.

The divalent linking group of L is not particularly limited, and examples thereof include —COO—, —OCO—, —CO—, —O—, —S—, —SO—, —SO$_2$—, an alkylene group, a cycloalkylene group, an alkenylene group, and a linking group in which a plurality of these groups are linked, and a linking group having a total number of carbon atoms of 12 or less is preferable. Among these, —COO—, —OCO—, —CO—, —O—, —SO$_2$—, the alkylene group, or the linking group in which a plurality of these are linked is preferable.

The cyclic organic group of A is not particularly limited as long as it is a group having a cyclic structure, and examples thereof include an alicyclic group, an aromatic ring group, and a heterocyclic group (also including a group having aromaticity as well as a group not having aromaticity).

The alicyclic group may be either a monocycle or a polycycle, a monocyclic cycloalkyl group such as a cyclopentyl group, a cyclohexyl group, and a cyclooctyl group is preferable, and in addition, a polycyclic cycloalkyl group such as a norbornyl group, a tricyclodecanyl group, a tetracyclodecanyl group, a tetracyclododecanyl group, and an adamantyl group is preferable. Among those, an alicyclic group having a bulky structure having 7 or more carbon atoms, such as a norbornyl group, a tricyclodecanyl group, a tetracyclodecanyl group, a tetracyclododecanyl group, and an adamantyl group, can be used in the post-exposure baking step is preferable from the viewpoint that it can suppress the in-plane diffusivity and improve a mask error enhancement factor (MEEF).

Examples of the aromatic ring group include a benzene ring, a naphthalene ring, a phenanthrene ring, and an anthracene ring.

Examples of the heterocyclic group include groups derived from a piperazine ring, a dioxothiomorpholine ring, a furan ring, a thiophene ring, a benzofuran ring, a benzothiophene ring, a dibenzofuran ring, a dibenzothiophene ring, and a pyridine ring. Among these, the group derived from a piperazine ring, a dioxothiomorpholine ring, a furan ring, a thiophene ring, or a pyridine ring is preferable.

Moreover, examples of the cyclic organic group also include a lactone structure, and specifically include lactone structures represented by General Formulae (LC1-1) to (LC1-17).

The cyclic organic group may be a cyclopenta[a]phenanthrene ring group or a group having a structure in which a part or all of the cyclopenta[a]phenanthrene ring is hydrogenated.

The cyclic organic group may have a substituent. Examples of the substituent include an alkyl group (which may be linear, branched, or cyclic, and preferably has 1 to 12 carbon atoms) or a cycloalkyl group (which may be a monocycle or a polycycle, may be a Spiro ring in a case of the polycycle, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic ester group. Incidentally, the carbon constituting the cyclic organic group (carbon contributing to ring formation) may be carbonyl carbon.

Furthermore, as the non-nucleophilic anion, an anion represented by General Formula (BS) is also preferable.

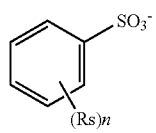

(BS)

n represents an integer of 0 to 5.

Rs's each independently represent a substituent.

The type of the substituent is not particularly limited, and examples of the substituent include a nitro group, a halogen atom such as a fluorine atom, a carboxyl group, a hydroxyl group, an amino group, a cyano group, and an alkoxy group (preferably having 1 to 15 carbon atoms, in which the alkyl group moiety may be linear or branched, or may have a cyclic structure), an alkyl group (preferably having 1 to 10 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an aryloxy group (preferably having 6 to 20 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), and a combination thereof.

Among those, as the substituent, the fluorine atom, the hydroxyl group, the alkoxy group (more preferably the alkoxy group in which the alkyl group moiety is a cycloalkyl group, and still more preferably the alkoxy group in which the alkyl group moiety is a cyclohexyl group), the alkyl group (more preferably an isopropyl group), the cycloalkyl group (more preferably a cyclohexyl group), the aryloxy group (more preferably a phenyloxy group having, as a substituent, each independently 1 to 5 groups of an alkyl group having 1 to 3 carbon atoms, a cycloalkyl group having 5 to 8 carbon atoms, or an alkylsulfonyl group, or the alkoxycarbonyl group (more preferably the group in which the alkyl group moiety is a cycloalkyl group, and still more preferably the group in which the alkyl group moiety is a cyclohexyl group) is preferable.

In addition, in a case where n is an integer of 2 or more, the substituents may be bonded to each other to form a ring.

A disulfonamide anion is also preferable as the non-nucleophilic anion.

The disulfonamide anion is, for example, an anion represented by $N^-(SO_2-R^q)_2$. Here, $R^q$ represents an alkyl group which may have a substituent, and is preferably a fluoroalkyl group, and more preferably a perfluoroalkyl group. Two of $R^q$'s may be bonded to each other to form a ring. A group formed by the mutual bonding of two of $R^q$'s is preferably an alkylene group which may have a substituent, more preferably a fluoroalkylene group, and still more preferably a perfluoroalkylene group. The alkylene group preferably has 2 to 4 carbon atoms.

In General Formula (ZII) and General Formula (ZIII), $R_{204}$ to $R_{207}$ each independently represent an aryl group, an alkyl group, or a cycloalkyl group.

As the aryl group, the alkyl group, and the cycloalkyl group of each of $R_{204}$ to $R_{207}$ have the same definitions as the aryl group, the alkyl group, and the cycloalkyl group, respectively, of each of $R_{201}$ to $R_{203}$ in General Formula (ZI) as described above.

The substituent which may be contained in the aryl group, the alkyl group, and the cycloalkyl group of each of $R_{204}$ to $R_{207}$ is the same as the substituent which may be contained in each of the aryl group, the alkyl group, and the cycloalkyl group of each of $R_{201}$ to $R_{203}$ in the above-mentioned General Formula (ZI), and suitable aspects thereof are also the same.

$Z^-$ represents a non-nucleophilic anion, has the same definition as the non-nucleophilic anion of $Z^-$ in General Formula (ZI), and a suitable aspect thereof is also the same.

Furthermore, from the viewpoint of suppressing an acid generated upon exposure from diffusing to an unexposed area and further improving the resolution, the photoacid generator is preferably a compound that generates an acid in size with a volume of 130 Å$^3$ or more, and more preferably a compound that generates an acid in size with a volume of 150 Å$^3$ or more, upon irradiation with electron beams or extreme ultraviolet rays. Further, it should be noted that from the viewpoint of the sensitivity or the solubility in the coating solvent, the volume is preferably 2,000 Å$^3$ or less, and more preferably 1,500 Å$^3$ or less.

1 Å is $1 \times 10^{-10}$ m.

In the present specification, the volume value of an acid generated from the photoacid generator is a value calculated by the following method.

The structure of the generated acid is optimized by a parameterized model number 3 (PM3) method using MOPAC7 enclosed with Winmostar (software manufactured by X-Ability Co., Ltd.). A Van der Waals volume is calculated for the obtained optimized structure by the method described in Non-Patent Document 1, using Winmostar (software manufactured by X-Ability Co., Ltd.).

Non-Patent Document 1: Improvement of molecular surface area and volume calculation program, Teruo Nagao, Bulletin of Hakodate National College of Technology, No. 27, p 111-120, 1993).

With regard to the photoacid generator, reference can be made to paragraphs [0368] to [0377] of JP2014-041328A and paragraphs [0240] to [0262] of JP2013-228681A (corresponding to paragraph [0339] of the specification of US2015/0004533A), the contents of which are incorporated herein by reference. In addition, specific preferred examples of the photoacid generator include, but are not limited to, the following compounds.

In addition, for each photoacid generator consisting of an anion and a cation in the following compounds, a photoacid generator in which a combination of the anion and the cation in each photoacid generator is modified may be used. Further, a photoacid generator having a combination of a cation used in each of the following compounds and an anion obtained by removing a hydrogen atom from the sulfonic acid group of a compound exemplified as an acid generated by the photoacid generator are combined can also be used.

(z1) 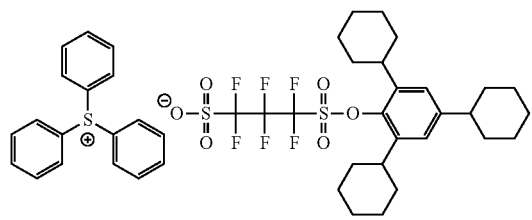
(z2) 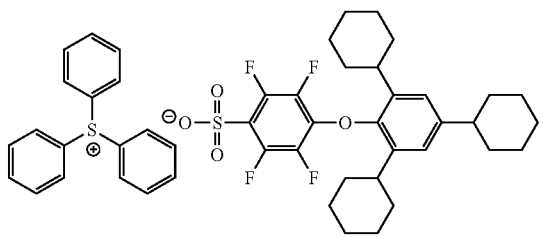
(z3) 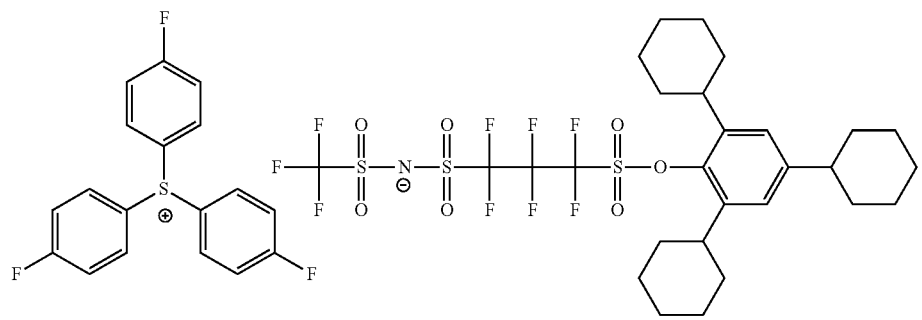
(z4) 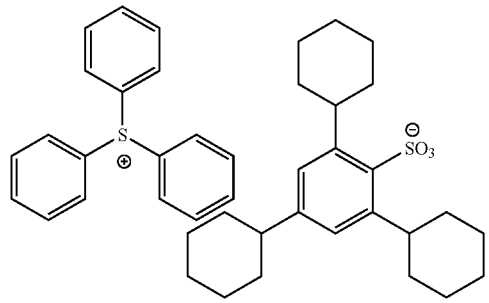
(z5) 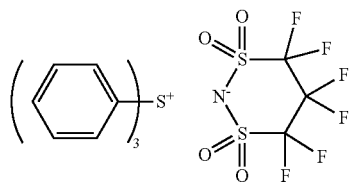
(z6) 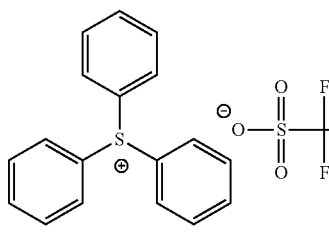
(z7) 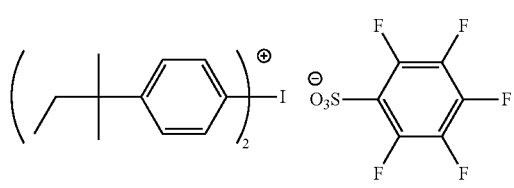
(z8) 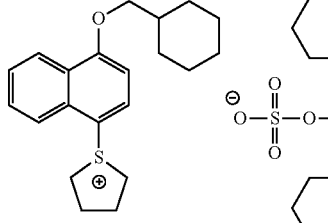
(z9) 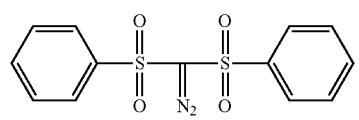
(z10) 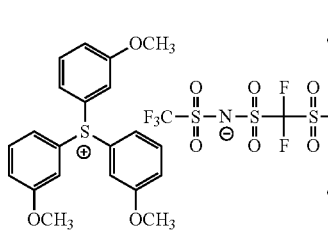
(z11)

-continued
(z12) 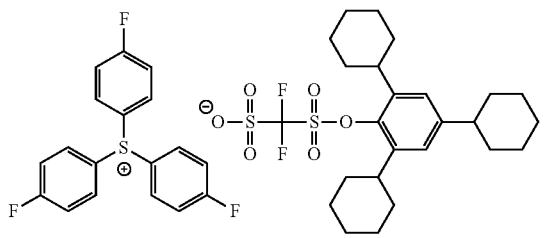
(z13) 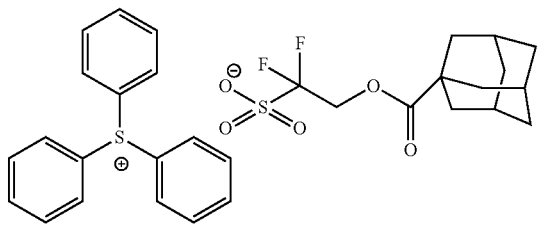
(z14) 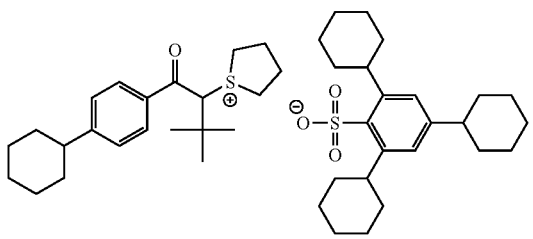
(z15) 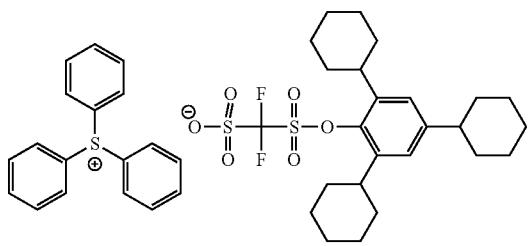
(z16) 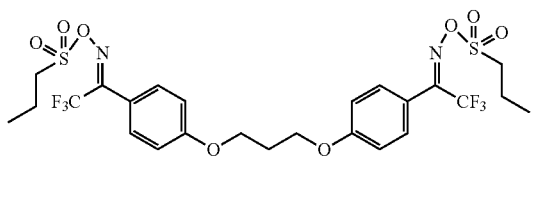
(z17) 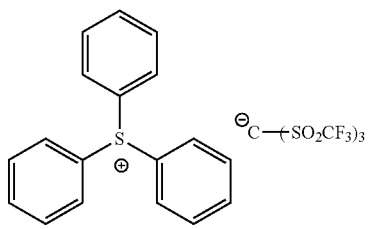
(z18) 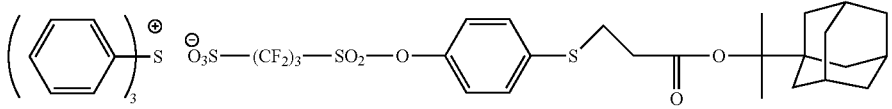
(z19) 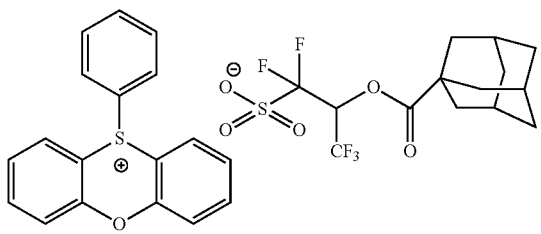
(z20) 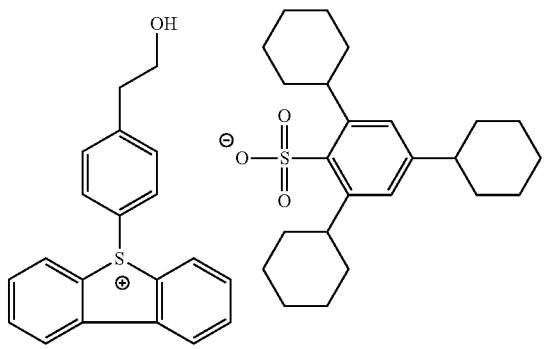
(z21) 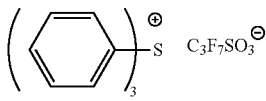
(z22) 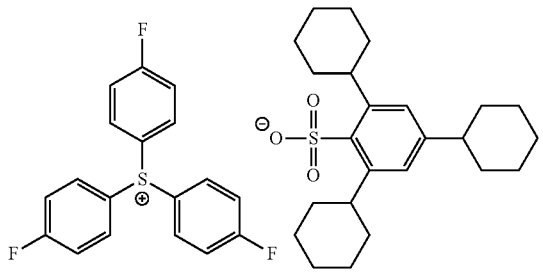

-continued
(z23) 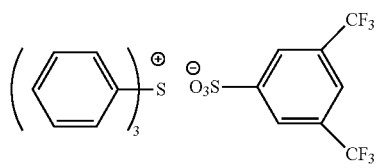
(z24) 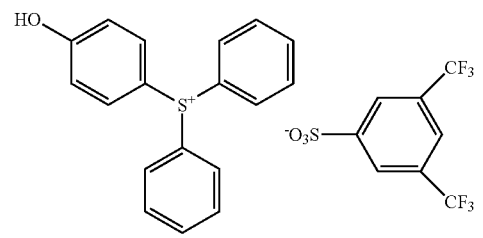
(z25) 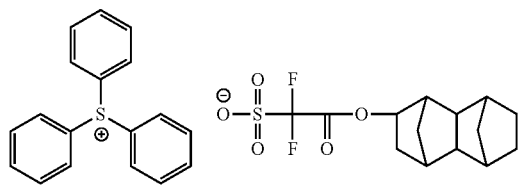
(z26) 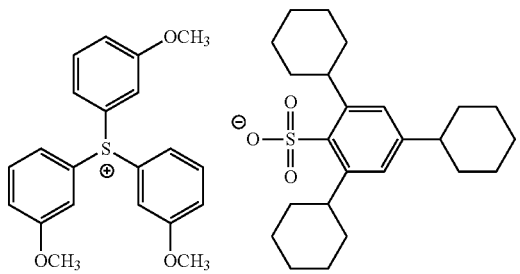
(z27) 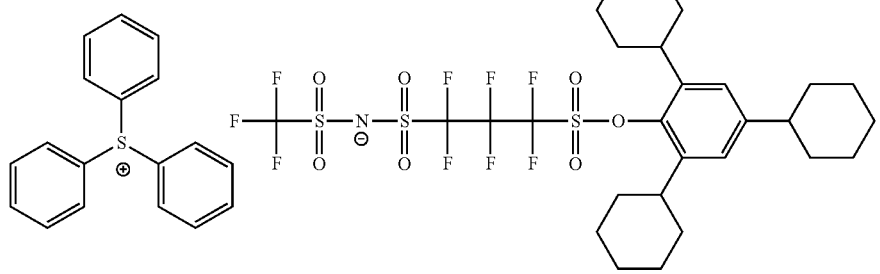
(z28) 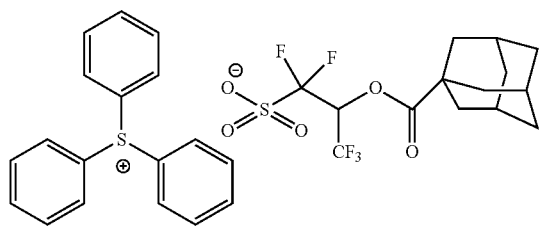
(z29) 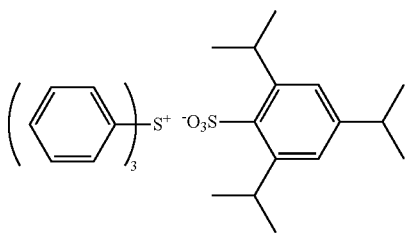
(z30) 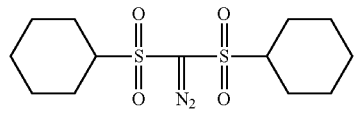
(z31) 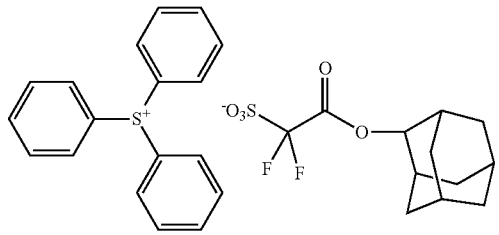
(z32) 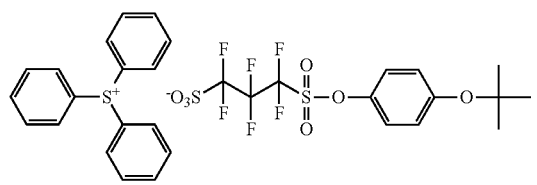
(z33) 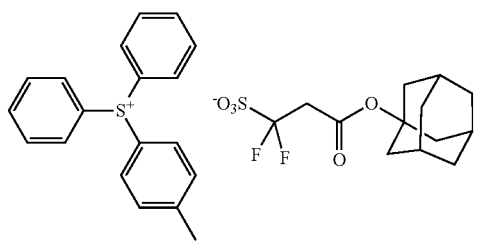

-continued
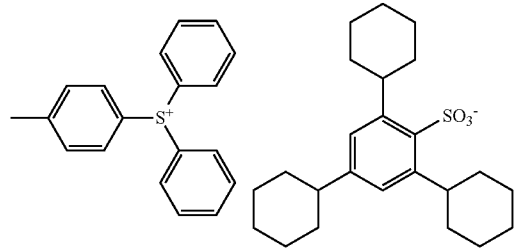 (z34)
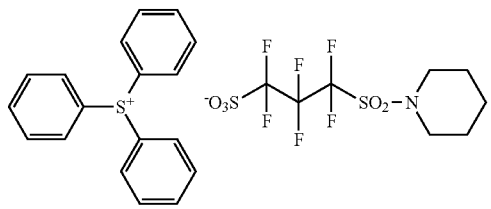 (z35)
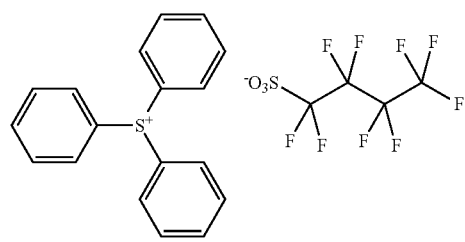 (z36)
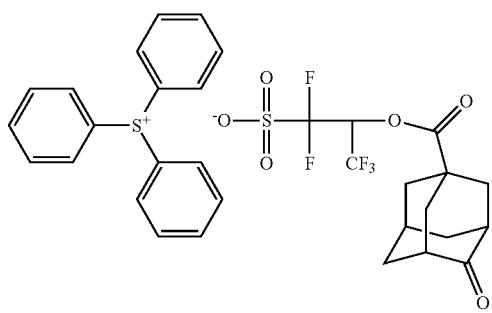 (z37)
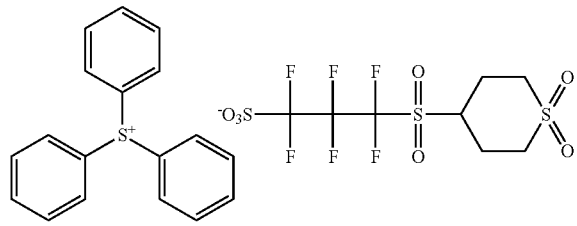
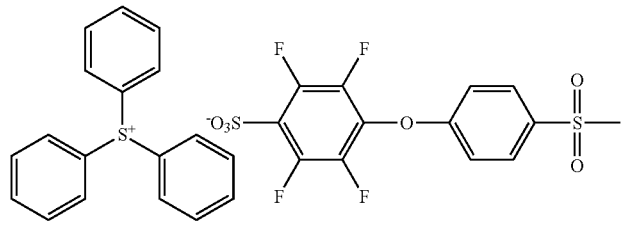
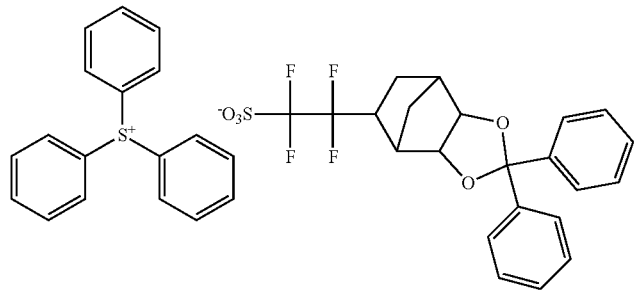
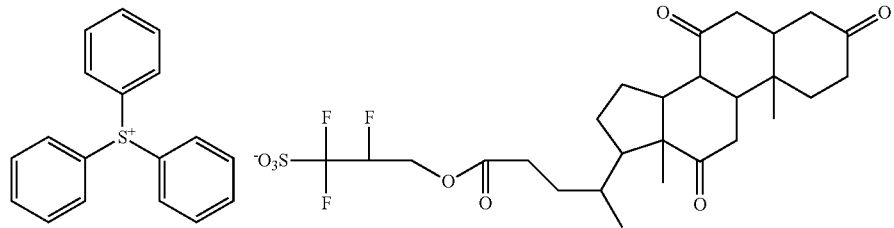

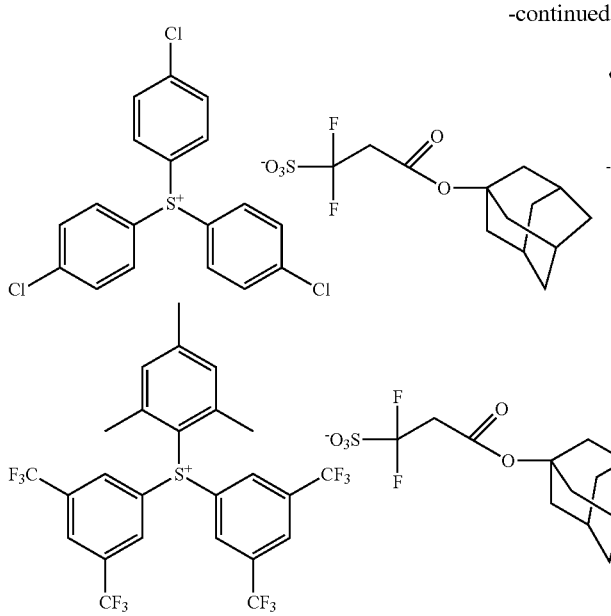
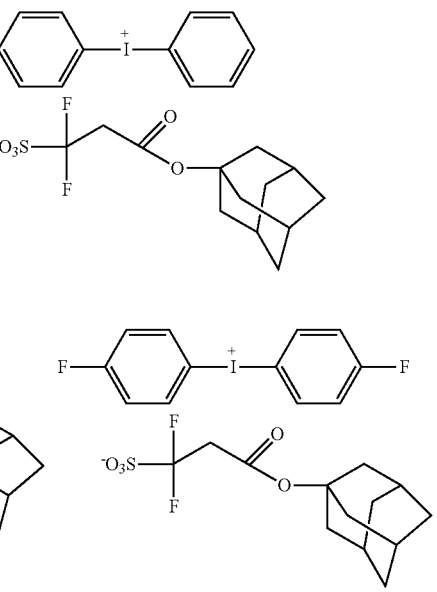

The photoacid generators may be used singly or in combination of two or more kinds thereof.

The content of the photoacid generator (in a case where the photoacid generators are present in a plural number, a total content thereof) in the composition of the embodiment of the present invention is preferably 0.1% to 50.0% by mass, more preferably 5.0% to 40.0% by mass, and still more preferably 5.0% to 35.0% by mass, with respect to a total solid content of the composition.

<Acid Diffusion Control Agent>

The composition of the embodiment of the present invention preferably includes an acid diffusion control agent. The acid diffusion control agent acts as a quencher that suppresses a reaction of the acid-decomposable resin in the unexposed area by excessive generated acids by trapping the acids generated from a photoacid generator and the like upon exposure. For example, a basic compound (DA), a compound (DB) whose basicity is reduced or lost upon irradiation with actinic rays or radiation, an onium salt (DC) which is a relatively weak acid with respect to an acid generator, or the like can be used as the acid diffusion control agent.

As the basic compound (DA), compounds having structures represented by Formulae (A) to (E) are preferable.

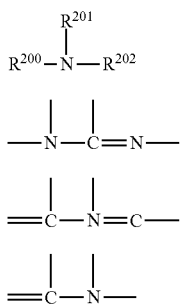

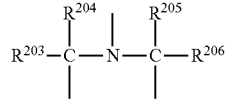

In General Formulae (A) and (E), $R^{200}$, $R^{201}$, and $R^{202}$ each independently represent a hydrogen atom, an alkyl group (preferably having 1 to 20 carbon atoms), a cycloalkyl group (preferably having 3 to 20 carbon atoms), or an aryl group (preferably having 6 to 20 carbon atoms). $R^{201}$ and $R^{202}$ may be bonded to each other to form a ring.

In General Formula (E), $R^{203}$, $R^{204}$, $R^{205}$, and $R^{206}$ each independently represent an alkyl group having 1 to 20 carbon atoms.

The alkyl group in each of General Formulae (A) and (E) may have a substituent or may be unsubstituted.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in each of General Formulae (A) and (E) are more preferably unsubstituted.

As the basic compound (DA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

Examples of the compound having an imidazole structure include imidazole, 2,4,5-triphenylimidazole, benzimidazole, and phenyl benzimidazole.

Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene.

Examples of the compound having an onium hydroxide structure include triarylsulfonium hydroxide, phenacylsulfonium hydroxide, and sulfonium hydroxide having a 2-oxoalkyl group (specifically triphenylsulfonium hydroxide, tris(t-butylphenyl)sulfonium hydroxide, bis(t-butylphenyl) iodonium hydroxide, phenacylthiophenium hydroxide, and 2-oxopropylthiophenium hydroxide).

The compound having an onium carboxylate structure is a compound formed by carboxylation of an anionic moiety of a compound having an onium hydroxide structure, and examples thereof include acetate, adamantane-1-carboxylate, and perfluoroalkyl carboxylate.

Examples of the compound having a trialkylamine structure include tri(n-butyl)amine and tri(n-octyl)amine.

Examples of the compound having an aniline structure or a pyridine structure include 2,6-diisopropylaniline, N,N-dimethylaniline, N,N-dibutylaniline, and N,N-dihexylaniline.

Examples of the alkylamine derivative having a hydroxyl group and/or an ether bond include ethanolamine, diethanolamine, triethanolamine, and tris(methoxyethoxyethyl)amine.

Examples of the aniline derivative having a hydroxyl group and/or an ether bond include N,N-bis(hydroxyethyl)aniline.

Moreover, a superorganic base can also be used as the basic compound (DA).

Examples of the superorganic base include guanidine bases such as tetramethylguanidine and polyguanidine (including guanidine and guanidine derivatives such as substituted forms thereof and polyguanides), amidine-based and guanidine-based polynitrogen polyheterocyclic compounds and polymer-carrying strong bases thereof, typified by diazabicyclononene (DBN), diazabicycloundecene (DBU), triazabicyclodecene (TBD), N-methyl-triazabicyclodecene (MTBD), and the like, phosphazene-based (Schweisinger) bases, and proazaphosphatran (Verkade) bases.

Moreover, as the basic compound (DA), an amine compound and an ammonium salt compound can also be used.

Examples of the amine compound include primary, secondary, and tertiary amine compounds, and the amine compound is preferably an amine compound in which at least one or more alkyl groups (preferably having 1 to 20 carbon atoms) are bonded to nitrogen atoms, and more preferably the tertiary amine compound among those.

Furthermore, in a case where the amine compound is the secondary or tertiary amine compound, examples of a group bonded to the nitrogen atom in the amine compound include, in addition to the above-described alkyl groups, a cycloalkyl group (preferably having 3 to 20 carbon atoms) and an aryl group (preferably having 6 to 12 carbon atoms).

In addition, the amine compound preferably includes an oxyalkylene group. The number of the oxyalkylene groups contained in the amine compounds within the molecule is preferably 1 or more, more preferably 3 to 9, and still more preferably 4 to 6. Among the oxyalkylene groups, an oxyethylene group (—$CH_2CH_2O$—) or an oxypropylene group (—$CH(CH_3)CH_2O$— or —$CH_2CH_2CH_2O$—) is preferable, and the oxyethylene group is more preferable.

Examples of the ammonium salt compound include primary, secondary, tertiary, and quaternary ammonium salt compounds, and an ammonium salt compound in which one or more alkyl groups are bonded to a nitrogen atom is preferable.

Furthermore, in a case where the ammonium salt compound is a secondary, tertiary, or quaternary ammonium salt compound, examples of a group which is bonded to a nitrogen atom in the ammonium salt compound include, in addition to the above-described alkyl groups, a cycloalkyl group (preferably having 3 to 20 carbon atoms) and an aryl group (preferably having 6 to 12 carbon atoms).

In addition, the ammonium salt compound preferably includes an oxyalkylene group. The number of the oxyalkylene groups contained in the amine compounds within the molecule is preferably 1 or more, more preferably 3 to 9, and still more preferably 4 to 6. Among the oxyalkylene groups, an oxyethylene group (—$CH_2CH_2O$—) or an oxypropylene group (—$CH(CH_3)CH_2O$— or —$CH_2CH_2CH_2O$—) is preferable, and the oxyethylene group is more preferable.

Examples of the anion of the ammonium salt compound include a halogen atom, a sulfonate, a borate, and a phosphate, and among these, the halogen atom or the sulfonate is preferable.

As the halogen atom, a chlorine atom, a bromine atom, or an iodine atom is preferable.

As the sulfonate, an organic sulfonate having 1 to 20 carbon atoms is preferable, and preferred specific examples thereof include alkyl sulfonate and aryl sulfonate, having 1 to 20 carbon atoms. The alkyl group of the alkyl sulfonate may have a substituent, and examples of the substituent include a fluorine atom, a chlorine atom, a bromine atom, an alkoxy group, an acyl group, and an aromatic ring group. Examples of the alkyl sulfonate include methanesulfonate, ethanesulfonate, butanesulfonate, hexanesulfonate, octanesulfonate, benzyl sulfonate, trifluoromethanesulfonate, pentafluoroethanesulfonate, and nonafluorobutanesulfonate. In addition, examples of the aryl group of the aryl sulfonate include a benzene ring group, a naphthalene ring group, and an anthracene ring group. As the substituent which can be contained in the benzene ring group, the naphthalene ring group, and the anthracene ring group, a linear or branched alkyl group having 1 to 6 carbon atoms (which may be linear or branched) or a cycloalkyl group having 3 to 6 carbon atoms is preferable. Specific examples of the alkyl group and the cycloalkyl group include a methyl group, an ethyl group, an n-propyl group, an isopropyl group, an n-butyl group, an i-butyl group, a t-butyl group, an n-hexyl group, and a cyclohexyl group.

The alkyl group and the cycloalkyl group may have another substituent, and examples of such another substituent include an alkoxy group having 1 to 6 carbon atoms, a halogen atom, a cyano group, a nitro group, an acyl group, and an acyloxy group.

Moreover, as the basic compound (DA), an amine compound having a phenoxy group and an ammonium salt compound having a phenoxy group can also be used.

The amine compound having a phenoxy group and the ammonium salt compound having a phenoxy group are each a compound having a phenoxy group at the terminal on the opposite side to the nitrogen atom of the alkyl group which is contained in the amine compound or the ammonium salt compound.

Examples of a substituent of the phenoxy group include an alkyl group, an alkoxy group, a halogen atom, a cyano group, a nitro group, a carboxyl group, a carboxylic ester group, a sulfonic ester group, an aryl group, an aralkyl group, an acyloxy group, and an aryloxy group. The substitution position of the substituent may be any of 2- to 6-positions. The number of the substituents may be any one of 1 to 5.

The amine compound having a phenoxy group and the ammonium salt compound having a phenoxy group each preferably have at least one oxyalkylene group between the phenoxy group and the nitrogen atom. The number of the oxyalkylene groups contained in the amine compounds within the molecule is preferably 1 or more, more preferably 3 to 9, and still more preferably 4 to 6. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and the oxyethylene group is more preferable.

The amine compound having a phenoxy group can be obtained by heating a mixture of a primary or secondary amine having a phenoxy group and a haloalkyl ether to perform a reaction, then adding an aqueous solution of a strong base (for example, sodium hydroxide, potassium hydroxide, and tetraalkylammonium) to a reaction system, and extracting the reaction product with an organic solvent (for example, ethyl acetate and chloroform). Alternatively, the amine compound having a phenoxy group can also be obtained by heating a mixture of a primary or secondary amine and a haloalkyl ether having a phenoxy group at the terminal to perform a reaction, then adding an aqueous solution of a strong base to the reaction system, and extracting the reaction product with an organic solvent.

The compound (DB) whose basicity is reduced or lost upon irradiation with actinic rays or radiation (hereinafter also referred to as a "compound (DB)") is, for example, a compound which has a proton-accepting functional group, and decomposes under irradiation with actinic rays or radiation to exhibit deterioration in proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by General Formula.

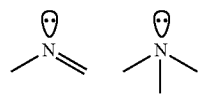

Unshared electron pair

Preferred examples of the partial structure of the proton-accepting functional group include a crown ether structure, an azacrown ether structure, primary to tertiary amine structures, a pyridine structure, an imidazole structure, and a pyrazine structure.

The compound (DB) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (DB) having the proton-accepting functional group and the proton.

The proton-accepting properties can be confirmed by performing pH measurement.

With regard to specific examples of the compound (DB), the compounds described in paragraphs [0421] to [0428] of JP2014-041328A or paragraphs [0108] to [0116] of JP2014-134686A, the contents of which are incorporated herein by reference, can be employed.

As the onium salt (DC) which is a weak acid relative to the acid generator, compounds represented by General Formulae (d1-1) to (d1-3) are preferable.

(d1-1)

(d1-2)

(d1-3)

In the formula, R$^{51}$ is a hydrocarbon group which may have a substituent, Z$^{2c}$ is a hydrocarbon group having 1 to 30 carbon atoms, which may have a substituent (provided that carbon adjacent to S is not substituted with a fluorine atom), R$^{52}$ is an organic group, Y$^3$ is a linear, branched or cyclic alkylene group or an arylene group, Rf is a hydrocarbon group including a fluorine atom, and M's are each independently an ammonium cation, a sulfonium cation, or an iodonium cation.

R$^{51}$ is preferably an aryl group which may have a substituent, more preferably an aryl group having a fluorine atom-containing substituent (a fluoroalkyl group such as a trifluoromethyl group), and still more preferably a phenyl group having a fluorine atom-containing substituent. The number of fluorine atoms contained in R$^{51}$ is preferably 1 to 12, and more preferably 3 to 9.

As the sulfonium cation or the iodonium cation represented by M$^+$, the sulfonium cation in General Formula (ZI) and the iodonium cation in General Formula (ZII) are preferable.

Specific examples of an acid diffusion aid are shown below, but the present invention is not limited thereto.

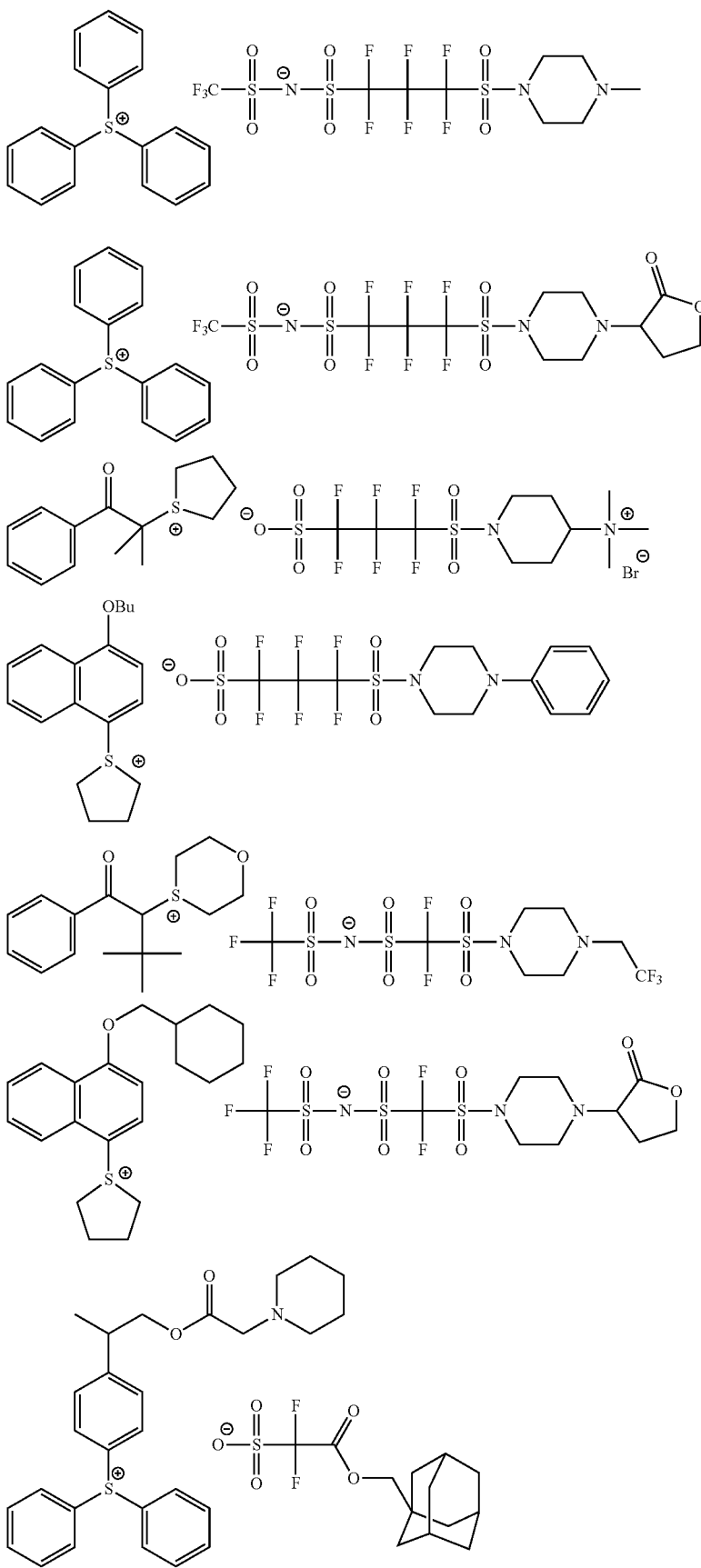

71 72
-continued
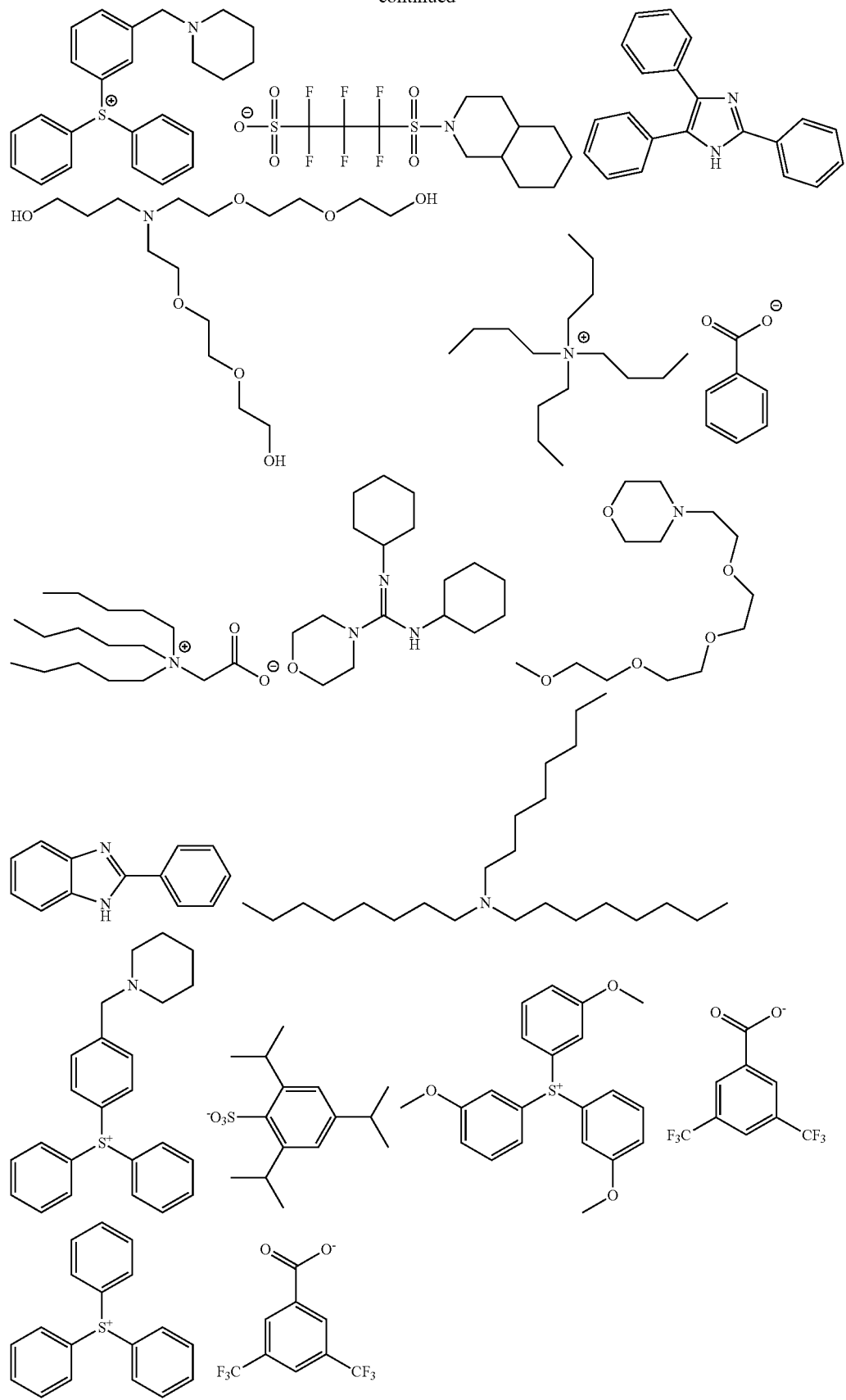

Moreover, as an acid diffusion control agent, for example, the compounds (amine compounds, amido group-containing compounds, urea compounds, nitrogen-containing heterocyclic compounds, and the like) described in paragraphs [0140] to [0144] of JP2013-011833A can also be used.

The acid diffusion control agents may be used singly or in combination of two or more kinds thereof.

The content of the acid diffusion control agent (in a case where the acid diffusion control agents are present in a plural number, a total content thereof) in the composition of the embodiment of the present invention is preferably 0.001% to 14% by mass, more preferably 0.01% to 12% by mass, and still more preferably 1% to 10% by mass, with respect to a total solid content of the composition.

<Surfactant>

The composition of the embodiment of the present invention may include a surfactant. By incorporating the surfactant into the composition, it is possible to provide a resist pattern having improved adhesiveness and less development defects with good sensitivity and resolution in a case where an exposure light source at a wavelength of 250 nm or less, and particularly 220 nm or less is used.

As the surfactant, fluorine-based and/or silicon-based surfactants are preferable.

Examples of the fluorine-based and/or silicon-based surfactants include the surfactants described in paragraph [0276] of the specification of US2008/0248425A. In addition, EFTOP EF301 and EF303 (manufactured by Shin-Akita Chemical Co., Ltd.); FLUORAD FC430, 431, and 4430 (manufactured by Sumitomo 3M Inc.); MEGAFACE F171, F173, F176, F189, F113, F110, F177, F120, and R08 (manufactured by DIC Corp.); SURFLON S-382, SC101, 102, 103, 104, 105, and 106 (manufactured by Asahi Glass Co., Ltd.), TROYSOL S-366 (manufactured by Troy Chemical Corp.); GF-300 and GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); KH-20 (manufactured by Asahi Kasei Co., Ltd.); or FTX-204G, 208G, 218G, 230G, 204D, 208D, 212D, 218D, and 222D (manufactured by NEOS Co., Ltd.) may be used. In addition, a polysiloxane polymer KP-341 (manufactured by Shin-Etsu Chemical Co., Ltd.) can also be used as the silicon-based surfactant.

Moreover, in addition to the known surfactants as shown above, a surfactant may be synthesized using a fluoroaliphatic compound manufactured using a telomerization method (also referred to as a telomer method) or an oligomerization method (also referred to as an oligomer method). Specifically, a polymer including a fluoroaliphatic group derived from fluoroaliphatic compound may be used as the surfactant. This fluoroaliphatic compound can be synthesized, for example, by the method described in JP2002-090991A.

In addition, a surfactant other than the fluorine-based surfactant and/or the silicon-based surfactants described in paragraph [0280] of the specification of US2008/0248425A may be used.

The surfactants may be used singly or in combination of two or more kinds thereof.

The content of the surfactant in the composition of the embodiment of the present invention is preferably 0.0001% to 2.0% by mass, and more preferably 0.0005% to 1.0% by mass, with respect to the total solid content of the composition.

<Hydrophobic Resin>

The composition of the embodiment of the present invention may include a hydrophobic resin. Further, the hydrophobic resin is a resin which is different from the resin (X).

In a case where the composition of the embodiment of the present invention includes the hydrophobic resin, it is possible to control the static/dynamic contact angle on a surface of an actinic ray-sensitive or radiation-sensitive film. Thus, it is possible to improve development characteristics, suppress generation of out gas, improve immersion liquid followability upon liquid immersion exposure, and reduce liquid immersion defects, for example.

It is preferable that the hydrophobic resin is designed to be unevenly distributed on a surface of a resist film, but unlike the surfactant, the hydrophobic resin does not necessarily have a hydrophilic group in a molecule thereof and does not necessarily contribute to homogeneous mixing of polar/non-polar materials.

The hydrophobic resin is preferably a resin having a repeating unit having at least one group selected from the group consisting of a "fluorine atom", a "silicon atom", or a "$CH_3$ partial structure which is contained in a side chain portion of a resin" from the viewpoint of uneven distribution on a film surface layer, and more preferably has two or more types.

In a case where the hydrophobic resin includes a fluorine atom and/or a silicon atom, the fluorine atom and/or the silicon atom described above in the hydrophobic resin may be included in the main chain of a resin or may be included in a side chain.

In a case where the hydrophobic resin includes a fluorine atom, it is preferably a resin which has an alkyl group having a fluorine atom, a cycloalkyl group having a fluorine atom, or an aryl group having a fluorine atom as a partial structure having a fluorine atom.

The hydrophobic resin preferably has at least one group selected from the following (x) to (z) groups:

(x) an acid group, (y) a group having a solubility in an alkali developer that increases through decomposition by the action of an alkali developer (hereinafter also referred to as a polarity conversion group), and (z) a group that decomposes by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

As the acid group, the fluorinated alcohol group (preferably hexafluoroisopropanol), the sulfonimido group, or the bis(alkylcarbonyl)methylene group is preferable.

Examples of the group (y) having a solubility in an alkali developer that increases through decomposition by the action of the alkali developer include a lactone group, a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—OSO$_2$O—), and a sulfonic ester group (—SO$_2$O—), and the lactone group or the carboxylic ester group (—COO—) is preferable.

The repeating unit including such the group is, for example, a repeating unit in which the group is directly bonded to the main chain of a resin, and examples thereof include a repeating unit with an acrylic ester or a methacrylic ester. In this repeating unit, such the group may be bonded to the main chain of the resin via a linking group. Alternatively, this repeating unit may also be incorporated into a terminal of the resin by using a polymerization initiator or a chain transfer agent having such the group during polymerization.

Examples of the repeating unit having a lactone group include the same repeating units as those of the repeating unit having a lactone structure described earlier in the section of the resin (X).

The content of the repeating unit having the group (y) having a solubility in an alkali developer that increases through decomposition by the action of the alkali developer is preferably 1% to 100% by mole, more preferably 3% to 98% by mole, and still more preferably 5% to 95% by mole, with respect to all the repeating units in the hydrophobic resin.

Examples of the repeating unit having the group (z) that decomposes by the action of an acid in the hydrophobic resin include the same repeating units as the repeating units having an acid-decomposable group exemplified in the resin (X). The repeating unit having a group (z) that decomposes by the action of an acid may have at least any one of a fluorine atom or a silicon atom. The content of the repeating unit having a group (z) that decomposes by the action of an acid is preferably 1% to 80% by mole, more preferably 10% to 80% by mole, and still more preferably 20% to 60% by mole, with respect to all the repeating units in the hydrophobic resin.

The hydrophobic resin may further have a repeating unit which is different from the above-mentioned repeating units.

The content of the repeating unit including a fluorine atom is preferably 10% to 100% by mole, and more preferably 30% to 100% by mole, with respect to all the repeating units in the hydrophobic resin. Further, the content of the repeating units including a silicon atom is preferably 10% to 100% by mole, and more preferably 20% to 100% by mole, with respect to all the repeating units in the hydrophobic resin.

On the other hand, in a case where the hydrophobic resin includes a $CH_3$ partial structure in the side chain portion thereof, a form in which the hydrophobic resin does not substantially include a fluorine atom and a silicon atom is preferable. Further, it is preferable that the hydrophobic resin is constituted with substantially only repeating units which are constituted with only atoms selected from a carbon atom, an oxygen atom, a hydrogen atom, a nitrogen atom, and a sulfur atom.

The weight-average molecular weight of the hydrophobic resin in terms of standard polystyrene is preferably 1,000 to 100,000, and more preferably 1,000 to 50,000.

A total content of the residual monomers and/or oligomer components included in the hydrophobic resin is preferably 0.01% to 5% by mass, and more preferably 0.01% to 3% by mass. In addition, the dispersity (Mw/Mn) is preferably 1 to 5, and more preferably 1 to 3.

As the hydrophobic resin, known resins can be appropriately selected and used singly or as a mixture. For example, the known resins disclosed in paragraphs [0451] to [0704] of the specification of US2015/0168830A1 and paragraphs [0340] to [0356] of the specification of US2016/0274458A1 can be suitably used as the hydrophobic resin (E). Further, the repeating units disclosed in paragraphs [0177] to [0258] of the specification of US2016/0237190A1 are also preferable as a repeating unit constituting the hydrophobic resin (E).

Preferred examples of a monomer corresponding to the repeating unit constituting the hydrophobic resin are shown below.

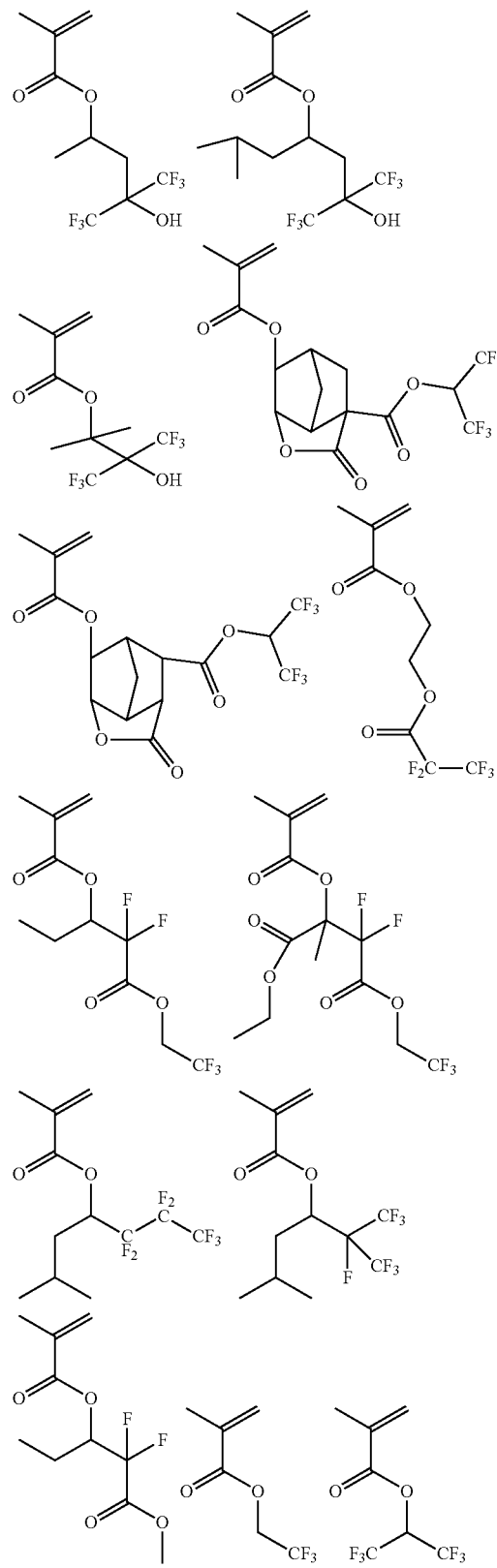

-continued

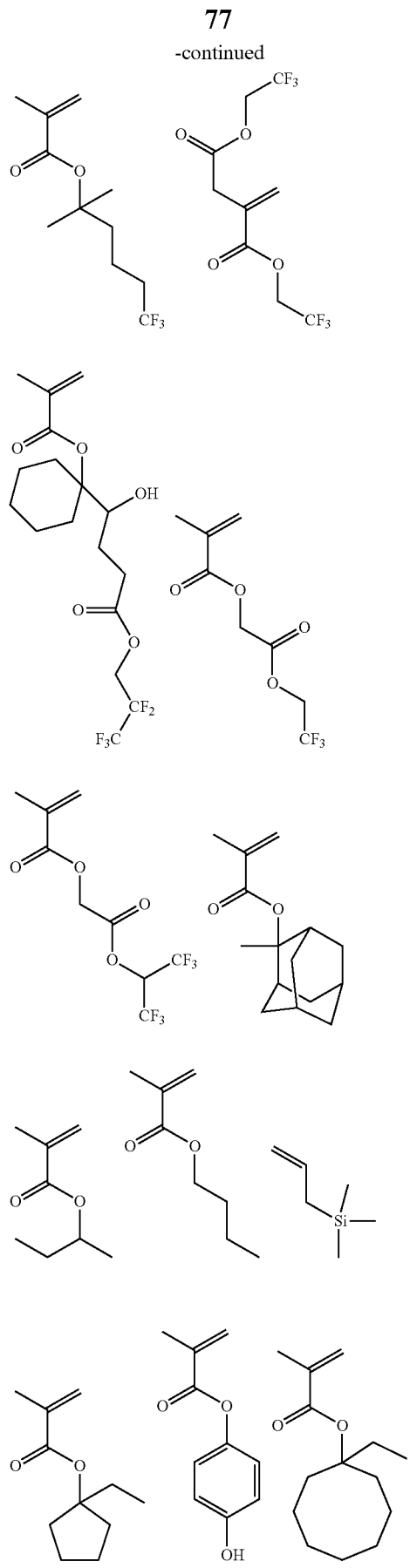

-continued

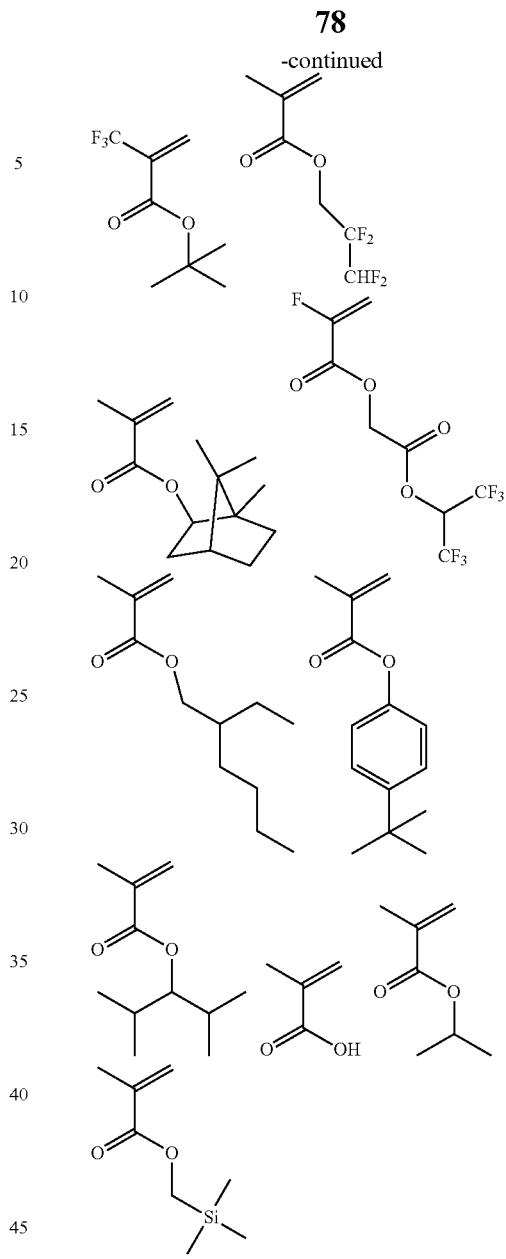

The hydrophobic resins may be used singly or in combination of two or more kinds thereof.

It is preferable to use a mixture of two or more kinds of hydrophobic resins having different levels of surface energy from the viewpoint of satisfying both the immersion liquid followability and the development characteristics upon liquid immersion exposure.

The content of the hydrophobic resin in the composition (in a case where the hydrophobic resins are present in a plural number, a total content thereof) is preferably 0.01% to 10.0% by mass, and more preferably 0.05% to 8.0% by mass, with respect to the total solid content in the composition.

<Solvent>

The composition of the embodiment of the present invention may include a solvent.

The solvent preferably includes at least any one of the following component (M1) or the following component (M2), and among these, the solvent more preferably includes the following component (M1).

In a case where the solvent includes the following component (M1), it is preferable that the solvent consists of substantially only the component (M1) or is a mixed solvent including at least the component (M1) and the component (M2).

Hereinafter, the component (M1) and the component (M2) will be shown.

Component (M1): Propylene glycol monoalkyl ether carboxylate

Component (M2): A solvent selected from the following component (M2-1) or a solvent selected from the following component (M2-2)

Component (M2-1): Propylene glycol monoalkyl ether, lactic ester, acetic ester, butyl butyrate, alkoxy propionic ester, chained ketone, cyclic ketone, lactone, or alkylene carbonate Component (M2-2): Another solvent having a flash point (also referred to as fp) of 37° C. or higher.

In a case where the solvent and the above-described resin (X) are used in combination, the coating property of the composition is improved and a pattern having a less number of development defects can be obtained. Although a reason therefor is not necessarily clear, it is considered that the solvent has a good balance among the solubility, the boiling point, and the viscosity of the above-described resin (X), and therefore, unevenness in the film thickness of a resist film, generation of precipitates during spin coating, and the like can be suppressed.

As the component (M1), at least one selected from the group consisting of propylene glycol monomethyl ether acetate (PGMEA), propylene glycol monomethyl ether propionate, and propylene glycol monoethyl ether acetate is preferable, and the propylene glycol monomethyl ether acetate (PGMEA) is more preferable.

The component (M2) may satisfy only one of the requirement as the component (M2-1) and the requirement as the component (M2-2), or may satisfy both of them.

As the component (M2-1), the following solvents are preferable.

As the propylene glycol monoalkyl ether, propylene glycol monomethyl ether (PGME) or propylene glycol monoethyl ether is preferable.

As the lactic ester, ethyl lactate, butyl lactate, or propyl lactate is preferable.

As the acetic ester, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

As the alkoxy propionic ester, methyl 3-methoxypropionate (MMP), or ethyl 3-ethoxypropionate (EEP) is preferable.

As the chained ketone, 1-octanone, 2-octanone, 1-nonanone, 2-nonanone, acetone, 2-heptanone, 4-heptanone, 1-hexanone, 2-hexanone, diisobutyl ketone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone is preferable.

As the cyclic ketone, methyl cyclohexanone, isophorone, or cyclohexanone is preferable.

As the lactone, g-butyrolactone is preferable.

As the alkylene carbonate, propylene carbonate is preferable.

As the component (M2-1), propylene glycol monomethyl ether (PGME), ethyl lactate, ethyl 3-ethoxypropionate, methyl amyl ketone, cyclohexanone, butyl acetate, pentyl acetate, g-butyrolactone, or propylene carbonate is more preferable.

Specific examples of the component (M2-2) include propylene glycol monoethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), and propylene carbonate (fp: 132° C.). Among those, propylene glycol monoethyl ether, ethyl lactate, pentyl acetate, or cyclohexanone is preferable, and propylene glycol monoethyl ether or ethyl lactate is more preferable.

In addition, the "flash point" herein means the value described in a reagent catalog of Tokyo Chemical Industry Co., Ltd. or Sigma-Aldrich Co. LLC.

The mixing ratio (mass ratio: M1/M2) of the component (M1) to the component (M2) is preferably 100/0 to 15/85, more preferably in the range of 100/0 to 40/60, and still more preferably in the range of 100/0 to 60/40, from the viewpoint that the number of development defects is further decreased.

Moreover, the solvent may include solvents other than the component (M1) and the component (M2). In this case, the content of the solvents other than the components (M1) and (M2) is preferably 5% to 30% by mass with respect to the total mass of the solvent.

Examples of such other solvents include ester-based solvents having 7 or more carbon atoms (preferably 7 to 14 carbon atoms, more preferably 7 to 12 carbon atoms, and still more preferably 7 to 10 carbon atoms) and 2 or less heteroatoms. Furthermore, the ester-based solvents having 7 or more carbon atoms and 2 or less heteroatoms do not include solvents corresponding to the above-described component (M2).

As the ester-based solvents having 7 or more carbon atoms and 2 or less heteroatoms, amyl acetate, 2-methylbutyl acetate, 1-methylbutyl acetate, hexyl acetate, pentyl propionate, hexyl propionate, butyl propionate, isobutyl isobutyrate, heptyl propionate, butyl butanoate, or the like is preferable, and isoamyl acetate is more preferable.

It is also preferable that the solvent includes both a lactic ester (ethyl lactate and the like) and a lactone (γ-butyrolactone and the like). In this case, the mixing ratio (mass ratio: lactic ester/lactone) of the both is preferably 85/15 to 15/85, and more preferably 70/30 to 30/70.

In this case, the solvent may contain a solvent other than the lactic ester and the lactone. In this case, the content of the solvent other than the lactic ester, and the lactone is preferably 5% to 30% by mass with respect to the total mass of the solvent.

<Other Additives>

The composition of the embodiment of the present invention may further include a dissolution inhibiting compound (a compound whose solubility in an organic developer decreases through decomposition by the action of an acid, with a molecular weight thereof being preferably 3,000 or less), a dye, a plasticizer, a light sensitizer, a light absorber, and/or a compound that accelerates dissolution in a developer (for example, a phenol compound having a molecular weight of 1,000 or less, or an alicyclic or aliphatic compound including a carboxyl group).

<Preparation Method>

The concentration of the solid content in the composition of the embodiment of the present invention is preferably 0.5% to 30% by mass, more preferably 1.0% to 20.0% by mass, and still more preferably 1.0% to 10.0% by mass, from the viewpoint that the coating property is more excellent.

In the present specification, the solid content of the composition is intended to mean, in a case where the composition contains a solvent, all the components excluding the solvent, and even a liquid component is considered a solid content as long as it is a component other than the solvent. For example, the mass of the solid content of the composition is determined as a mass remaining after heating 1 g of the composition at 160° C. for 70 minutes.

In addition, the film thickness of a resist film (an actinic ray-sensitive or radiation-sensitive film) formed from the composition of the embodiment of the present invention is generally 200 nm or less, and more preferably 100 nm or less, from the viewpoint of improving resolving power. For example, it is preferable that the film thickness of a resist film thus formed is 90 nm or less in order to resolve a 1:1 line-and-space pattern with a line width of 20 nm or less. In a case where the film thickness is 90 nm or less, more excellent resolution performance is obtained due to suppressed pattern collapse upon application of a developing step which will be described later.

In a case of EUV exposure or exposure with electron beams, the film thickness range is preferably 15 to 60 nm. Such a film thickness can be obtained by setting the concentration of the solid content in the composition to an appropriate range to provide the composition with a suitable viscosity and improve the coating property or the film forming property.

The composition of the embodiment of the present invention is used by dissolving the components in a predetermined organic solvent, and preferably the mixed solvent, and filtering the solution through a filter and applying it onto a predetermined support (substrate). The pore size of a filter for use in filtration through the filter is preferably pore size of 0.1 μm or less, more preferably 0.05 μm or less, and still more preferably 0.03 μm or less. As the filter, a polytetrafluoroethylene-made, polyethylene-made, or nylon-made filter is preferable. In the filtration through a filter as shown in the specification of JP2002-062667A, circulating filtration may be performed or the filtration may be performed by connecting plural kinds of filters in series or in parallel. In addition, the composition may be filtered in plural times. Furthermore, the composition may be subjected to a deaeration treatment or the like before or after filtration through a filter.

<Applications>

The composition of the embodiment of the present invention relates to an actinic ray-sensitive or radiation-sensitive resin composition whose properties change by undergoing a reaction upon irradiation with actinic rays or radiation. More specifically, the composition of the embodiment of the present invention relates to an actinic ray-sensitive or radiation-sensitive resin composition which is used in a step of manufacturing a semiconductor such as an integrated circuit (IC), for manufacture of a circuit board for a liquid crystal, a thermal head, or the like, the manufacture of a mold structure for imprinting, other photofabrication steps, or production of a planographic printing plate or an acid-curable composition. A pattern to be formed in the present invention can be used in an etching step, an ion implantation step, a bump electrode forming step, a rewiring forming step, microelectromechanical systems (MEMS), or the like.

[Pattern Forming Method]

The present invention also relates to a pattern forming method using the actinic ray-sensitive or radiation-sensitive resin composition. Hereinafter, the pattern forming method of the embodiment of the present invention will be described.

The pattern forming method of the embodiment of the present invention has:

(i) a step of forming a resist film (actinic ray-sensitive or radiation-sensitive film) on a support using the above-described actinic ray-sensitive or radiation-sensitive resin composition (resist film forming step), (ii) a step of exposing the resist film (irradiating the resist film with actinic rays or radiation) (exposing step), and (iii) a step of developing the exposed resist film with a developer (developing step).

The pattern forming method of the embodiment of the present invention is not particularly limited as long as it includes the steps (i) to (iii), and may further include the following steps.

In the pattern forming method of the embodiment of the present invention, the exposing method in the exposing step (ii) may be liquid immersion exposure.

The pattern forming method of the embodiment of the present invention preferably includes a prebaking (PB) step (iv) before the exposing step (ii).

The pattern forming method of the embodiment of the present invention preferably includes a post-exposure baking (PEB) step (v) after the exposing step (ii) and before the developing step (iii).

The pattern forming method of the embodiment of the present invention may include the exposing step (ii) a plurality of times.

The pattern forming method of the embodiment of the present invention may include the prebaking step (iv) a plurality of times.

The pattern forming method of the embodiment of the present invention may include the post-exposure baking step (v) a plurality of times.

In the pattern forming method of the embodiment of the present invention, the film forming step (i), the exposing step (ii), and the developing step (iii) described above can be performed by a generally known method.

In addition, a resist underlayer film (for example, spin on glass (SOG), spin on carbon (SOC), and an antireflection film) may be formed between the resist film and the support, as desired. As a material constituting the resist underlayer film, known organic or inorganic materials can be appropriately used.

A protective film (topcoat) may be formed on the upper layer of the resist film. As the protective film, a known material can be appropriately used. For example, the compositions for forming a protective film disclosed in the specification of US2007/0178407A, the specification of US2008/0085466A, the specification of US2007/0275326A, the specification of US2016/0299432A, the specification of US2013/0244438A, or the specification of WO2016/157988A can be suitably used. As the composition for forming a protective film, a composition including the above-mentioned acid diffusion control agent is preferable.

The film thickness of the protective film is preferably 10 to 200 nm, more preferably 20 to 100 nm, and still more preferably 40 to 80 nm.

The support is not particularly limited, and a substrate which is generally used in a step of manufacturing a semiconductor such as an IC, and a step for manufacturing a circuit board for a liquid crystal, a thermal head, or the like, and other lithographic steps of photofabrication can be used. Specific examples of the support include an inorganic substrate such as silicon, $SiO_2$, and SiN.

For any of the prebaking step (iv) and the post-exposure baking step (v), the baking temperature is preferably 80° C. to 150° C., more preferably 80° C. to 140° C., and still more preferably 80° C. to 130° C.

For any of the prebaking step (iv) and the post-exposure baking step (v), the baking time is preferably 30 to 1,000 seconds, more preferably 60 to 800 seconds, and still more preferably 60 to 600 seconds.

The baking may be performed using a unit included in an exposing device and a developing device, or may also be performed using a hot plate or the like.

A light source wavelength used in the exposing step is not limited, and examples thereof include infrared rays, visible light, ultraviolet rays, far ultraviolet rays, extreme ultraviolet rays (EUV), X-rays, and electron beams. Among those, the light source wavelength is preferably 250 nm or less, more preferably 220 nm or less, and still more preferably 1 to 200 nm. Specifically, a KrF excimer laser (248 nm), an ArF excimer laser (193 nm), an F2 excimer laser (157 nm), X-rays, EUV (13 nm), electron beams, and the like are preferable, the KrF excimer laser, the ArF excimer laser, EUV, or the electron beams are preferable, and EUV or the electron beams are more preferable.

In the developing step (iii), the developer to be used may be either an alkali developer or a developer including an organic solvent (hereinafter also referred to as an organic developer).

As an alkali component included in the alkali developer, a quaternary ammonium salt typified by tetramethylammonium hydroxide is usually used. In addition, an aqueous alkali solution including an alkali component such as an inorganic alkali, primary to tertiary amines, alcohol amines, and cyclic amines can also be used.

Furthermore, the alkali developer may include an appropriate amount of alcohols and/or a surfactant. The alkali concentration of the alkali developer is usually 0.1% to 20% by mass. The pH of the alkali developer is usually 10 to 15.

A time period for performing development the using the alkali developer is usually 10 to 300 seconds.

The alkali concentration, the pH, and the development time using the alkali developer can be appropriately adjusted depending on a pattern to be formed.

The organic developer is preferably a developer including at least one organic solvent selected from the group consisting of a ketone-based solvent, an ester-based solvent, an alcohol-based solvent, an amide-based solvent, an ether-based solvent, and a hydrocarbon-based solvent.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butyrate, methyl 2-hydroxyisobutyrate, isoamyl acetate, isobutyl isobutyrate, and butyl propionate.

As the alcohol-based solvent, the amide-based solvent, the ether-based solvent, and the hydrocarbon-based solvent, the solvents disclosed in paragraphs [0715] to [0718] of the specification of US2016/0070167A1 can be used.

A plurality of the solvents may be mixed or the solvent may be used in admixture with a solvent other than those described above or water. The moisture content in the entire developer is preferably less than 50% by mass, more preferably less than 20% by mass, and still more preferably less than 10% by mass, and particularly preferably, moisture is not substantially included.

The content of the organic solvent with respect to the organic developer is preferably 50% to 100% by mass, more preferably 80% to 100% by mass, still more preferably 90% to 100% by mass, and particularly preferably 95% to 100% by mass, with respect to the total amount of the developer.

The organic developer may include an appropriate amount of a known surfactant, as desired.

The content of the surfactant is usually 0.001% to 5% by mass, preferably 0.005% to 2% by mass, and still more preferably 0.01% to 0.5% by mass, with respect to the total amount of the developer.

The organic developer may include the above-mentioned acid diffusion control agent.

Examples of the developing method include a method in which a substrate is dipped in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate spun at a constant rate while scanning a developer jetting nozzle at a constant rate (a dynamic dispense method).

A combination of a step of performing development using an aqueous alkali solution (alkali developer) (alkali developing step) and a step of performing development using a developer including an organic solvent (organic developer) (organic solvent developing step) may be used. Thus, a finer pattern can be formed since a pattern can be formed by keeping only a region with an intermediate exposure intensity from not being dissolved.

It is preferable that the method includes a step of performing washing using a rinsing liquid (a rinsing step) after the developing step (iii).

As the rinsing liquid used in the rinsing step after the developing step with an alkali developer, for example, pure water can be used. The pure water may include an appropriate amount of a surfactant. In this case, after the developing step or the rinsing step, a treatment for removing the developer or the rinsing liquid adhering on a pattern by a supercritical fluid may be added. In addition, after the rinsing treatment or the treatment using a supercritical fluid, a heating treatment for removing moisture remaining in the pattern may be performed.

The rinsing liquid used in the rinsing step after the developing step with a developer including an organic solvent is not particularly limited as long as the rinsing liquid does not dissolve the pattern, and a solution including a common organic solvent, or the like can be used. As the rinsing liquid, a rinsing liquid including at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same solvents as the solvents described for the developer including an organic solvent.

As the rinsing liquid used in the rinsing step in this case, a rinsing liquid including a monohydric alcohol is more preferable.

Here, examples of the monohydric alcohol used in the rinsing step include linear, branched, or cyclic monohydric alcohols. Specific examples thereof include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol. Examples of the monohydric alcohol having 5 or more carbon atoms include 1-hexanol, 2-hexanol, 4-methyl-2-pentanol, 1-pentanol, 3-methyl-1-butanol, and methyl isobutyl carbinol.

The respective components in a plural number may be mixed or the components may also be used in admixture with an organic solvent other than the solvents.

A moisture content in the rinsing liquid used in the rinsing step after the developing step using the developer including the organic solvent is preferably 10% by mass or less, more preferably 5% by mass or less, and still more preferably 3% by mass or less. By setting the moisture content to 10% by mass or less, good development characteristics are obtained.

The rinsing liquid may include an appropriate amount of a surfactant.

In the rinsing step, the developed substrate is subjected to a washing treatment using a rinsing liquid. A method for the washing treatment is not particularly limited, but examples thereof include a method in which a rinsing liquid is continuously jetted on a substrate rotated at a constant rate (a rotation application method), a method in which a substrate is dipped in a tank filled with a rinsing liquid for a certain period of time (a dip method), and a method in which a rinsing liquid is sprayed on a substrate surface (a spray method). Among those, it is preferable that a washing treatment is carried out using the rotation application method, and a substrate is rotated at a rotation speed of 2,000 to 4,000 rpm after washing, thereby removing the rinsing liquid from the substrate. Furthermore, it is also preferable that the method includes a baking step after the rinsing step (postbaking). The developer and the rinsing liquid remaining between and inside the patterns are removed by the baking step. In the baking step after the rinsing step, the baking temperature is usually 40° C. to 160° C., and preferably 70° C. to 95° C., and the baking time is usually 10 seconds to 3 minutes, and preferably 30 to 90 seconds.

It is preferable that various materials (for example, a resist solvent, a developer, a rinsing liquid, a composition for forming an antireflection film, and a composition for forming a topcoat) used in the actinic ray-sensitive or radiation-sensitive resin composition of the embodiment of the present invention, and the pattern forming method of the embodiment of the present invention do not include impurities such as metal components, isomers, and residual monomers. The content of the impurities included in these materials is preferably 1 ppm or less, more preferably 100 ppt or less, and still more preferably 10 ppt or less, and particularly preferably, the impurities are not substantially included (no higher than a detection limit of a measurement device).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made, polyethylene-made, or nylon-made filter is preferable. As the filter, a filter which has been washed with an organic solvent in advance may be used. In the step of filtration using a filter, plural kinds of filters connected in series or in parallel may be used. In a case of using the plural kinds of filters, a combination of filters having different pore diameters and/or materials may be used. In addition, various materials may be filtered plural times, and the step of filtering plural times may be a circulatory filtration step. As the filter, a filter having a reduced amount of eluates as disclosed in the specification of JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used. Examples of the metal adsorbing material include the filters disclosed in the specification of JP2016-206500A.

In addition, examples of a method for reducing the impurities such as metals included in various materials include a method in which a raw material having a low metal content is selected as a raw material constituting various materials and the raw material constituting the various materials is subjected to filtration using a filter; and a method in which distillation under conditions suppressing contamination as much as possible by performing a lining with TEFLON (registered trademark), or the like in the inside of a device is performed. It is also preferable to carry out a glass lining treatment in all steps in a manufacturing facility for synthesizing various materials (a binder, PAG, and the like) of the resist component in order to reduce metals to a ppt order. Preferred conditions in the filtration using a filter to be performed on the raw material constituting the various materials are the same as the above-described conditions.

In order to prevent impurities from being incorporated, it is preferable that various materials are stored in the container described in the specification of US2015/0227049A, the specification of JP2015-123351A, or the like.

A method for improving the surface roughness of a pattern may be applied to a pattern formed by the pattern forming method of the embodiment of the present invention. Examples of the method for improving the surface roughness of a pattern include the method of treating a pattern by plasma of a hydrogen-containing gas, as disclosed in the specification of US2015/0104957A. In addition, known methods as described in the specification of JP2004-235468A, the specification of US2010/0020297A, and Proc. of SPIE Vol. 8328 83280N-1 "EUV Resist Curing Technique for LWR Reduction and Etch Selectivity Enhancement" may be applied.

In addition, a pattern formed by the method can be used as a core material (core) of the spacer process disclosed in, for example, the specification of JP1991-270227A (JP-H03-270227A) and the specification of US2013/0209941A.

[Method for Manufacturing Electronic Device]

Moreover, the present invention further relates to a method for manufacturing an electronic device, the method including the above-described pattern forming method. The electronic device manufactured by the method for manufacturing an electronic device of an embodiment of the present invention is suitably mounted on electric or electronic equipment (for example, home electronics, office automation (OA)-related equipment, media-related equipment, optical equipment, and telecommunication equipment).

EXAMPLES

Hereinbelow, the present invention will be described in more detail with reference to Examples. The materials, the amounts of materials used, the proportions, the treatment details, the treatment procedure, and the like shown in the Examples below may be modified as appropriate as long as the modifications do not depart from the spirit of the present invention. Therefore, the scope of the present invention should not be construed as being limited to the Examples shown below.

[Resin]

Monomers corresponding to the respective repeating units in resins P001 to P032 and resins CP001 to CP004 shown in Table 1 are shown below.

In addition, in the monomers shown below, M001 to M016 and M101 to M110 each correspond to a repeating unit represented by General Formula (B-1). Among those, M101 to M110 each correspond to the repeating unit represented by General Formula (B-1), which has an acid-decomposable group.

(M001)

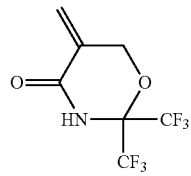

(M002)

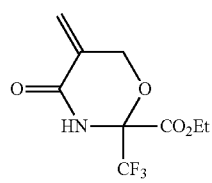

(M003)

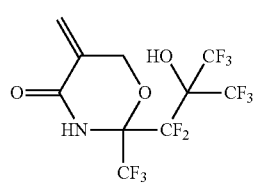

(M004)

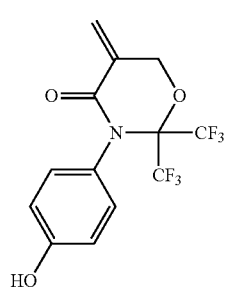

(M005)

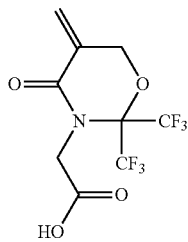

(M006)

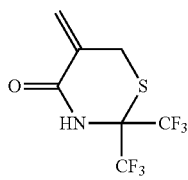

(M007)

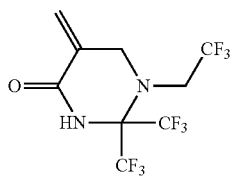

(M008)

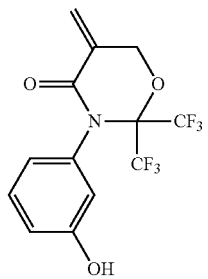

(M009)

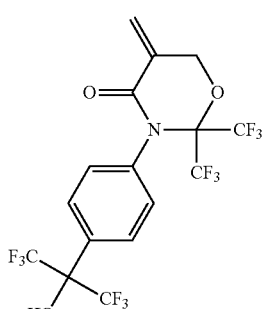

(M010)

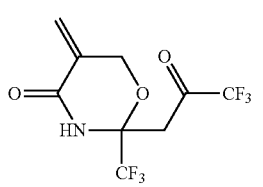

(M011)

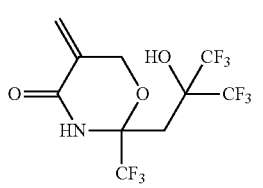

(M012) 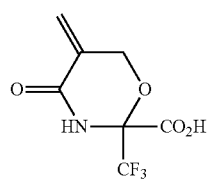
(M013) 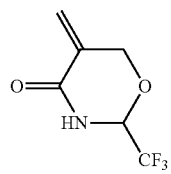
(M014) 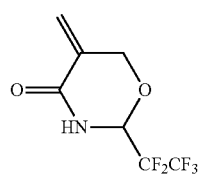
(M015) 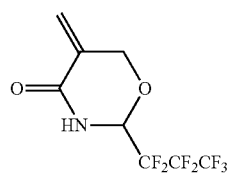
(M016) 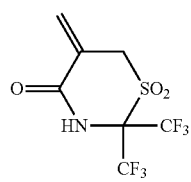
(M101) 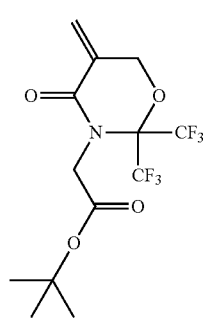
(M102) 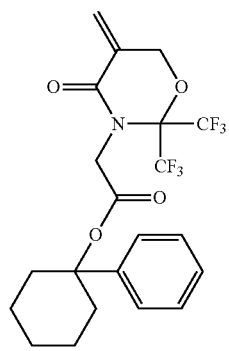
(M103) 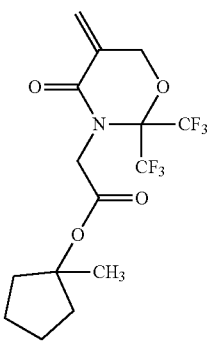
(M104) 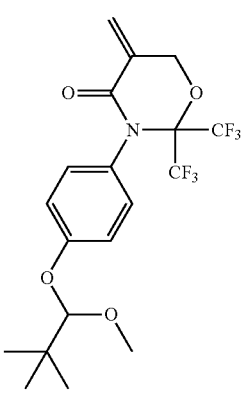
(M105) 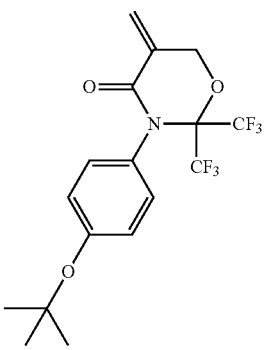
(M106) 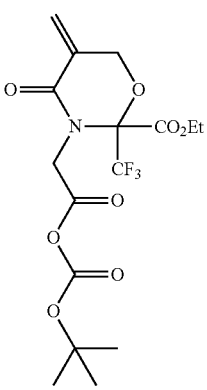

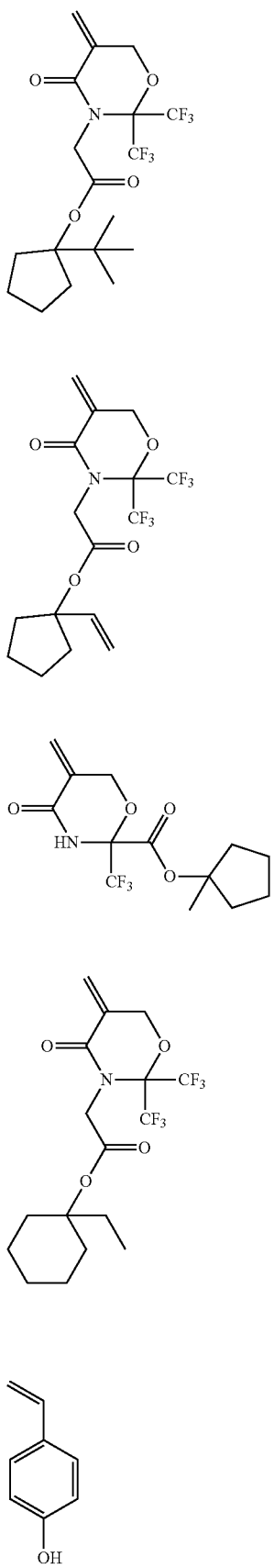
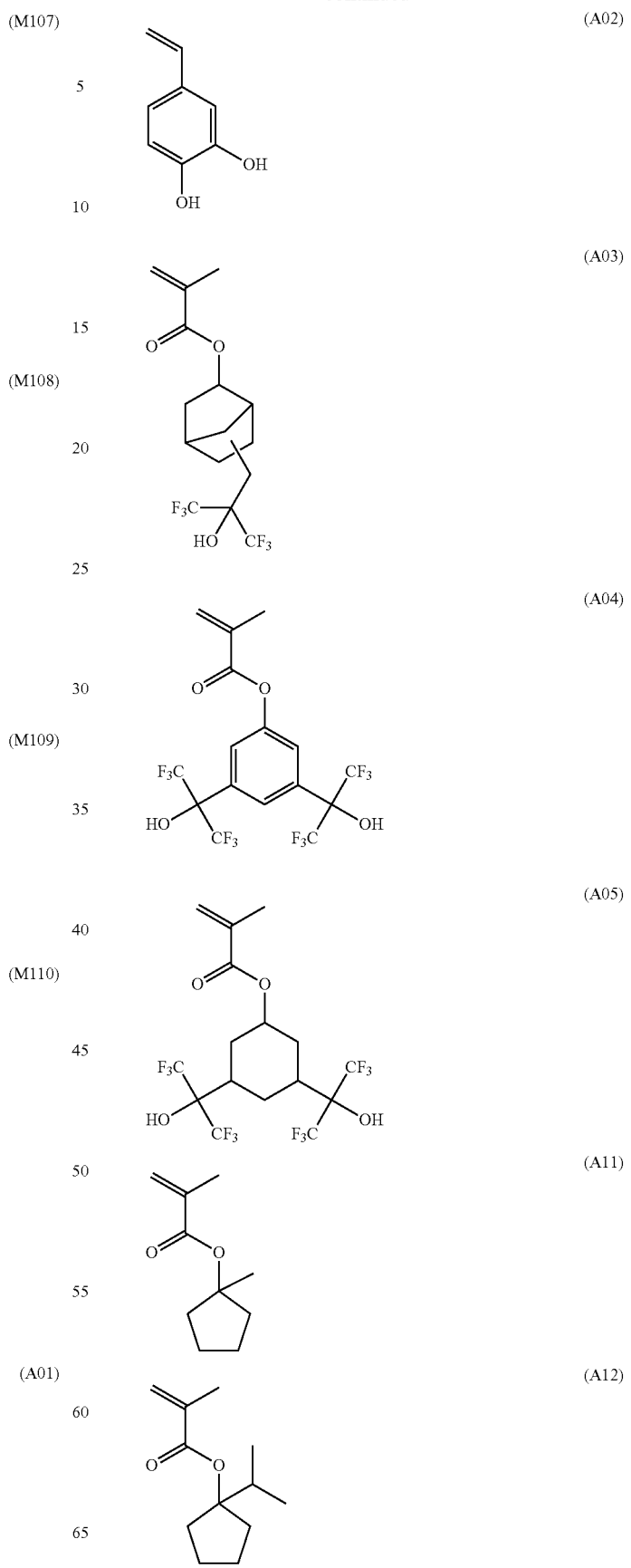

(A13)
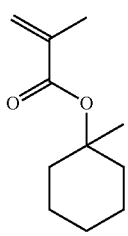

(A14)
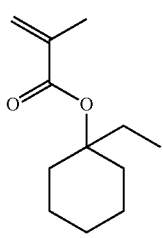

(A15)
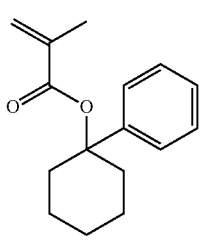

(A16)
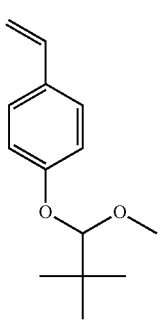

(A21)

(A31)

(A41)

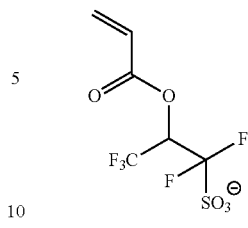

(A42)

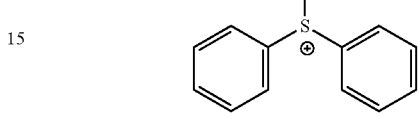

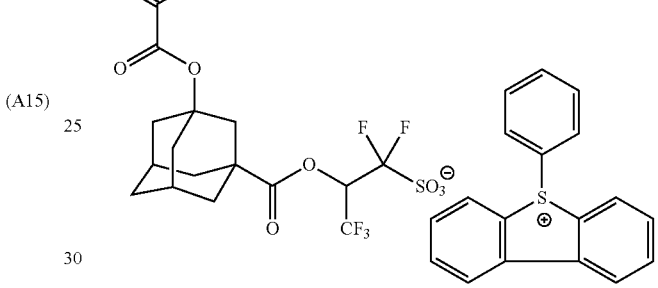

Synthesis Examples: Raw Material Monomer of Repeating Unit Represented by General Formula (B-1)

Among the repeating units, synthesis examples for the monomers to be used as a raw material of the repeating unit represented by General Formula (B-1) are shown.

Furthermore, Synthesis Examples of M001, M002, M003, M101, M005, M102, and M103 among M001 to M015 and M101 to M110 as mentioned above are shown as an example. Other monomers can also be synthesized according to Synthesis Examples described below.

Synthesis Example 1: Synthesis of M001

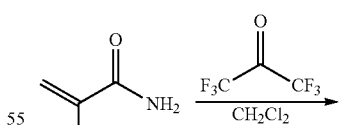
(M001B)

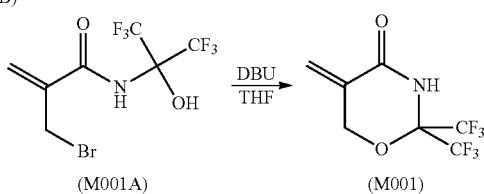
(M001A)  (M001)

Hexafluoroacetone trihydrate (35 g) was added dropwise to concentrated sulfuric acid (100 mL) to generate a hexafluoroacetone gas, which was introduced into a reaction vessel added with a mixed liquid of M001B (5.5 g) and a methylene chloride solution (100 mL). This mixed liquid was stirred at room temperature for 3 hours under a hexafluoroacetone gas atmosphere. The obtained solution was concentrated under reduced pressure to obtain M001A (11 g).

In a case where the obtained M001A was analyzed by a nuclear magnetic resonance (NMR) method, the following results were obtained.

$^1$H NMR (CDCl$_3$): 8.59 (s, 1H), 6.76 (bs, 1H), 6.02 (s, 1H), 5.94 (s, 1H), 4.17 (s, 2H)

M001A (11 g) and tetrahydrofuran (100 mL) were added to a flask, and the obtained mixed liquid was cooled to 0° C. Diazabicycloundecene (DBU) (5.3 g) was added dropwise thereto under cooling so that the temperature inside the flask did not exceed 10° C. After the dropwise addition, the mixed liquid was stirred at 0° C. for 30 minutes. 1 M aqueous hydrochloric acid (50 mL) and ethyl acetate (200 mL) were added thereto, the mixture was stirred, and then the aqueous phase was removed. The obtained organic phase was washed twice with saturated saline (50 mL), concentrated, and further purified by silica gel column chromatography to obtain M001 (3.7 g).

In a case where the obtained M001 was analyzed by the NMR method, the following results were obtained.

$^1$H NMR (DMSO-d6): 10.22 (s, 1H), 6.14 (s, 1H), 5.73 (s, 1H), 4.84 (s, 2H).

$^{19}$F NMR (DMSO-d6): −77.85 (s, 6F)

Synthesis Example 2: Synthesis of M002

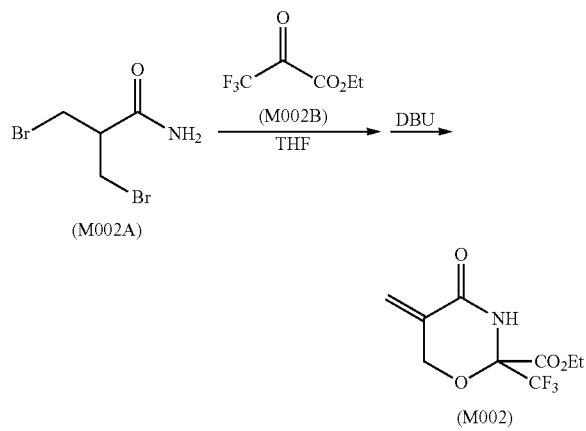

(M002A)

(M002)

M002A (2.25 g), M002B (1.71 g), and tetrahydrofuran (20 mL) were added to the flask, and the obtained mixed liquid was cooled to 0° C. DBU (4.7 g) was added dropwise thereto under cooling so that the temperature inside the flask did not exceed 10° C. After the dropwise addition, the mixed liquid was stirred at 0° C. for 30 minutes. 1 M aqueous hydrochloric acid (50 mL) and ethyl acetate (200 mL) were added thereto, the mixture was stirred, and then the aqueous phase was removed. The obtained organic phase was washed twice with saturated brine (50 mL), concentrated, and further purified by silica gel column chromatography to obtain M002 (1.2 g).

In a case where the obtained M002 was analyzed by the NMR method, the following results were obtained.

$^1$H NMR (CDCl$_3$): 6.75 (bs, 1H), 6.40 (s, 1H), 5.54 (s, 1H), 4.79 (d, 1H), 4.68 (d, 1H), 4.39 (q, 2H), 1.36 (t, 3H).

$^{19}$F NMR (CDCl$_3$): −80.04 (s, 3F)

Synthesis Example 3: Synthesis of M003

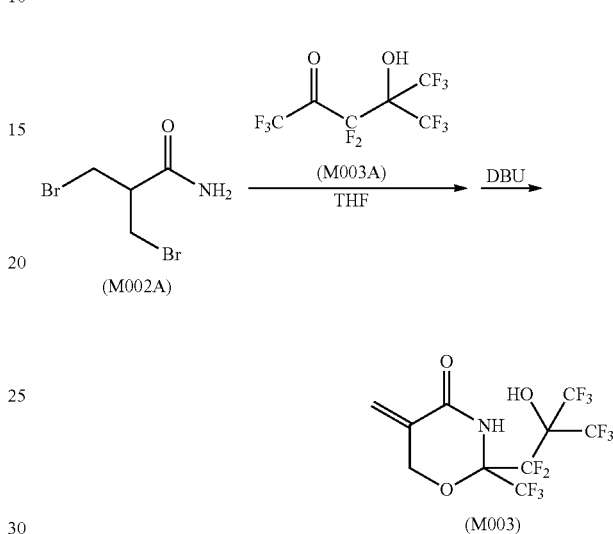

(M002A)

(M003)

M002A (9.2 g), M003A (11.0 g), and tetrahydrofuran (200 mL) were added to the flask, and the obtained mixed liquid was cooled to 0° C. DBU (42 g) was added dropwise thereto under cooling so that the temperature inside the flask did not exceed 10° C. After the dropwise addition, the mixed liquid was stirred at 0° C. for 30 minutes. 1 M aqueous hydrochloric acid (300 mL) and ethyl acetate (200 mL) were added thereto, the mixture was stirred, and then the aqueous phase was removed. The obtained organic phase was washed twice with saturated brine (200 mL), concentrated, and further purified by silica gel column chromatography to obtain M003 (2.0 g).

In a case where the obtained M003 was analyzed by the NMR method, the following results were obtained.

$^1$H NMR (CDCl$_3$): 6.78 (bs, 1H), 6.47 (s, 1H), 5.62 (s, 1H), 5.59 (bs, 1H), 4.95 (d, 1H), 4.85 (d, 1H).

$^{19}$F NMR (CDCl$_3$): −71.28 to −71.07 (m, 3F), −71.49 to −71.31 (m, 3F), −74.83 (t, 3F), −114.20~−112.89 (m, 2F),

Synthesis Example 4: Synthesis of M101

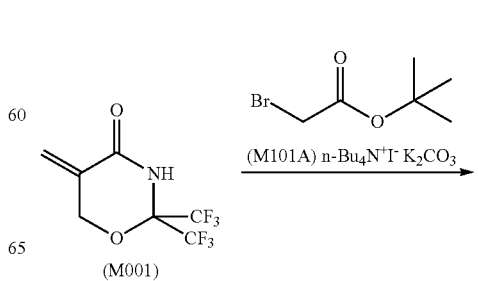

(M001)

98

Synthesis Example 6: Synthesis of M102

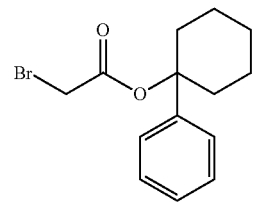

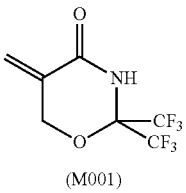

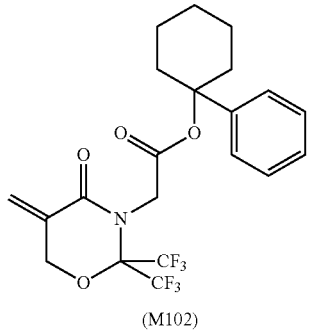

M102 was synthesized by performing the same procedure as in the synthesis of M101, except that an equimolar amount of M102A was used instead of M101A.

In a case where the obtained M102 was analyzed by the NMR method, the following results were obtained.

$^1$H NMR (CDCl$_3$): 7.27 to 7.37 (m, 4H), 7.21 to 7.26 (m, 1H), 6.13 (s, 1H), 5.48 (s, 1H).), 4.84 (s, 2H), 4.61 (s, 2H) 2.49 (d, 2H), 1.61 to 1.85 (m, 7H), 1.23 to 1.36 (m, 1H).

$^{19}$F NMR (CDCl$_3$): −77.94 (s, 6F)

Synthesis Example 7: Synthesis of M103

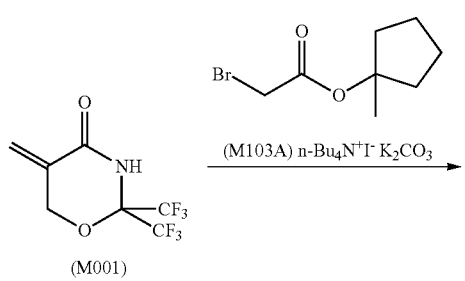

97

-continued

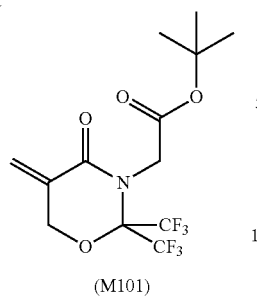

(M101)

M001 (13.0 g), M101A (10.2 g), potassium carbonate (14.4 g), tetrabutylammonium iodide (3.9 g), and acetone (234 g) were added to the flask, and the obtained mixed liquid was stirred at room temperature for 8 hours. Pure water (300 mL) and ethyl acetate (200 mL) were added thereto, the mixture was stirred, and then the aqueous phase was removed. The obtained organic phase was washed twice with saturated brine (200 mL), concentrated, and further purified by silica gel column chromatography to obtain M101 (17.4 g).

In a case where the obtained M101 was analyzed by the NMR method, the following results were obtained.

$^1$H NMR (CDCl$_3$): 6.18 (s, 1H), 5.53 (s, 1H), 4.69 (s, 2H), 4.54 (s, 2H), 1.47 (s, 9H).

$^{19}$F NMR (CDCl$_3$): −78.04 (s, 6F)

Synthesis Example 5: Synthesis of M005

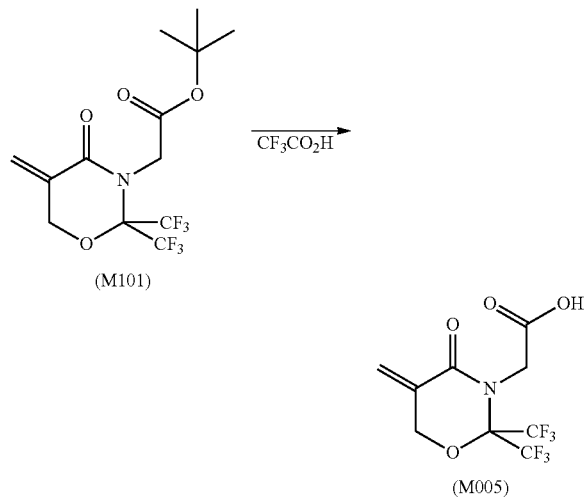

Trifluoroacetic acid (10.22 g) was added to the flask and cooled to 0° C. M101 (7.94 g) was added thereto under cooling so that the temperature inside the flask did not exceed 10° C. to obtain a reaction solution. The obtained reaction solution was heated to 40° C. and stirred for 3 hours. The reaction solution was concentrated under reduced pressure, and the obtained residue was purified by silica gel column chromatography to give M005 (5.3 g).

In a case where the obtained M005 was analyzed by the NMR method, the following results were obtained.

$^1$H NMR (CDCl$_3$): 10.13 (bs, 1H), 6.19 (s, 1H), 5.56 (s, 1H), 4.85 (s, 2H), 4.62 (s, 2H).

$^{19}$F NMR (CDCl$_3$): −78.16 (s, 6F)

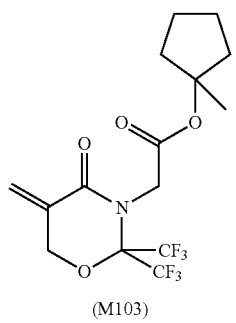

(M103)

M103 was synthesized by performing the same procedure as in the synthesis of M101, except that an equimolar amount of M103A was used instead of M101A.

In a case where the obtained M103 was analyzed by the NMR method, the following results were obtained.

$^1$H NMR (CDCl$_3$): 6.18 (s, 1H), 5.53 (s, 1H), 4.70 (s, 2H), 4.64 (s, 2H) 2.08 to 2.16 (M, 2H), 1.60 to 1.76 (m, 6H), 1.56 (s, 3H).

$^{19}$F NMR (CDCl$_3$): −78.06 (s, 6F)

Another monomer corresponding to the repeating unit represented by General Formula (B-1) was synthesized with reference to Synthesis Examples as described above.

<Synthesis of Resin>

(Synthesis of P001)

M001 (16.7 g), A11 (10.0 g), A21 (6.7 g), and a polymerization initiator V-601 (manufactured by FUJIFILM Wako Pure Chemical Corporation) (4.61 g) were dissolved in cyclohexanone (54.6 g). A solution thus obtained was taken as a monomer solution.

Cyclohexanone (23.4 g) was put in a reaction vessel, and the temperature in the system was adjusted to 85° C. The monomer solution was added dropwise to the reaction vessel in a nitrogen gas atmosphere for 4 hours. This was used as a reaction solution. The reaction solution was stirred at 85° C. for 2 hours in the reaction vessel and then left to be cooled until the temperature reached room temperature.

The reaction solution after being left to be cooled was added dropwise to a mixed liquid of methanol and water (methanol/water=7/3 (mass ratio)) over 20 minutes, and the precipitated powder was collected by filtration. The obtained powder was dried to obtain a polymer P001 (15.5 g).

With regard to the compositional ratio (mass ratio) of the repeating units in the polymer P001 determined by the NMR method, the compositional ratio of the repeating units corresponding to M001, A11, and A21 was 45/40/15 in order from the left.

The weight-average molecular weight (Mw) of in terms of standard polystyrene and the dispersity (Mw/Mn) of the polymer P001 were 5,500 and 1.6, respectively.

(Synthesis of P002 to P036 and CP001 to CP004)

The other resins were synthesized by the same procedure as for the polymer P001 or by the procedure in the related art.

The compositional ratios (mass ratios), the weight-average molecular weights (Mw), the dispersities (Mw/Mn), and the glass transition temperatures (Tg) of the respective resins are shown in Table 1. The compositional ratios correspond to the respective repeating units in the order from the left side.

TABLE 1

| | Compositional ratio of monomers | Compositional ratio (% by mass) | Mw | Mw/Mn | Tg [° C.] |
|---|---|---|---|---|---|
| P001 | M001/A11/A21 | 45/40/15 | 5,500 | 1.6 | 134 |
| P002 | M002/A11/A21 | 45/40/15 | 5,500 | 1.6 | 135 |
| P003 | M003/A11/A21 | 45/40/15 | 5,500 | 1.6 | 138 |
| P004 | M004/A11/A21 | 40/40/20 | 6,000 | 1.7 | 125 |
| P005 | M005/A12/A21 | 40/40/20 | 6,500 | 1.6 | 134 |
| P006 | M006/A13/A21 | 40/40/20 | 6,000 | 1.6 | 135 |
| P007 | M007/A14/A21 | 40/40/20 | 7,000 | 1.6 | 131 |
| P008 | M008/A15/A21 | 40/40/20 | 6,000 | 1.6 | 137 |
| P009 | M009/A15/A21 | 40/40/20 | 6,000 | 1.6 | 134 |
| P010 | M010/A12/A21 | 40/40/20 | 28,000 | 1.6 | 123 |
| P011 | M011/A11/A21 | 40/40/20 | 6,000 | 1.6 | 138 |
| P012 | M012/A11/A21 | 45/40/15 | 5,500 | 1.6 | 134 |
| P013 | M013/A11/A21 | 40/40/20 | 6,000 | 1.6 | 131 |
| P014 | M014/A11/A21 | 40/40/20 | 6,500 | 1.7 | 124 |
| P015 | M015/A11/A21 | 40/40/20 | 6,000 | 1.7 | 123 |
| P016 | M001/A11/A01 | 40/40/20 | 6,000 | 1.6 | 139 |
| P017 | M001/A11/A02 | 40/40/20 | 6,000 | 1.6 | 134 |
| P018 | M001/A11/A03 | 40/40/20 | 7,000 | 1.6 | 135 |
| P019 | M003/A11/A04 | 40/40/20 | 6,000 | 1.6 | 132 |
| P020 | M003/A11/A05 | 40/40/20 | 6,000 | 1.6 | 132 |
| P021 | M003/A16/A05 | 40/40/20 | 6,000 | 1.6 | 135 |
| P022 | A01/M101 | 60/40 | 6,000 | 1.6 | 129 |
| P023 | A01/M102 | 60/40 | 6,000 | 1.6 | 124 |
| P024 | A01/M103 | 60/40 | 6,000 | 1.6 | 125 |
| P025 | A01/M104 | 60/40 | 6,000 | 1.6 | 127 |
| P026 | A01/M105 | 60/40 | 6,000 | 1.6 | 123 |
| P027 | A01/M106 | 60/40 | 6,000 | 1.6 | 128 |
| P028 | A01/M107 | 60/40 | 6,000 | 1.6 | 124 |
| P029 | A01/M108 | 60/40 | 6,000 | 1.6 | 122 |
| P030 | A01/M109 | 60/40 | 6,000 | 1.6 | 128 |
| P031 | A05/M110 | 60/40 | 6,500 | 1.6 | 129 |
| P032 | M001/M110 | 60/40 | 6,000 | 1.6 | 135 |
| P033 | M016/A11/A21 | 40/40/20 | 6,500 | 1.6 | 137 |
| CP001 | A31/A11/A21 | 40/40/20 | 6,000 | 1.6 | 119 |
| CP002 | A31/A11/A21 | 45/40/15 | 5,500 | 1.6 | 118 |
| CP003 | A01/A31/A21 | 20/40/40 | 6,000 | 1.6 | 115 |
| CP004 | A05/A31/A21 | 20/40/40 | 6,500 | 1.6 | 117 |
| P034 | M001/A11/A21/41 | 40/30/25/5 | 7,500 | 1.7 | 138 |
| P035 | M001/A11/A21/42 | 40/30/25/5 | 7,500 | 1.7 | 135 |
| P036 | M001/A04/A11 | 30/40/30 | 7,000 | 1.7 | 134 |

[Photoacid Generator]

The structures of the photoacid generators used in Examples are shown below. In addition, the cationic moieties and the anionic moieties of the photoacid generators are each individually shown below.

(Cationic Moiety of Photoacid Generator)

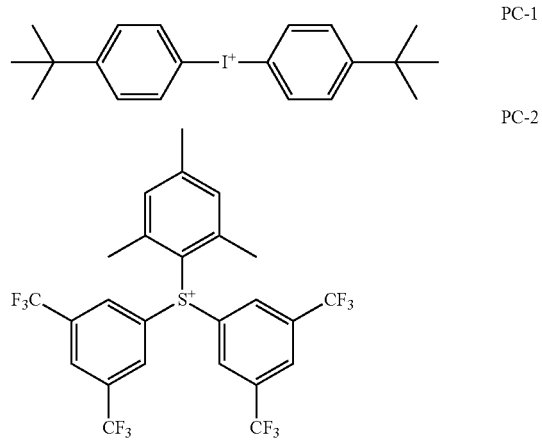

101
-continued
PC-3
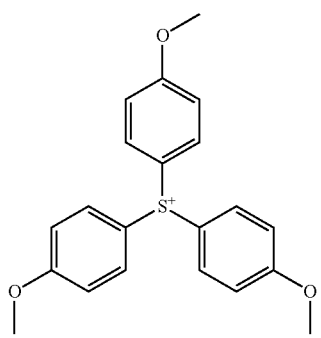
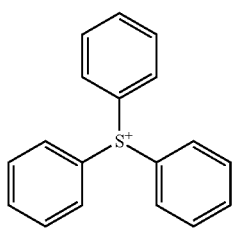
(Anionic Moiety of Photoacid Generator)
PA-1
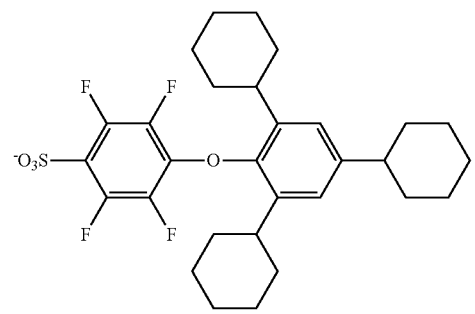
PA-2
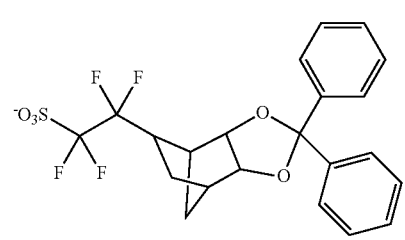
PA-3
102
-continued
PA-4
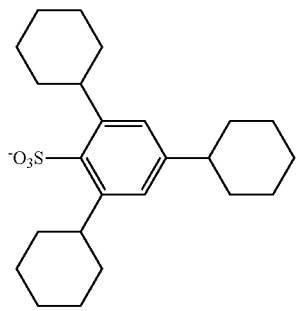
PA-5
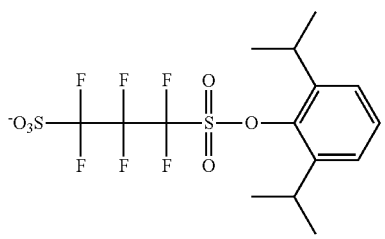
PA-6
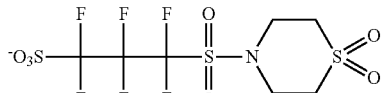
PA-7
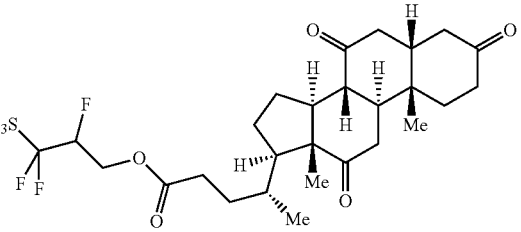
PA-8
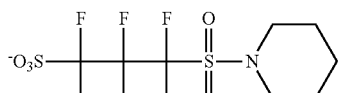
PA-9
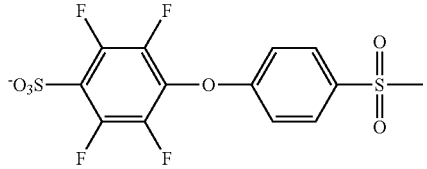
PA-10
Furthermore, the volume and the pKa of an acid generated by the photoacid generator depending on the type of the anionic moiety contained in the photoacid generator are as shown below.

| | Volume [Å³] | pKa |
|---|---|---|
| PA-1 | 260 | −2.4 |
| PA-2 | 493 | −2.0 |
| PA-3 | 371 | −2.8 |
| PA-4 | 392 | −0.2 |
| PA-5 | 350 | −3.4 |
| PA-6 | 272 | −3.3 |
| PA-7 | 491 | −2.9 |
| PA-8 | 256 | −3.3 |
| PA-9 | 275 | −2.2 |
| PA-10 | 163 | −11.6 |

[Acid Diffusion Control Agent]

The structures of the acid diffusion control agents shown in Table 2 are shown below.

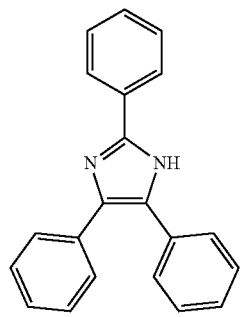

Q-1

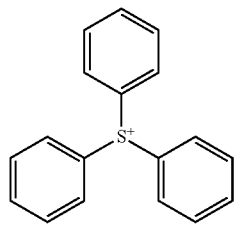

Q-2

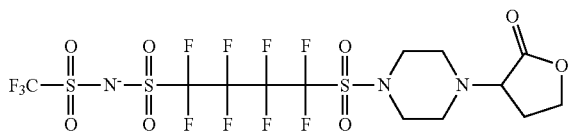

Q-3

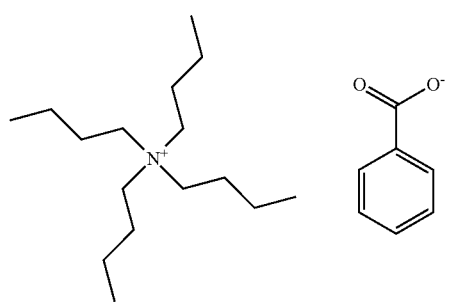

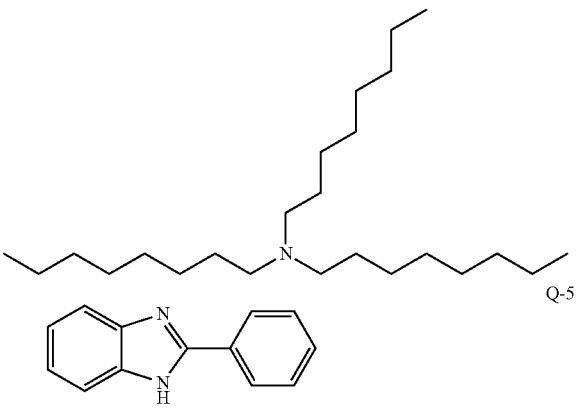

Q-4

Q-5

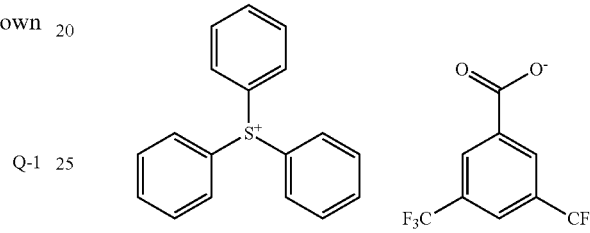

Q-6

[Surfactant]

The surfactants shown in Table 2 are shown below.

W-1: MEGAFACE F176 (manufactured by DIC Corporation; fluorine-based)

W-2: MEGAFACE R08 (manufactured by DIC Corporation; fluorine- and silicon-based)

[Solvent]

The solvents shown in Table 2 are shown below.

SL-1: Propylene glycol monomethyl ether acetate (PGMEA)

SL-2: Propylene glycol monomethyl ether (PGME)

SL-3: Ethyl lactate

SL-4: γ-Butyrolactone

[Preparation of Composition]

<Preparation of Actinic Ray-Sensitive or Radiation-Sensitive Resin Composition>

The respective components shown in Table 2 were mixed so as to satisfy a concentration of solid contents of 1.5% by mass and have the composition shown in Table 2. Then, the obtained mixed liquid was filtered through a polyethylene filter having a pore size of 0.03 μm to prepare actinic ray-sensitive or radiation-sensitive resin compositions (hereinafter also referred to as "compositions") R001 to R036, and CR001 to CR004.

In addition, in the composition, the solid content means all the components excluding the solvent. The obtained composition was used in Examples and Comparative Examples.

Moreover, the contents (mass %) o the respective components described in the following columns of "Resin", "Photoacid generator", "Acid diffusion control agent", and "Surfactant" indicate the ratios of the respective components with respect to the total solid content.

TABLE 2

| | | Solid content | | | | | | | | |
|---|---|---|---|---|---|---|---|---|---|---|
| | | Resin | | Photoacid generator | | | Acid diffusion control agent | | Surfactant | | |
| | Type | Content (% by mass) | Cationic moiety | Anionic moiety | Content (% by mass) | Type | Content (% by mass) | Type | Content (% by mass) | Solvent Type (mass ratio) |
| R001 | P001 | 80 | PC-4 | PA-1 | 15 | Q-6 | 5 | — | — | SL-1/SL-2 (80/20) |
| R002 | P002 | 80 | PC-4 | PA-1 | 15 | Q-6 | 5 | — | — | SL-1/SL-2 (80/20) |
| R003 | P003 | 80 | PC-4 | PA-1 | 15 | Q-6 | 5 | — | — | SL-1/SL-2 (80/20) |
| R004 | P004 | 80 | PC-1 | PA-1 | 15 | Q-1 | 5 | — | — | SL-1/SL-2 (80/20) |
| R005 | P005 | 80 | PC-2 | PA-1 | 15 | Q-6 | 5 | — | — | SL-1/SL-2 (80/20) |
| R006 | P006 | 80 | PC-3 | PA-1 | 15 | Q-6 | 5 | — | — | SL-1/SL-2 (80/20) |
| R007 | P007 | 80 | PC-4 | PA-1 | 15 | Q-6 | 5 | — | — | SL-1/SL-2 (80/20) |
| R008 | P008 | 80 | PC-4 | PA-1 | 15 | Q-6 | 5 | — | — | SL-1/SL-2 (80/20) |
| R009 | P009 | 80 | PC-4 | PA-1 | 15 | Q-6 | 5 | — | — | SL-1/SL-2 (80/20) |
| R010 | P010 | 80 | PC-4 | PA-1 | 15 | Q-6 | 5 | — | — | SL-1/SL-2 (80/20) |
| R011 | P011 | 80 | PC-4 | PA-1 | 15 | Q-6 | 5 | — | — | SL-1/SL-2 (80/20) |
| R012 | P012 | 80 | PC-4 | PA-6 | 15 | Q-6 | 5 | — | — | SL-1/SL-2 (80/20) |
| R013 | P013 | 80 | PC-4 | PA-7 | 15 | Q-6 | 5 | — | — | SL-1/SL-2 (80/20) |
| R014 | P014 | 80 | PC-4 | PA-1 | 15 | Q-6 | 5 | — | — | SL-1/SL-2 (80/20) |
| R015 | P015 | 80 | PC-4 | PA-1 | 15 | Q-6 | 5 | — | — | SL-1/SL-2 (80/20) |
| R016 | P016 | 80 | PC-4 | PA-8 | 15 | Q-6 | 5 | — | — | SL-1/SL-2 (80/20) |
| R017 | P017 | 80 | PC-4 | PA-1 | 15 | Q-6 | 5 | — | — | SL-1/SL-2 (80/20) |
| R018 | P018 | 80 | PC-4 | PA-9 | 15 | Q-6 | 5 | — | — | SL-1/SL-2 (80/20) |
| R019 | P019 | 80 | PC-4 | PA-1 | 15 | Q-6 | 5 | — | — | SL-1/SL-2 (80/20) |
| R020 | P020 | 80 | PC-4 | PA-1 | 15 | Q-6 | 5 | — | — | SL-1/SL-2 (80/20) |
| R021 | P021 | 80 | PC-4 | PA-4 | 15 | Q-6 | 5 | — | — | SL-1/SL-2 (80/20) |
| R022 | P022 | 80 | PC-4 | PA-1 | 15 | Q-6 | 5 | — | — | SL-1/SL-2 (80/20) |
| R023 | P023 | 70 | PC-4 | PA-2 | 20 | Q-6 | 10 | — | — | SL-1/SL-2 (80/20) |
| R024 | P024 | 80 | PC-4 | PA-3 | 15 | Q-6 | 5 | — | — | SL-1/SL-2 (80/20) |
| R025 | P025 | 80 | PC-4 | PA-4 | 15 | Q-6 | 5 | — | — | SL-1/SL-2 (80/20) |
| R026 | P026 | 80 | PC-4 | PA-5 | 15 | Q-6 | 5 | — | — | SL-1/SL-2 (70/30) |
| R027 | P027 | 80 | PC-4 | PA-1/PA-4 | 7.5/7.5 | Q-1 | 5 | — | — | SL-1/SL-2 (80/20) |
| R028 | P028 | 80 | PC-4 | PA-1 | 15 | Q-2 | 5 | — | — | SL-1/SL-2 (80/20) |
| R029 | P029 | 80 | PC-4 | PA-1 | 15 | Q-3 | 5 | — | — | SL-1/SL-2 (80/20) |
| R030 | P030 | 80 | PC-4 | PA-1 | 15 | Q-4 | 5 | — | — | SL-1/SL-2 (80/20) |
| R031 | P031 | 79.5 | PC-4 | PA-1 | 15 | Q-5 | 5 | W-1 | 0.5 | SL-3/SL-4 (45/55) |
| R032 | P032 | 79.5 | PC-4 | PA-1 | 15 | Q-6 | 5 | W-2 | 0.5 | SL-1/SL-2 (80/20) |
| R033 | P033 | 80 | PC-4 | PA-1 | 15 | Q-6 | 5 | — | — | SL-1/SL-2 (80/20) |
| CR001 | CP001 | 80 | PC-4 | PA-1 | 15 | Q-1 | 5 | — | — | SL-1/SL-2 (80/20) |
| CR002 | CP002 | 80 | PC-4 | PA-1 | 15 | Q-1 | 5 | — | — | SL-1/SL-2 (80/20) |
| CR003 | CP003 | 80 | PC-4 | PA-1 | 15 | Q-1 | 5 | — | — | SL-1/SL-2 (80/20) |
| CR004 | CP004 | 80 | PC-4 | PA-1 | 15 | Q-1 | 5 | — | — | SL-1/SL-2 (80/20) |
| R034 | P034 | 80 | PC-4 | PA-1 | 15 | Q-6 | 5 | — | — | SL-1/SL-2 (80/20) |
| R035 | P035 | 80 | PC-4 | PA-1 | 15 | Q-6 | 5 | — | — | SL-1/SL-2 (80/20) |
| R036 | P036 | 80 | PC-4 | PA-1/PA-10 | 7.5/7.5 | Q-6 | 5 | — | — | SL-1/SL-2 (80/20) |

<Pattern Formation>
(EUV Exposure)

The prepared composition was uniformly applied onto a hexamethyldisilazane-treated silicon substrate, using a spin coater. Then, the composition was heated and dried at 120° C. for 90 seconds on a hot plate to form a resist film with a film thickness of 35 nm.

The resist film was subjected to exposure (pattern exposure) through a reflective mask with a pitch of 50 nm and a line width of 25 nm, using an EUV exposure machine (manufactured by ASML; NXE3350, NA 0.33, Dipole 90°, outer sigma 0.87, inner sigma 0.35). Then, the resist film was baked (post-exposure baking (PEB)) at 120° C. for 60 second.

Subsequently, the resist film was puddle-developed for 30 seconds using a 2.38%-by-mass aqueous tetramethylammonium hydroxide solution as a developer, and rinsed by puddling for 20 seconds using pure water as a rinsing liquid, and then the silicon wafer was rotated at 30 seconds at a rotation speed of 4,000 rpm to form a line-and-space pattern.

<Electron Beam (EB) Exposure>

The prepared composition was uniformly applied onto a hexamethyldisilazane-treated silicon substrate, using a spin coater. Then, the composition was heated and dried at 120° C. for 90 seconds on a hot plate to form a resist film with a film thickness of 35 nm. The obtained resist film was irradiated with electron beams through a 6% halftone mask with a line width of 24 nm and a 1:1 line-and-space pattern, using an electron beam irradiation device (HL750 manufactured by Hitachi, Ltd., accelerating voltage of 50 keV). Immediately after irradiation, the resist film was heated on a hot plate at 110° C. for 60 seconds. The resist film was further developed at 23° C. for 60 seconds using a 2.38%-by-mass aqueous tetramethylammonium hydroxide (TMAH) solution, rinsed by puddling for 30 seconds using pure water, and then spin-dried to obtain a positive tone pattern.

[Evaluation]
<Sensitivity>

In the pattern formation by the EUV exposure as mentioned above, a line-and-space pattern was prepared while changing the exposure dose. The line width of the obtained pattern was measured, and the exposure dose in a case where the line width was 25 nm was determined and defined as a sensitivity (mJ/cm$^2$). A smaller value thereof indicates that the resist exhibits a higher sensitivity and has better performance.

107

<LER (LER Performance)>

A line-and-space pattern resolved at an optimal exposure dose (an exposure dose at which the line width of a pattern thus obtained reached 25 nm in a case of EUV exposure, and an exposure dose at which the line width of a pattern thus obtained reached 24 nm in a case of EB exposure) was observed from an upper part thereof using a critical dimension scanning electron microscope (SEM: CG-4100 manufactured by Hitachi High Technologies Corporation). At the time of observing from the top of the pattern, a distance from a center of the pattern to the edge was measured at any 100 points and a measurement variation 3σ (nm) thereof was evaluated as LER. The smaller the LER value, the better the LER performance.

<Marginal Pattern Width (Collapse Suppressing Ability)>

The line width of a line-and-space pattern was changed while an exposure dose upon exposure was changed. At this time, a minimum line width with which the pattern was resolved without a collapse over 10 μm square was defined as a marginal pattern width. A smaller value thereof indicates that a margin of the pattern collapse is wider and the pattern collapse suppressing ability is better.

108

[Results]

<EUV Exposure (LER Performance, Collapse Suppressing Ability)>

The evaluation results with regard to the LER (LER performance) and the marginal pattern width (collapse suppressing ability) in a case where the pattern is formed by EUV exposure are shown in Table 3.

In the table, the column "B-1" shows a monomer corresponding to the repeating unit represented by General Formula (B-1) contained in the resin in the composition.

The description of the number in the column of "$R^2$ and $R^3$" indicates the number of groups representing an electron-withdrawing group in the groups corresponding to $R^2$ and $R^3$ of the repeating unit represented by General Formula (B-1) contained in the resin. For example, a case where the value of "1" is described indicates that only one of $R^2$ and $R^3$ is an electron-withdrawing group, and a case where the value of "2" is described indicates that both $R^2$ and $R^3$ are electron-withdrawing groups.

The column "Tg" shows the glass transition temperature (Tg) (° C.) of the resin used.

TABLE 3

| | | | Solid content of composition | | | | | | Evaluation results | |
| | | | Resin | | | | Photoacid generator | Acid diffusion | | | Marginal |
| Composition | Type | B-1 | $R^2$, $R^3$ | Tg (° C.) | Cationic moiety | Anionic moiety | control agent Type | Surfactant Type | LER | pattern width |
|---|---|---|---|---|---|---|---|---|---|---|
| Example 001 | R001 | P001 | M001 | 2 | 134 | PC-4 | PA-1 | Q-6 | — | 4.0 | 18 |
| Example 002 | R002 | P002 | M002 | 2 | 135 | PC-4 | PA-1 | Q-6 | — | 4.1 | 18 |
| Example 003 | R003 | P003 | M003 | 2 | 138 | PC-4 | PA-1 | Q-6 | — | 4.0 | 18 |
| Example 004 | R004 | P004 | M004 | 2 | 125 | PC-1 | PA-1 | Q-1 | — | 4.2 | 18 |
| Example 005 | R005 | P005 | M005 | 2 | 134 | PC-2 | PA-1 | Q-6 | — | 4.5 | 20 |
| Example 006 | R006 | P006 | M006 | 2 | 135 | PC-3 | PA-1 | Q-6 | — | 4.2 | 19 |
| Example 007 | R007 | P007 | M007 | 2 | 131 | PC-4 | PA-1 | Q-6 | — | 4.1 | 18 |
| Example 008 | R008 | P008 | M008 | 2 | 137 | PC-4 | PA-1 | Q-6 | — | 4.3 | 18 |
| Example 009 | R009 | P009 | M009 | 2 | 134 | PC-4 | PA-1 | Q-6 | — | 4.1 | 19 |
| Example 010 | R010 | P010 | M010 | 2 | 123 | PC-4 | PA-1 | Q-6 | — | 4.6 | 20 |
| Example 011 | R011 | P011 | M011 | 2 | 138 | PC-4 | PA-1 | Q-6 | — | 4.0 | 19 |
| Example 012 | R012 | P012 | M012 | 2 | 134 | PC-4 | PA-6 | Q-6 | — | 4.1 | 18 |
| Example 013 | R013 | P013 | M013 | 1 | 131 | PC-4 | PA-7 | Q-6 | — | 4.2 | 18 |
| Example 014 | R014 | P014 | M014 | 1 | 124 | PC-4 | PA-1 | Q-6 | — | 4.7 | 20 |
| Example 015 | R015 | P015 | M015 | 1 | 123 | PC-4 | PA-1 | Q-6 | — | 4.5 | 21 |
| Example 016 | R016 | P016 | M001 | 2 | 139 | PC-4 | PA-8 | Q-6 | — | 4.1 | 18 |
| Example 017 | R017 | P017 | M001 | 2 | 134 | PC-4 | PA-1 | Q-6 | — | 4.1 | 18 |
| Example 018 | R018 | P018 | M001 | 2 | 135 | PC-4 | PA-9 | Q-6 | — | 4.1 | 19 |
| Example 019 | R019 | P019 | M003 | 2 | 132 | PC-4 | PA-1 | Q-6 | — | 4.2 | 18 |
| Example 020 | R020 | P020 | M003 | 2 | 132 | PC-4 | PA-1 | Q-6 | — | 4.1 | 18 |
| Example 021 | R021 | P021 | M003 | 2 | 135 | PC-4 | PA-4 | Q-6 | — | 4.0 | 19 |
| Example 022 | R022 | P022 | M101 | 2 | 129 | PC-4 | PA-1 | Q-6 | — | 4.5 | 21 |
| Example 023 | R023 | P023 | M102 | 2 | 124 | PC-4 | PA-2 | Q-6 | — | 4.6 | 20 |
| Example 024 | R024 | P024 | M103 | 2 | 125 | PC-4 | PA-3 | Q-6 | — | 4.7 | 20 |
| Example 025 | R025 | P025 | M104 | 2 | 127 | PC-4 | PA-4 | Q-6 | — | 4.5 | 21 |
| Example 026 | R026 | P026 | M105 | 2 | 123 | PC-4 | PA-5 | Q-6 | — | 4.6 | 20 |
| Example 027 | R027 | P027 | M106 | 2 | 128 | PC-4 | PA-1/PA-4 | Q-1 | — | 4.6 | 20 |
| Example 028 | R028 | P028 | M107 | 2 | 124 | PC-4 | PA-1 | Q-2 | — | 4.7 | 21 |
| Example 029 | R029 | P029 | M108 | 2 | 122 | PC-4 | PA-1 | Q-3 | — | 4.8 | 21 |
| Example 030 | R030 | P030 | M109 | 2 | 128 | PC-4 | PA-1 | Q-4 | — | 4.4 | 20 |
| Example 031 | R031 | P031 | M110 | 2 | 129 | PC-4 | PA-1 | Q-5 | W-1 | 4.6 | 21 |
| Example 032 | R032 | P032 | M001/M110 | 2 | 135 | PC-4 | PA-1 | Q-6 | W-2 | 4.1 | 20 |
| Example 033 | R033 | P033 | M016 | 2 | 137 | PC-4 | PA-1 | Q-6 | — | 4.2 | 18 |
| Comparative Example 001 | CR001 | CP001 | — | — | 119 | PC-4 | PA-1 | Q-1 | — | 5.1 | 24 |
| Comparative Example 002 | CR002 | CP002 | — | — | 118 | PC-4 | PA-1 | Q-1 | — | 5.0 | 25 |
| Comparative Example 003 | CR003 | CP003 | — | — | 115 | PC-4 | PA-1 | Q-1 | — | 5.6 | 24 |
| Comparative Example 004 | CR004 | CP004 | — | — | 117 | PC-4 | PA-1 | Q-1 | — | 5.7 | 25 |
| Example 034 | R034 | P034 | M001 | 2 | 138 | PC-4 | PA-1 | Q-6 | — | 4.0 | 19 |
| Example 035 | R035 | P035 | M001 | 2 | 135 | PC-4 | PA-1 | Q-6 | — | 4.0 | 19 |
| Example 036 | R036 | P036 | M001 | 2 | 134 | PC-4 | PA-1/PA-10 | Q-6 | — | 4.1 | 18 |

From the results shown in the table, it was confirmed that the composition of the embodiment of the present invention is excellent in LER performance and a collapse suppressing ability.

From the results of Examples 001, 002, 003, 011, 014, and 015, it was confirmed that in a case where both $R^2$ and $R^3$ in the repeating unit represented by General Formula (B-1) are electron-withdrawing groups, the LER performance and the collapse suppressing ability of the composition were more excellent.

It was confirmed that in a case where the Tg of the resin used was 130° C. or higher, the LER performance and the collapse suppressing ability of the composition are more excellent.

(Comparison Among Test Results of Compositions Using PC-4 in Cationic Moiety of Photoacid Generator, PA-1 in Anionic Moiety of Photoacid Generator, and Q-6 as Acid Diffusion Control Agent)

<EUV Exposure (Sensitivity)>

The evaluation results with regard to the sensitivity in a case where a pattern is formed by EUV exposure are shown in Table 4.

In the table, the column "B-1" shows a monomer corresponding to the repeating unit represented by General Formula (B-1) contained in the resin in the composition.

The column of "F atom content in resin" is intended to mean the content (% by mass) of fluorine atoms contained in the resin in the composition, with respect to all the repeating units.

TABLE 4

| | | Resin in composition | | F atom content (% by mass) | Sensitivity |
|---|---|---|---|---|---|
| | Composition | Type | B-1 | in resin | (mJ/cm²) |
| Example 001 | R001 | P001 | M001 | 20.6 | 35 |
| Example 002 | R002 | P002 | M002 | 10.1 | 40 |
| Example 003 | R003 | P003 | M003 | 23.7 | 30 |
| Comparative Example 001 | CR001 | CP001 | — | 0.0 | 60 |

From the results shown in the table, it was confirmed that the sensitivity of the composition is excellent in a case where the content of fluorine atoms in the resin is 10% by mass or more (preferably 15% by mass or more, and more preferably 20% by mass) with respect to all the repeating units.

<EB Exposure (LER Performance, Collapse Suppressing Ability)>

The evaluation results with regard to the LER performance and the collapse suppressing ability in a case where a pattern is formed by EB exposure are shown in Table 5.

In the table, the column "B-1" shows a monomer corresponding to the repeating unit represented by General Formula (B-1) contained in the resin in the composition.

TABLE 5

| | | Resin in composition | | Evaluation results | |
|---|---|---|---|---|---|
| Example | Composition | Type | B-1 | LER | Marginal pattern width |
| Example 101 | R001 | P001 | M001 | 3.5 | 19 |
| Example 102 | R003 | P002 | M002 | 3.5 | 19 |
| Example 103 | R024 | P003 | M003 | 3.7 | 21 |
| Comparative Example 101 | CR001 | CP001 | — | 4.6 | 23 |

From the results shown in the table, it was confirmed that the composition of the embodiment of the present invention is excellent in the LER performance and the collapse suppressing ability even in a case where a pattern is formed by EB exposure.

What is claimed is:

1. An actinic ray-sensitive or radiation-sensitive resin composition comprising:
   a resin having a polarity that increases by an action of an acid; and
   a compound that generates an acid upon irradiation with actinic rays or radiation,
   wherein the resin has a repeating unit represented by General Formula (B-1),

(B-1)

in General Formula (B-1), X represents —CO—, —SO—, or —SO$_2$—,
$R^1$ to $R^3$ each independently represent a hydrogen atom or an organic group, and
L represents a divalent linking group having a heteroatom as a ring member atom.

2. The actinic ray-sensitive or radiation-sensitive resin composition according to claim 1,
   wherein the repeating unit represented by General Formula (B-1) is a repeating unit represented by General Formula (B-2),

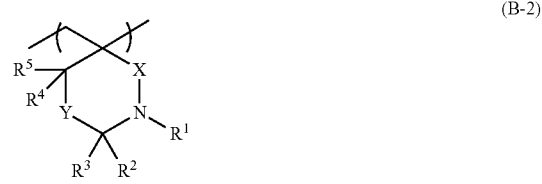

(B-2)

in General Formula (B-2), X represents —CO—, —SO—, or —SO$_2$—,
Y represents —O—, —S—, —SO—, —SO$_2$—, or —NR$^6$—, and
$R^1$ to $R^6$ each independently represent a hydrogen atom or an organic group.

3. The actinic ray-sensitive or radiation-sensitive resin composition according to claim 1,
   wherein at least one of $R^2$ or $R^3$ is an electron-withdrawing group.

4. The actinic ray-sensitive or radiation-sensitive resin composition according to claim 1,
   wherein both $R^2$ and $R^3$ are electron-withdrawing groups.

5. The actinic ray-sensitive or radiation-sensitive resin composition according to claim 1,
   wherein at least one of $R^2$ or $R^3$ is an electron-withdrawing group having a fluorine atom.

6. The actinic ray-sensitive or radiation-sensitive resin composition according to claim 1,
   wherein the repeating unit represented by General Formula (B-1) has three or more fluorine atoms.

7. The actinic ray-sensitive or radiation-sensitive resin composition according to claim 1,
wherein the repeating unit represented by General Formula (B-1) has one or more groups selected from the group consisting of a carboxylic acid group protected by an acid-eliminable group, a phenolic hydroxyl group protected by an acid-eliminable group, and a hexafluoroisopropanol group protected by an acid-eliminable group.

8. The actinic ray-sensitive or radiation-sensitive resin composition according to claim 1,
wherein $R^1$ has one or more groups selected from the group consisting of a carboxylic acid group protected by an acid-eliminable group, a phenolic hydroxyl group protected by an acid-eliminable group, and a hexafluoroisopropanol group protected by an acid-eliminable group.

9. The actinic ray-sensitive or radiation-sensitive resin composition according to claim 1,
wherein a content of the repeating unit represented by General Formula (B-1) in the resin is 10% to 80% by mass with respect to all the repeating units.

10. The actinic ray-sensitive or radiation-sensitive resin composition according to claim 1,
wherein a content of fluorine atoms in the resin is 15% to 40% by mass with respect to all the repeating units.

11. The actinic ray-sensitive or radiation-sensitive resin composition according to claim 1,
wherein a weight-average molecular weight of the resin is 3,500 to 25,000.

12. A resist film formed from the actinic ray-sensitive or radiation-sensitive resin composition according to claim 1.

13. A pattern forming method comprising:
a step of forming a resist film using the actinic ray-sensitive or radiation-sensitive resin composition according to claim 1;
a step of exposing the resist film; and
a step of developing the exposed resist film using a developer.

14. A method for manufacturing an electronic device, comprising the pattern forming method according to claim 13.

15. The actinic ray-sensitive or radiation-sensitive resin composition according to claim 2,
wherein at least one of $R^2$ or $R^3$ is an electron-withdrawing group.

16. The actinic ray-sensitive or radiation-sensitive resin composition according to claim 2,
wherein both $R^2$ and $R^3$ are electron-withdrawing groups.

17. The actinic ray-sensitive or radiation-sensitive resin composition according to claim 2,
wherein at least one of $R^2$ or $R^3$ is an electron-withdrawing group having a fluorine atom.

18. The actinic ray-sensitive or radiation-sensitive resin composition according to claim 2,
wherein the repeating unit represented by General Formula (B-2) has three or more fluorine atoms.

19. The actinic ray-sensitive or radiation-sensitive resin composition according to claim 2,
wherein the repeating unit represented by General Formula (B-2) has one or more groups selected from the group consisting of a carboxylic acid group protected by an acid-eliminable group, a phenolic hydroxyl group protected by an acid-eliminable group, and a hexafluoroisopropanol group protected by an acid-eliminable group.

20. The actinic ray-sensitive or radiation-sensitive resin composition according to claim 2,
wherein $R^1$ has one or more groups selected from the group consisting of a carboxylic acid group protected by an acid-eliminable group, a phenolic hydroxyl group protected by an acid-eliminable group, and a hexafluoroisopropanol group protected by an acid-eliminable group.

* * * * *